United States Patent
Hayashi et al.

(10) Patent No.: US 10,763,901 B2
(45) Date of Patent: Sep. 1, 2020

(54) TRANSMISSION DEVICE, TRANSMISSION METHOD, AND COMMUNICATION SYSTEM

(71) Applicant: Sony Semiconductor Solutions Corporation, Kanagawa (JP)

(72) Inventors: Hiroaki Hayashi, Kanagawa (JP); Masatsugu Sugano, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/468,104

(22) PCT Filed: Nov. 29, 2017

(86) PCT No.: PCT/JP2017/042739
§ 371 (c)(1),
(2) Date: Jun. 10, 2019

(87) PCT Pub. No.: WO2018/110276
PCT Pub. Date: Jun. 21, 2018

(65) Prior Publication Data
US 2019/0305806 A1 Oct. 3, 2019

(30) Foreign Application Priority Data
Dec. 14, 2016 (JP) .................. 2016-241973

(51) Int. Cl.
*H04L 27/00* (2006.01)
*H04B 1/04* (2006.01)
*H04L 25/49* (2006.01)
*H04L 25/493* (2006.01)
*H03K 19/20* (2006.01)
*H04L 25/02* (2006.01)

(52) U.S. Cl.
CPC ............... *H04B 1/04* (2013.01); *H03K 19/20* (2013.01); *H04L 25/02* (2013.01); *H04L 25/49* (2013.01); *H04L 25/493* (2013.01)

(58) Field of Classification Search
CPC ... H04L 1/0003; H04L 1/0071; H04L 5/0007; G09G 3/3696; G09G 3/36
USPC ........................ 375/295; 708/301, 316; 331/1
See application file for complete search history.

(56) References Cited

U.S. PATENT DOCUMENTS 8,064,535 B2    11/2011  Wiley
2013/0301368 A1 *  11/2013  Bansal .................. G11C 7/222
                                              365/194

(Continued)

FOREIGN PATENT DOCUMENTS

JP          06-261092 A       9/1994

*Primary Examiner* — Khai Tran
(74) *Attorney, Agent, or Firm* — Michael Best & Friedrich LLP

(57) ABSTRACT

A transmission device of the disclosure includes: a plurality of delay sections having changeable delay amounts; a driver section that includes a plurality of drivers and transmits a data signal indicating a sequence of symbols using the plurality of drivers, the plurality of drivers being provided to correspond to the plurality of delay sections and setting a voltage at a corresponding output terminal to a mutually different voltage on the basis of a signal delayed by a corresponding delay section of the plurality of delay sections; and a controller that sets the respective delay amounts of the plurality of delay sections on the basis of a transition of a symbol in the sequence of symbols.

17 Claims, 35 Drawing Sheets

(56) References Cited

U.S. PATENT DOCUMENTS

2014/0126614 A1\* 5/2014 Maarefi ............... H04L 25/0286
375/219
2017/0005781 A1\* 1/2017 Kil ........................ H04L 7/0091
2017/0011703 A1\* 1/2017 Higuchi ............... G09G 3/3674

\* cited by examiner

[ FIG. 1 ]
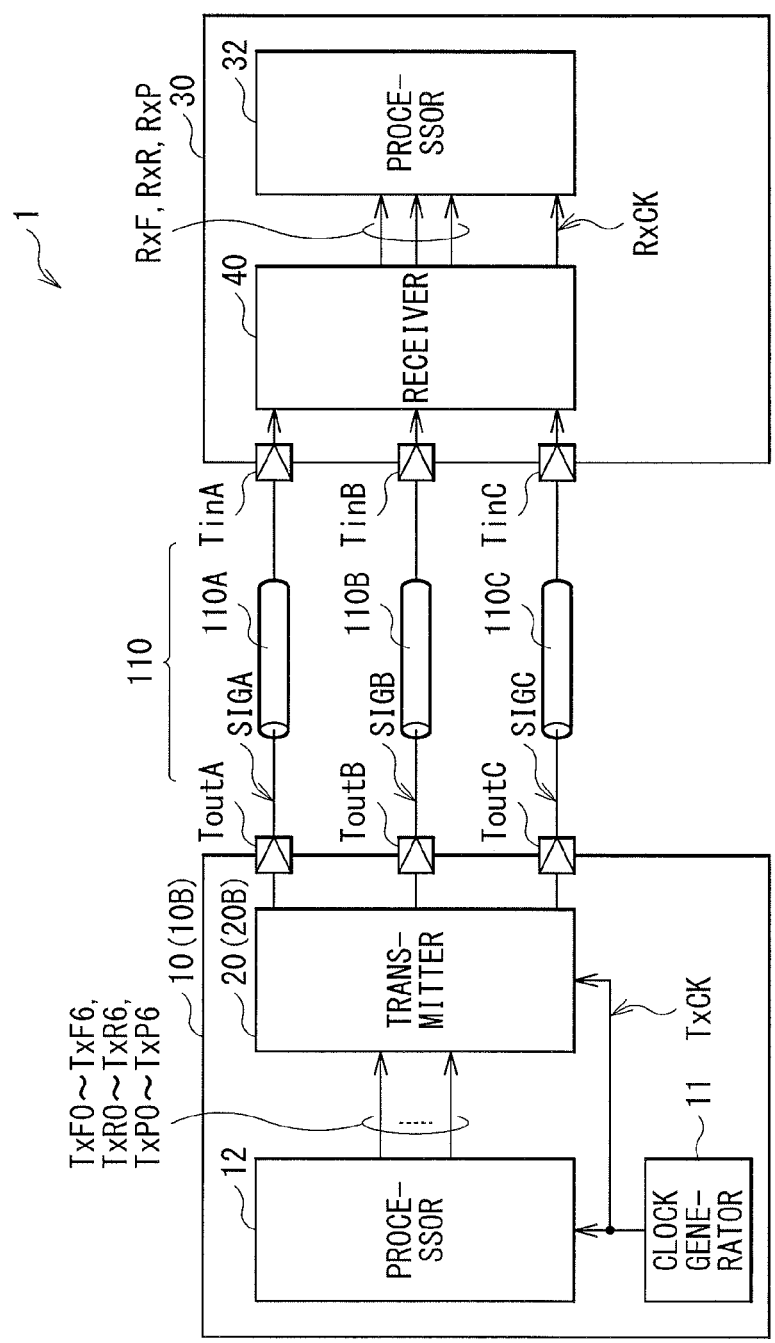

[ FIG. 2 ]
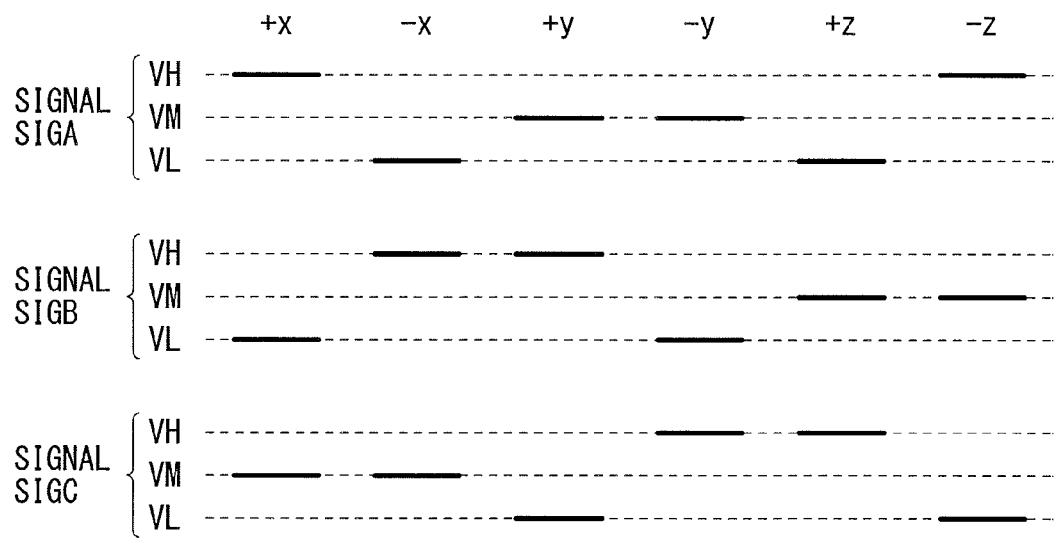
[ FIG. 3 ]
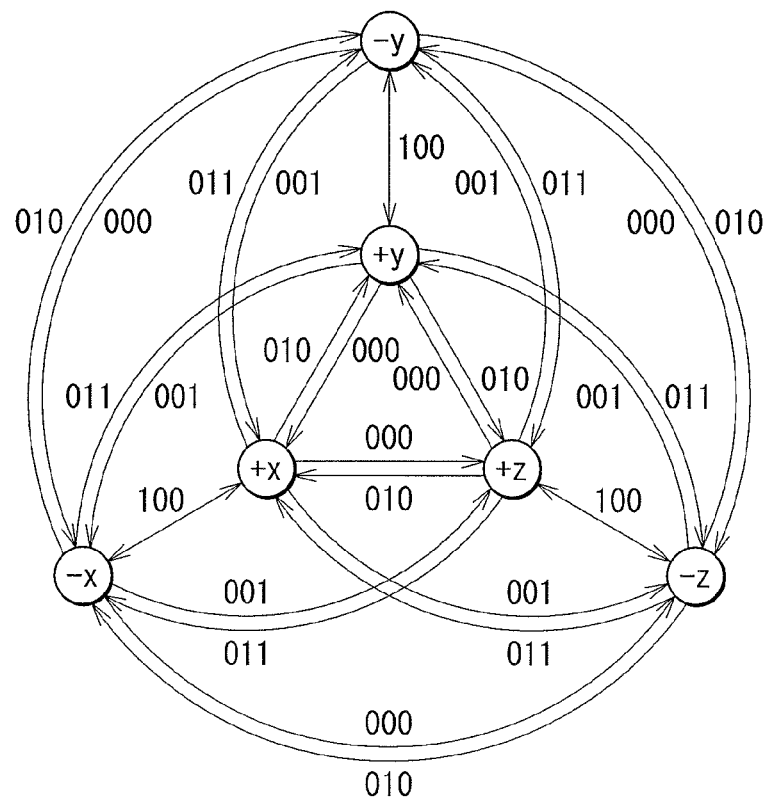

[FIG. 4]
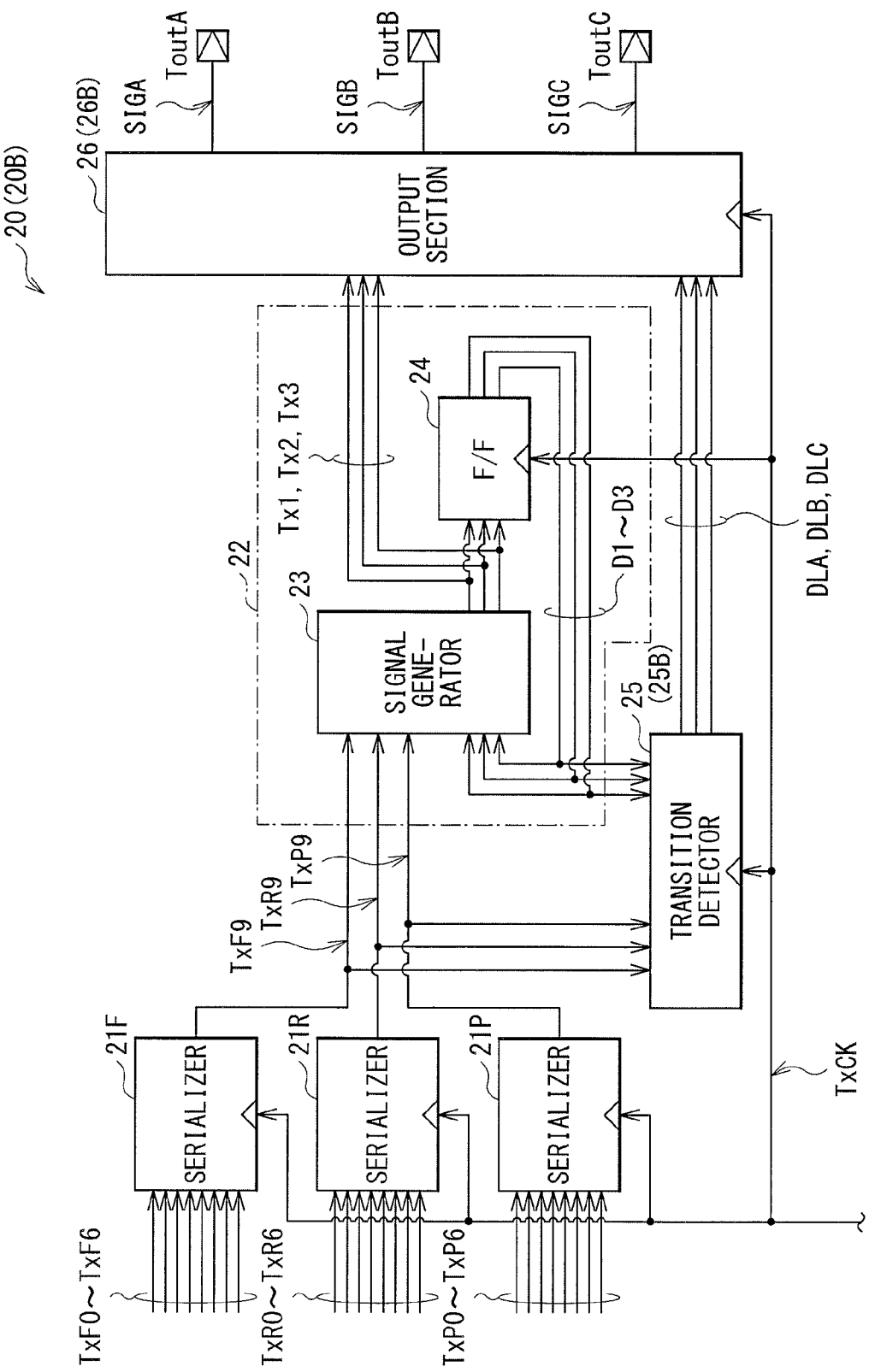

[FIG.5]

| TxF9, TxR9, TxP9 | DS=+x | DS=−x | DS=+y | DS=−y | DS=+z | DS=−z |
|---|---|---|---|---|---|---|
| 000 | +z | −z | +x | −x | +y | −y |
| 001 | −z | +z | −x | +x | −y | +y |
| 010 | +y | −y | +z | −z | +x | −x |
| 011 | −y | +y | −z | +z | −x | +x |
| 1XX | −x | +x | −y | +y | −z | +z |

| SYMBOL | SYMBOL SIGNAL Tx1 | SYMBOL SIGNAL Tx2 | SYMBOL SIGNAL Tx3 | SIGNAL PUAA | SIGNAL PUAB | SIGNAL PDAA | SIGNAL PDAB | SIGNAL PUBA | SIGNAL PUBB | SIGNAL PDBA | SIGNAL PDBB | SIGNAL PUCA | SIGNAL PUCB | SIGNAL PDCA | SIGNAL PDCB | SIGNAL SIGA | SIGNAL SIGB | SIGNAL SIGC |
|---|---|---|---|---|---|---|---|---|---|---|---|---|---|---|---|---|---|---|
| +x | 1 | 0 | 0 | 1 | 1 | 0 | 0 | 0 | 0 | 1 | 1 | 1 | 0 | 1 | 0 | VH | VL | VM |
| −x | 0 | 1 | 1 | 0 | 0 | 1 | 1 | 1 | 1 | 0 | 0 | 1 | 0 | 1 | 0 | VL | VH | VM |
| +y | 0 | 1 | 0 | 1 | 0 | 1 | 0 | 1 | 1 | 0 | 0 | 0 | 0 | 1 | 1 | VM | VH | VL |
| −y | 1 | 0 | 1 | 1 | 0 | 1 | 0 | 0 | 0 | 1 | 1 | 1 | 1 | 0 | 0 | VM | VL | VH |
| +z | 0 | 0 | 1 | 0 | 0 | 1 | 1 | 1 | 0 | 1 | 0 | 1 | 1 | 0 | 0 | VL | VM | VH |
| −z | 1 | 1 | 0 | 1 | 1 | 0 | 0 | 1 | 1 | 1 | 0 | 0 | 0 | 1 | 1 | VH | VM | VL |

[ FIG. 7 ]
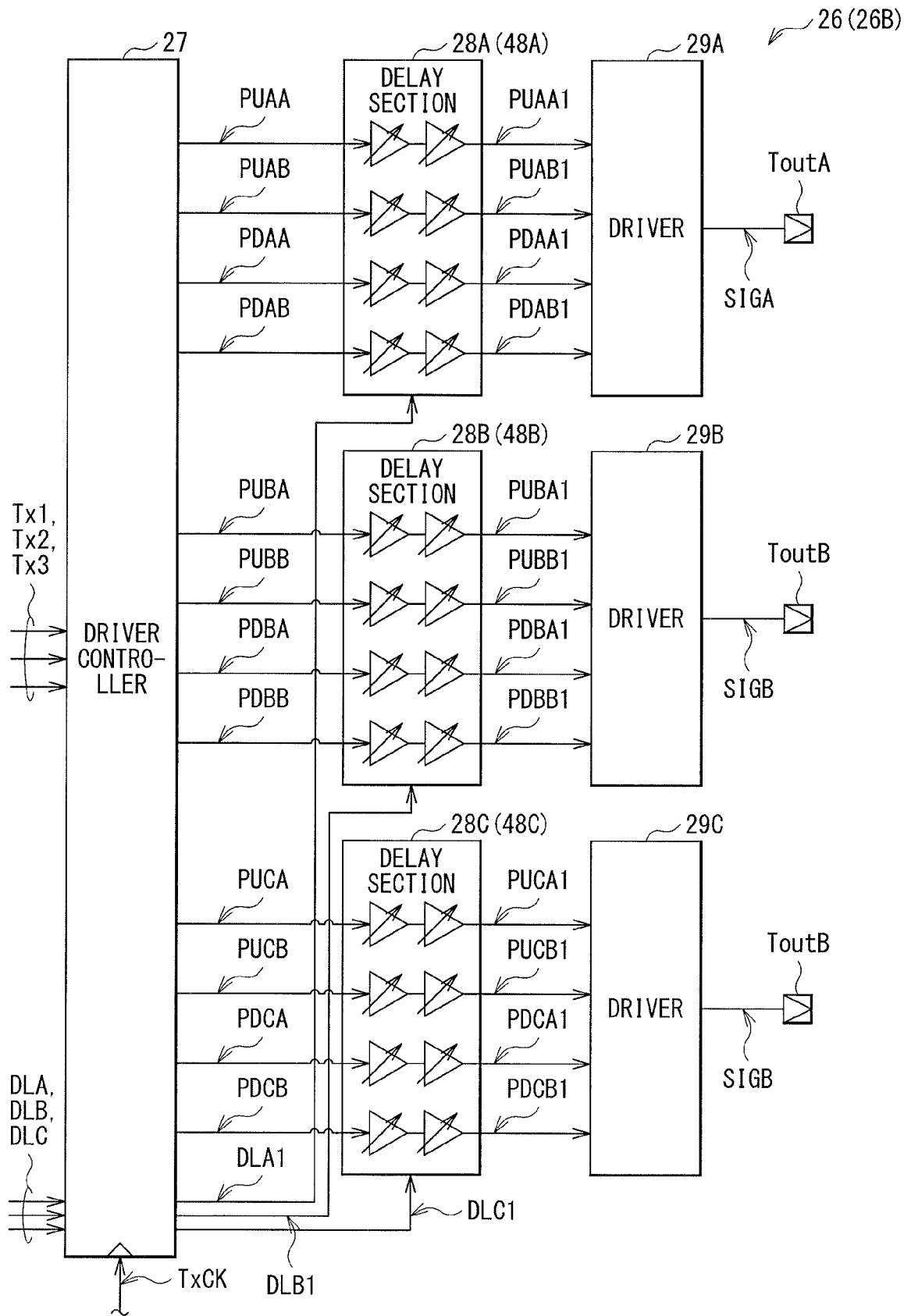

[FIG. 8]
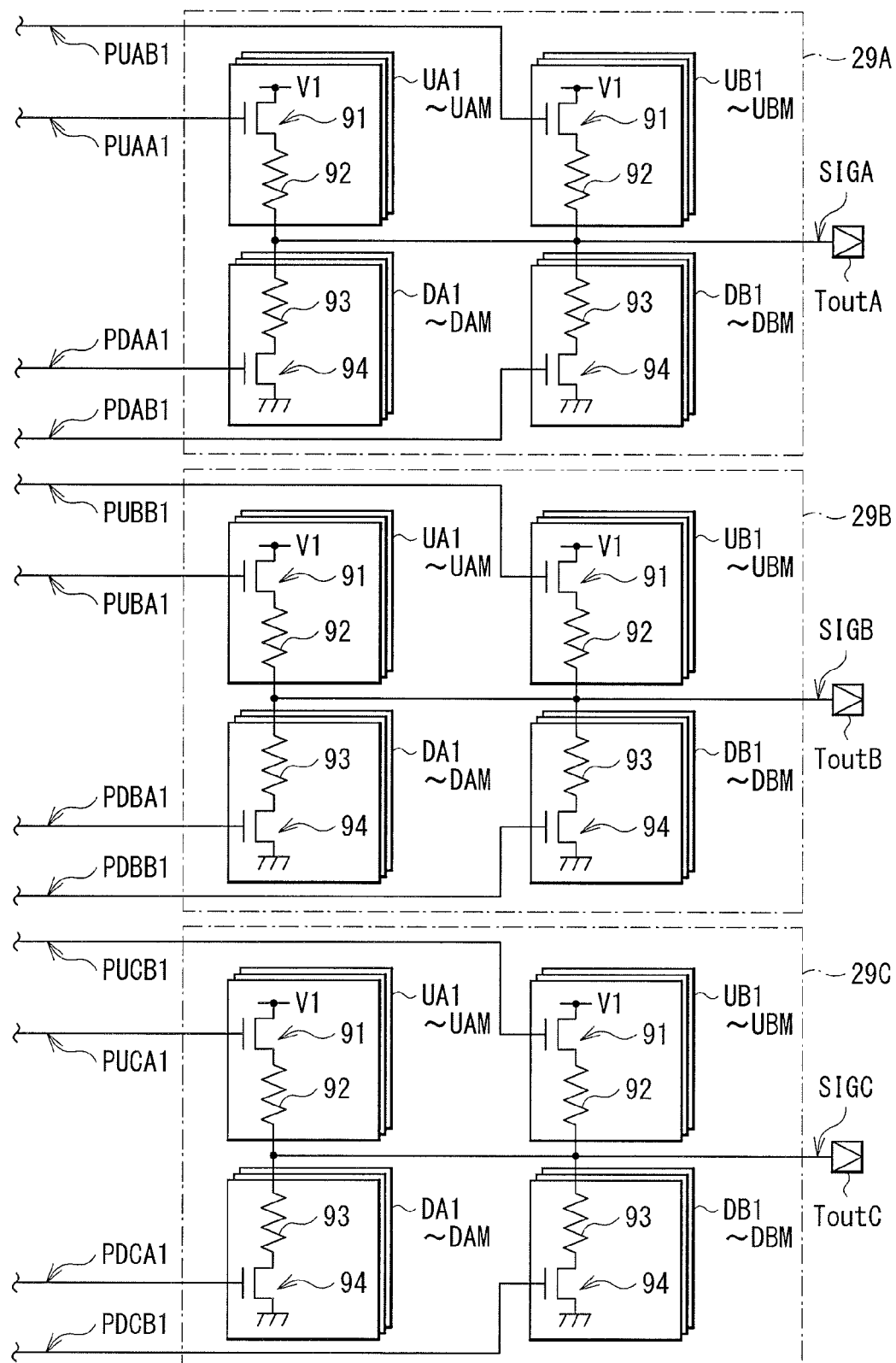

[ FIG. 9 ]
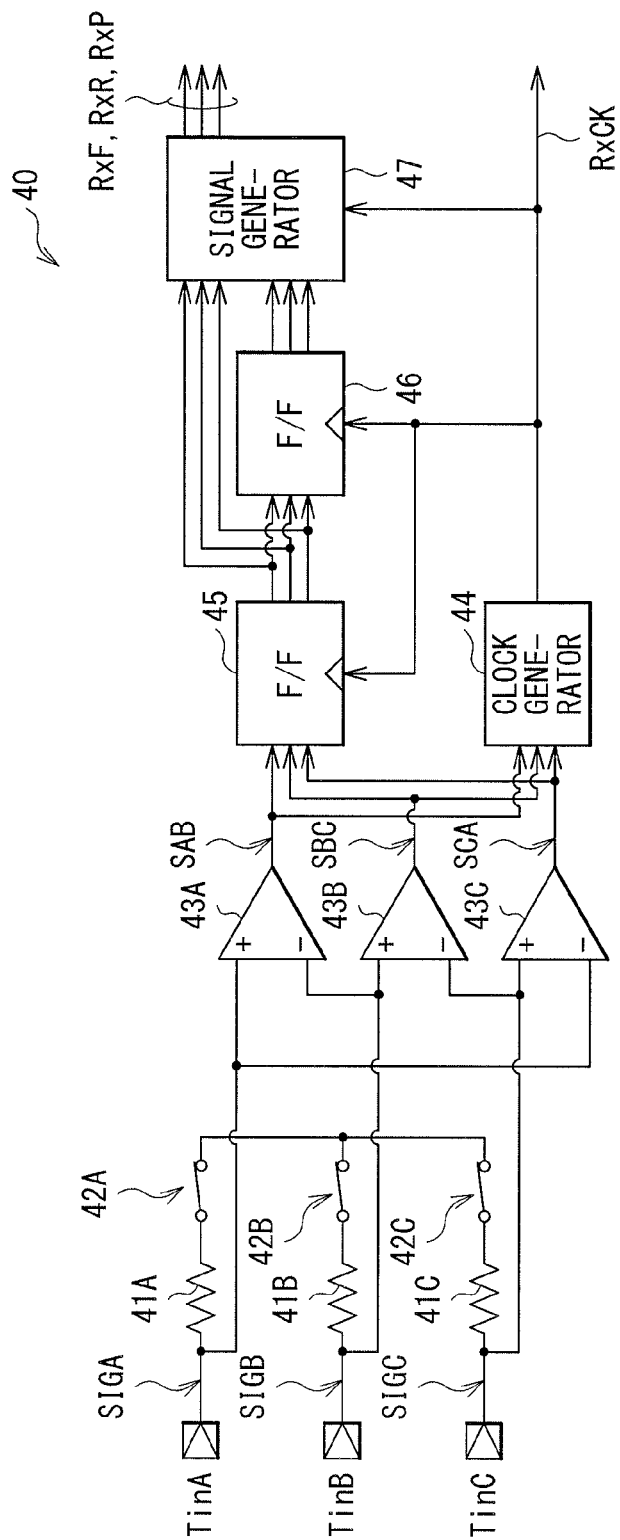

[ FIG. 10 ]
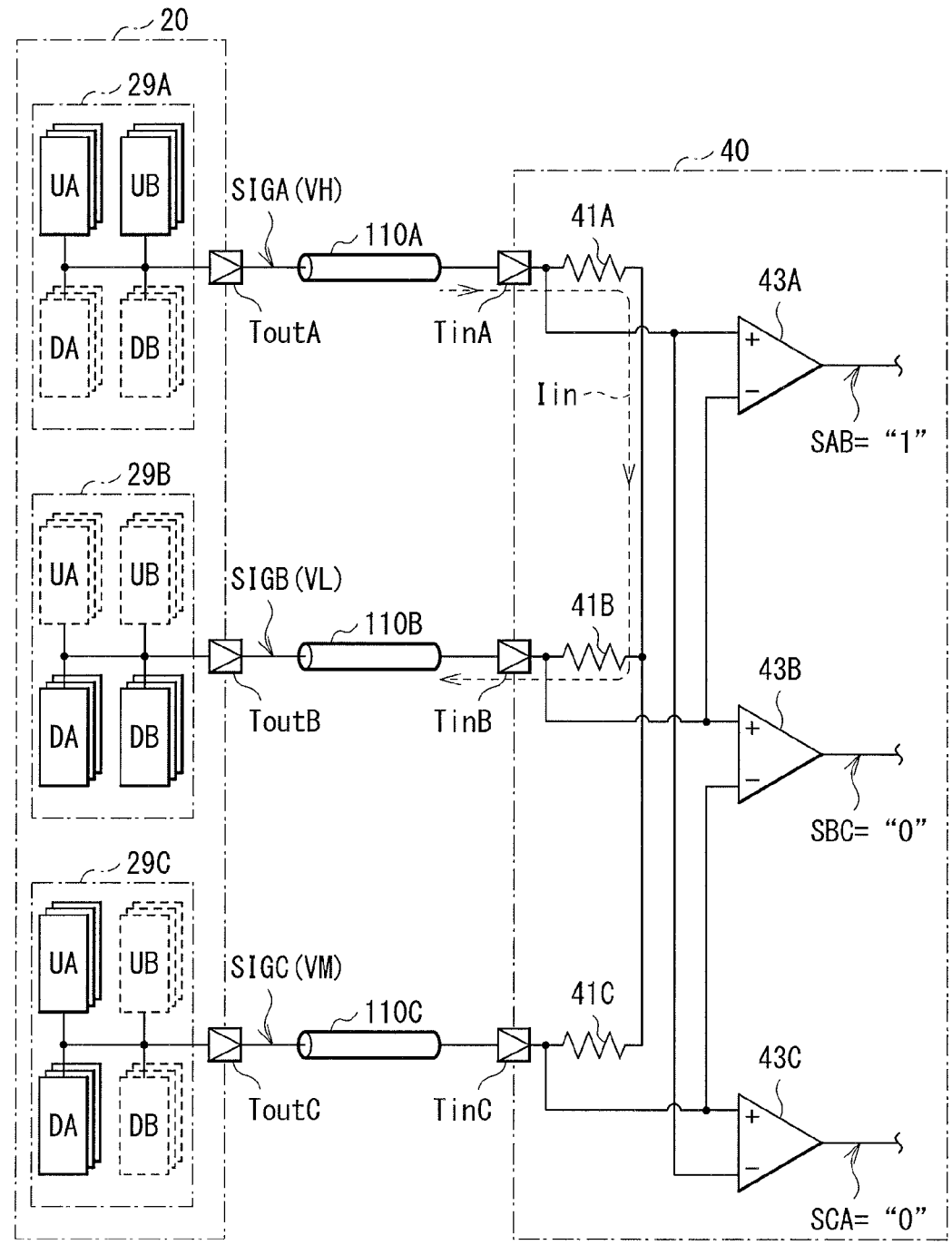

[FIG. 11]
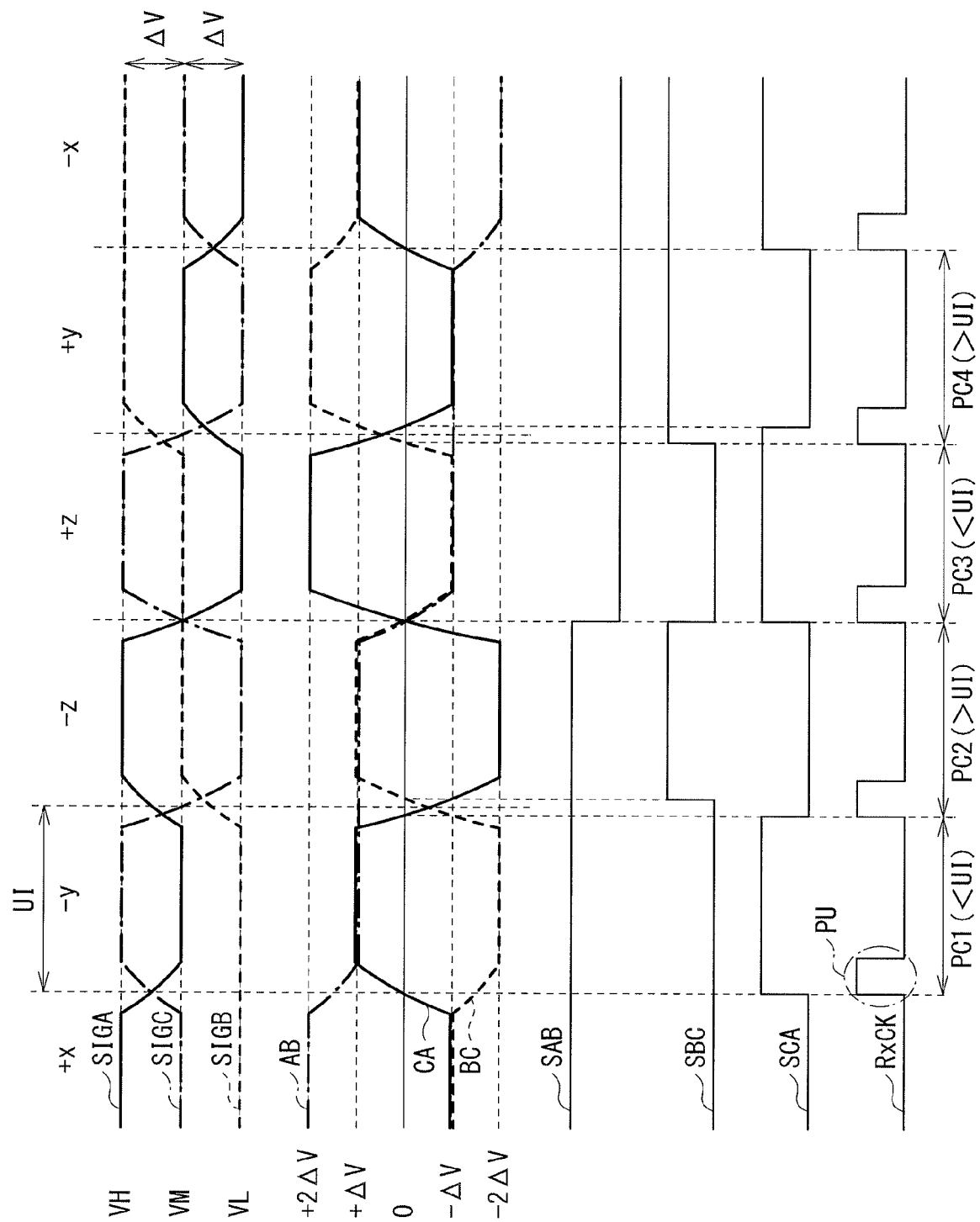

[ FIG. 12A ]
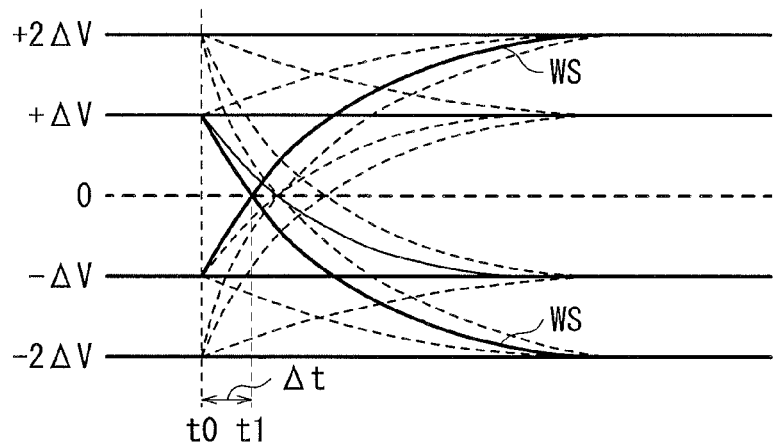
[ FIG. 12B ]
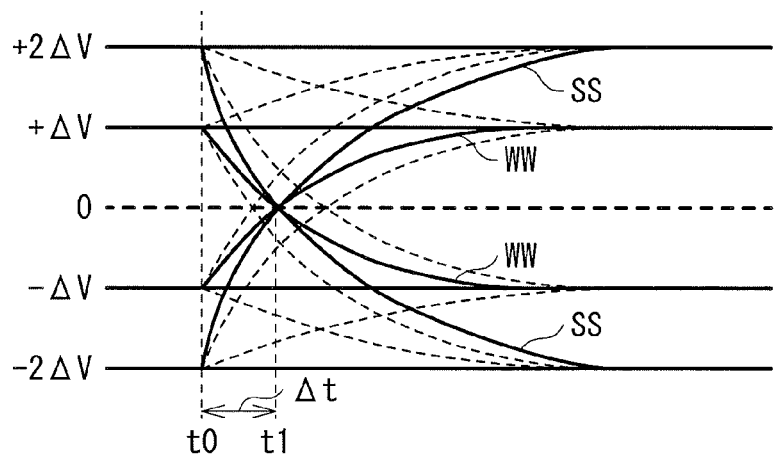
[ FIG. 12C ]
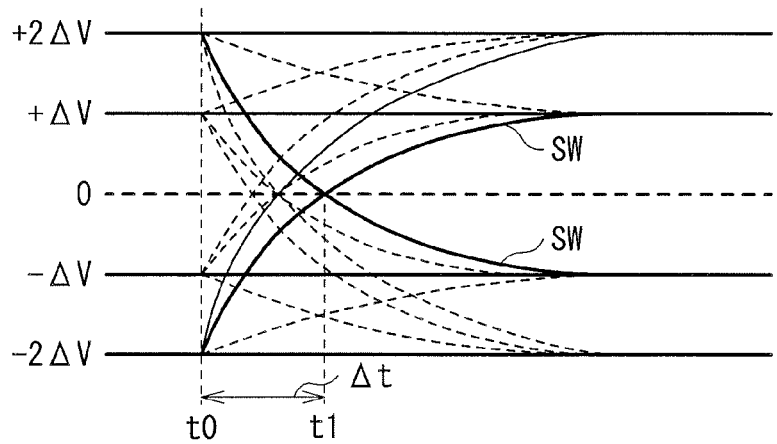

[ FIG. 13 ]
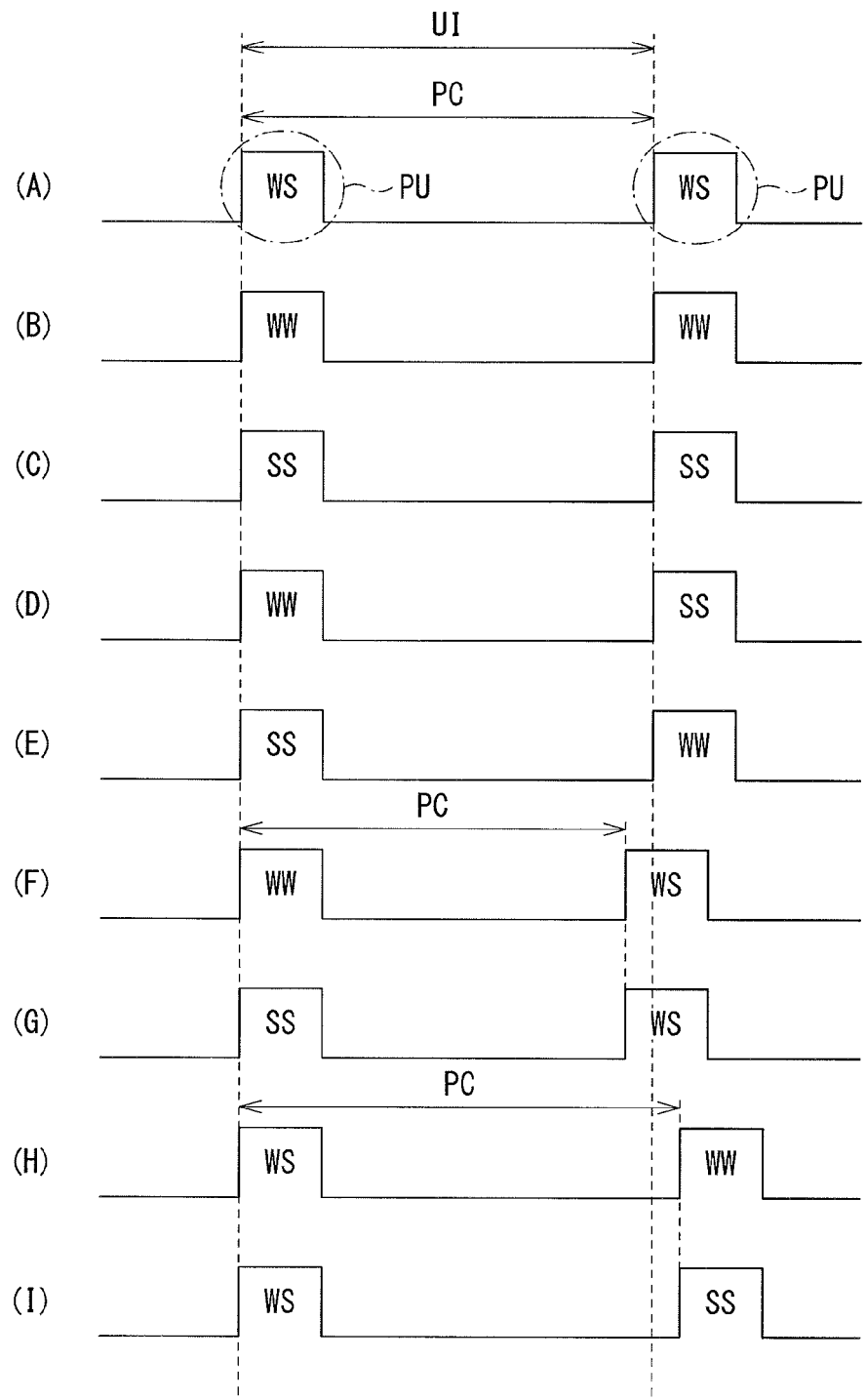

[ FIG. 14A ]
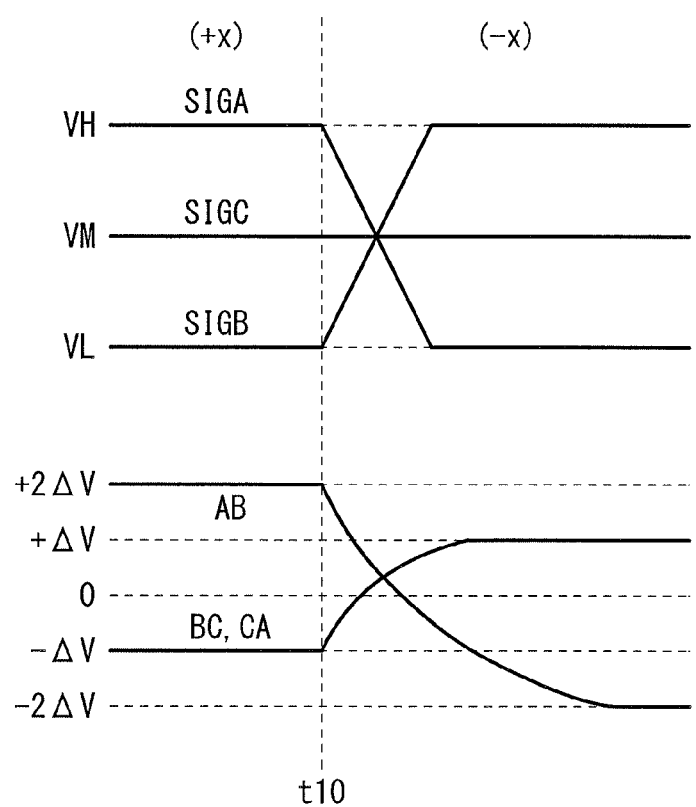

[ FIG. 14B ]
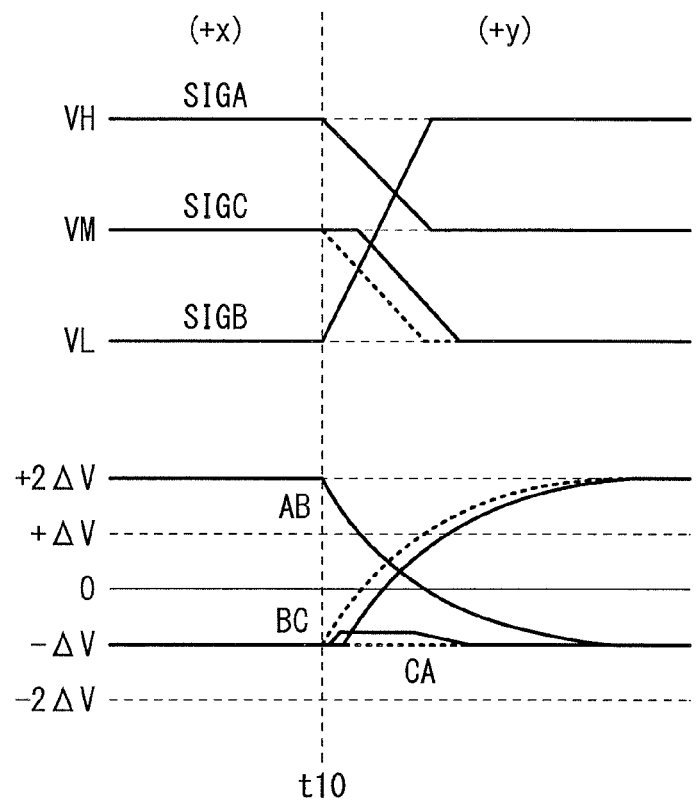
[ FIG. 14C ]
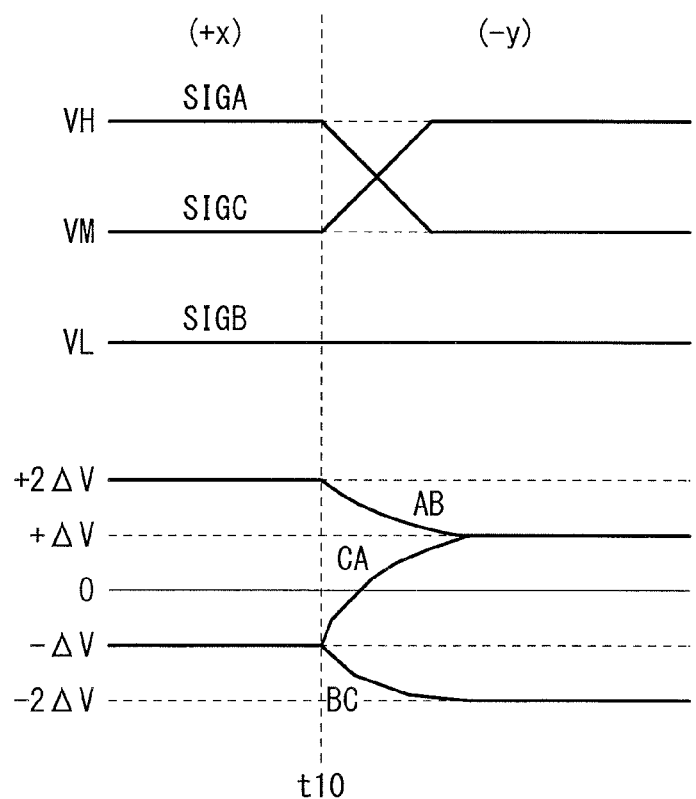

[ FIG. 14D ]
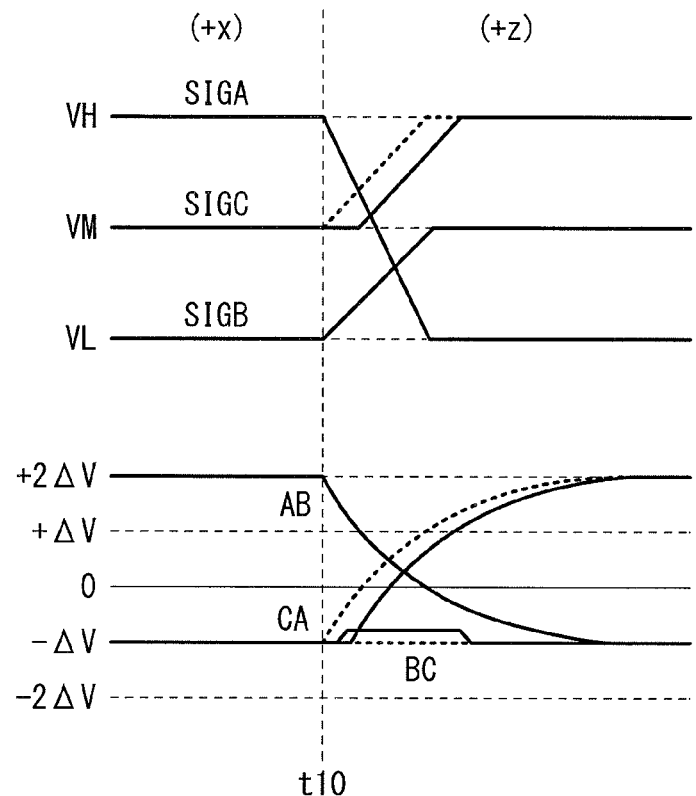
[ FIG. 14E ]
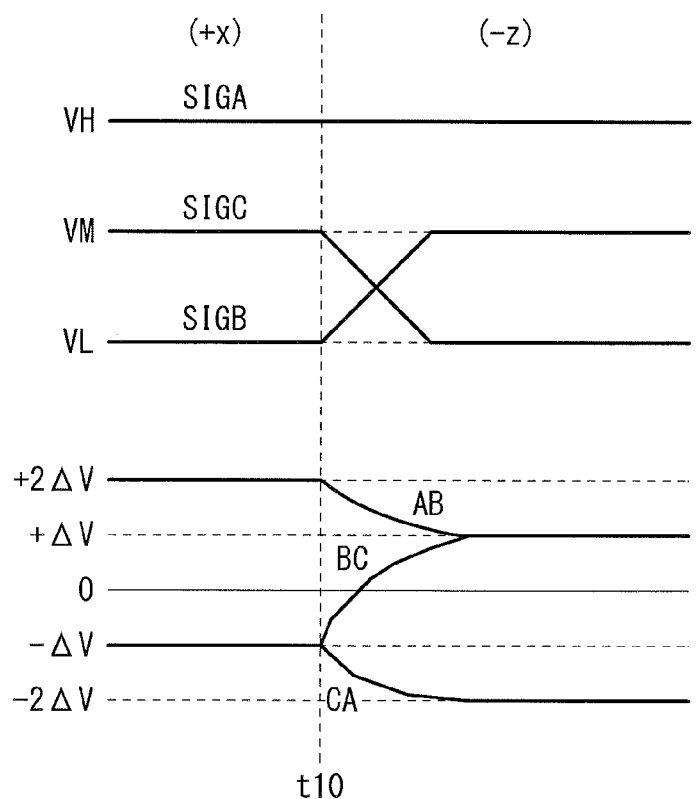

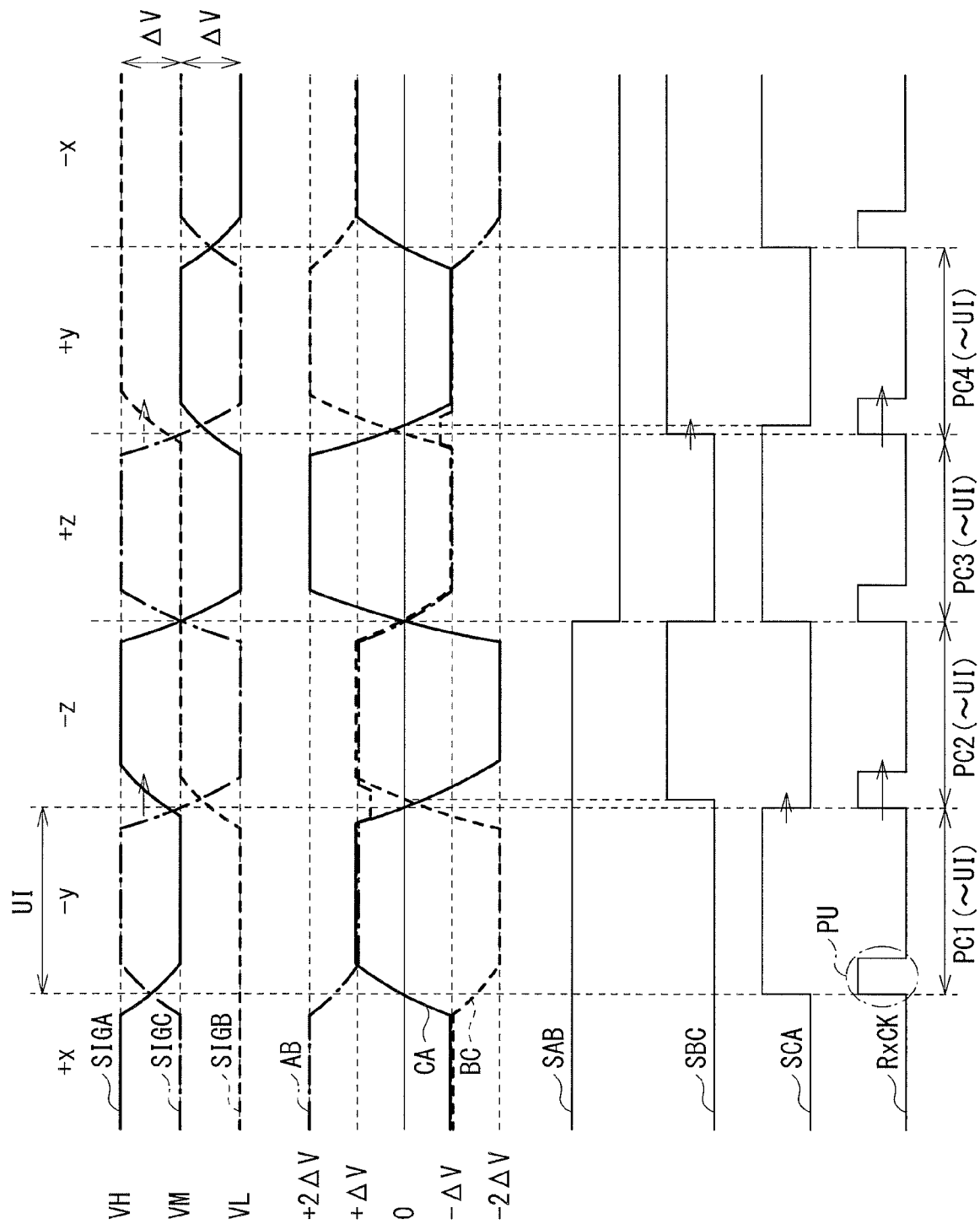
[ FIG. 15 ]

[ FIG. 16A ]
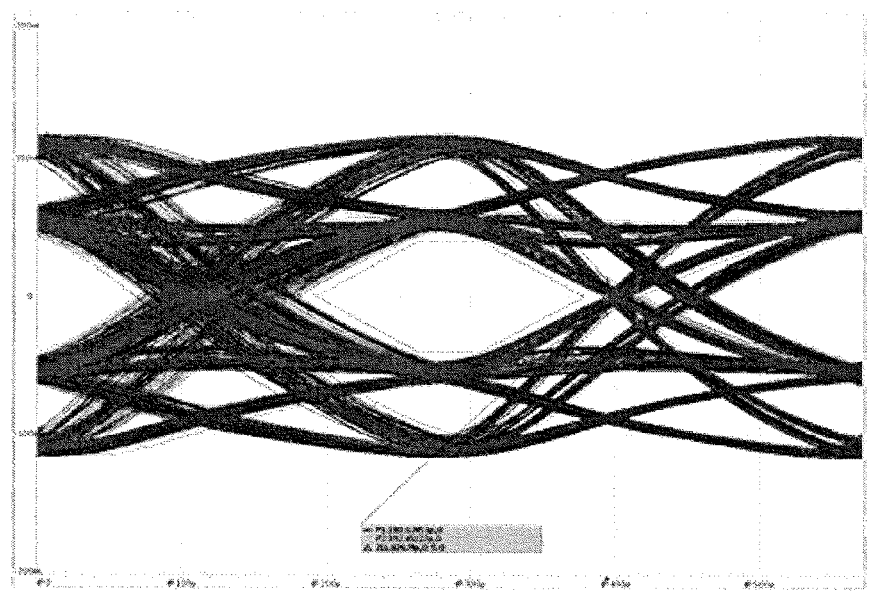
[ FIG. 16B ]
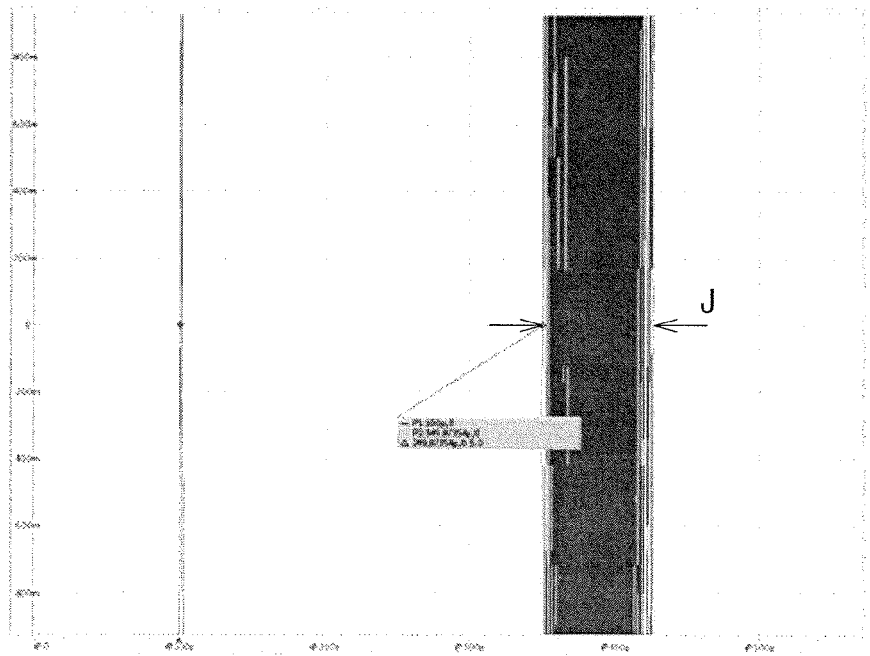

[ FIG. 17A ]
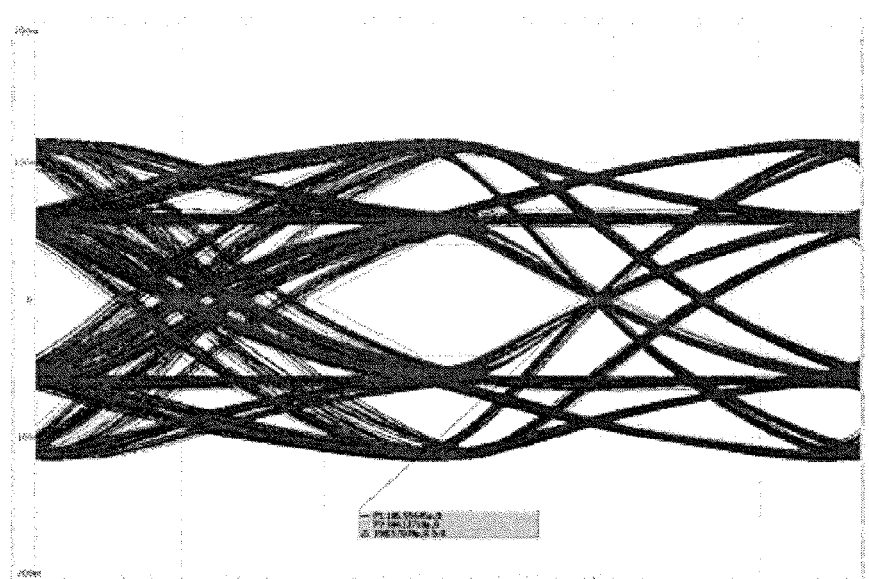
[ FIG. 17B ]
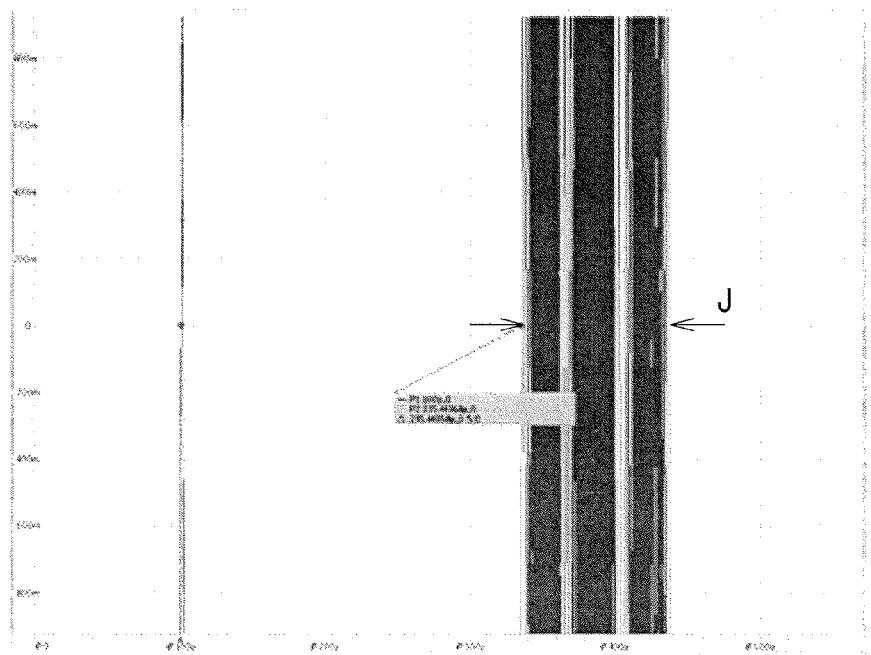

[ FIG. 18 ]

| SYM-BOL | SYMBOL SIGNAL Tx1 | SYMBOL SIGNAL Tx2 | SYMBOL SIGNAL Tx3 | SIG-NAL PUAA | SIG-NAL PUAB | SIG-NAL PDAA | SIG-NAL PDAB | SIG-NAL PUBA | SIG-NAL PUBB | SIG-NAL PDBA | SIG-NAL PDBB | SIG-NAL PUCA | SIG-NAL PUCB | SIG-NAL PDCA | SIG-NAL PDCB | SIG-NAL SIGA | SIG-NAL SIGB | SIG-NAL SIGC |
|---|---|---|---|---|---|---|---|---|---|---|---|---|---|---|---|---|---|---|
| +x | 1 | 0 | 0 | 1 | 1 | 0 | 0 | 0 | 0 | 1 | 1 | 0 | 0 | 0 | 0 | VH | VL | VM |
| −x | 0 | 1 | 1 | 0 | 0 | 1 | 1 | 1 | 1 | 0 | 0 | 0 | 0 | 0 | 0 | VL | VH | VM |
| +y | 0 | 1 | 0 | 0 | 0 | 0 | 0 | 1 | 1 | 0 | 0 | 0 | 0 | 1 | 1 | VM | VH | VL |
| −y | 1 | 0 | 1 | 0 | 0 | 0 | 0 | 0 | 0 | 1 | 1 | 1 | 1 | 0 | 0 | VM | VL | VH |
| +z | 0 | 0 | 1 | 0 | 0 | 1 | 1 | 0 | 0 | 0 | 0 | 1 | 1 | 0 | 0 | VL | VM | VH |
| −z | 1 | 1 | 0 | 1 | 1 | 0 | 0 | 0 | 0 | 0 | 0 | 0 | 0 | 1 | 1 | VH | VM | VL |

[ FIG. 19 ]
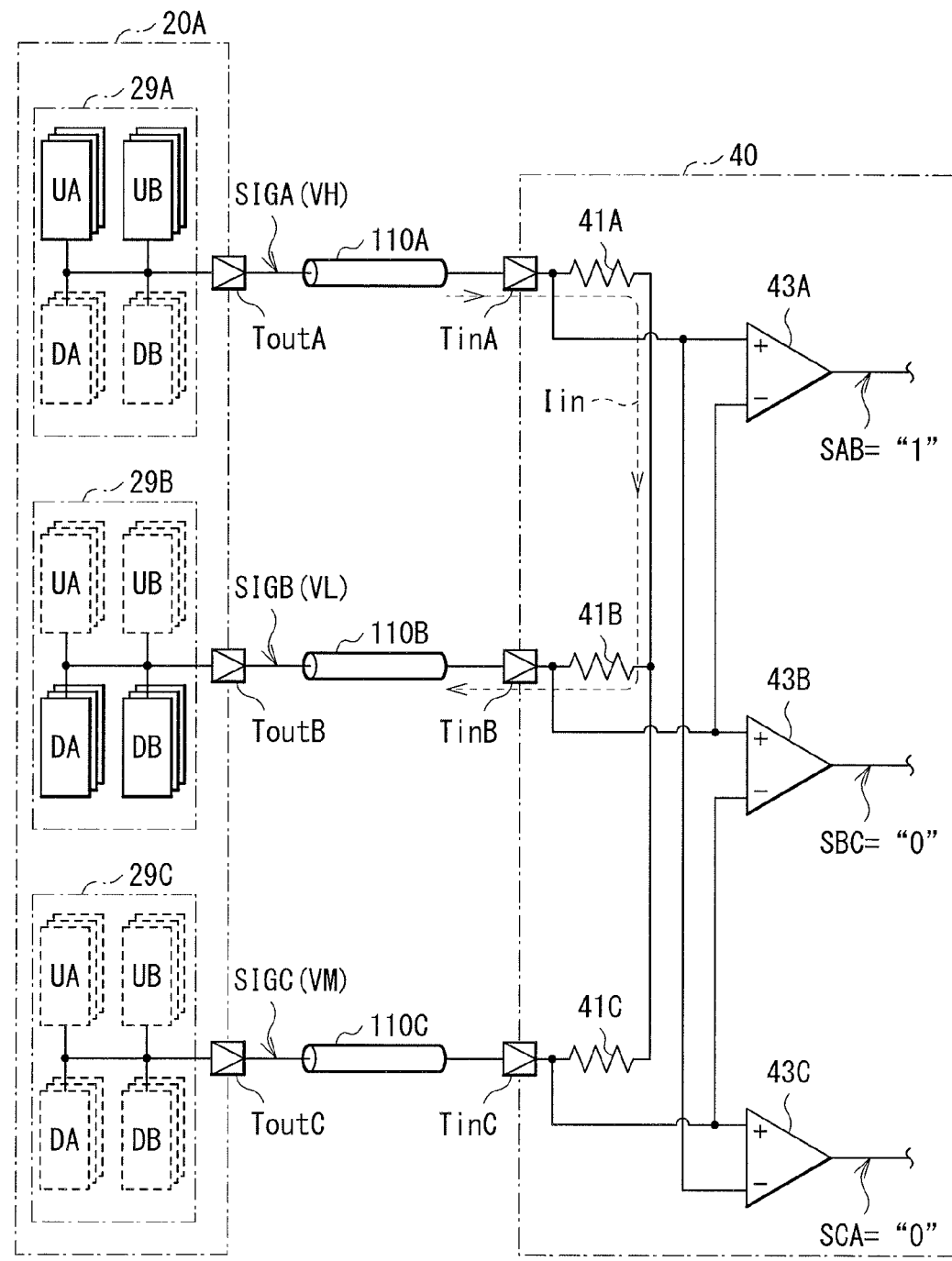

[ FIG. 20 ]
| TxF9, TxR9, TxP9 | DS=+x | DS=−x | DS=+y | DS=−y | DS=+z | DS=−z |
|---|---|---|---|---|---|---|
| 000 | +z | −z | +x | −x | +y | −y |
| 001 | −z | +z | −x | +x | −y | +y |
| 010 | +y | −y | +z | −z | +x | −x |
| 011 | −y | +y | −z | +z | −x | +x |
| 1XX | −x | +x | −y | +y | −z | +z |
WABC
WAB    WBC    WCA
[ FIG. 21A ]
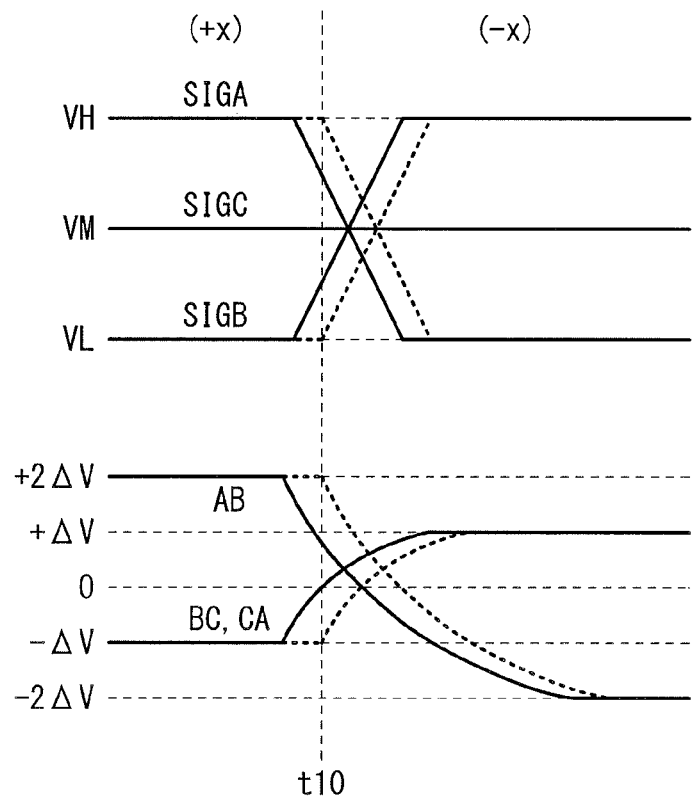

[ FIG. 21B ]
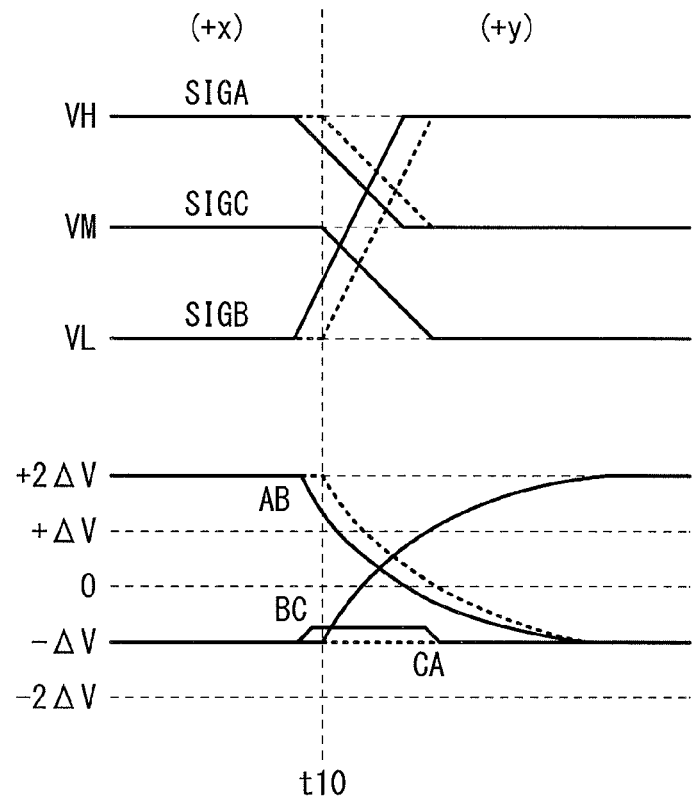
[ FIG. 21C ]
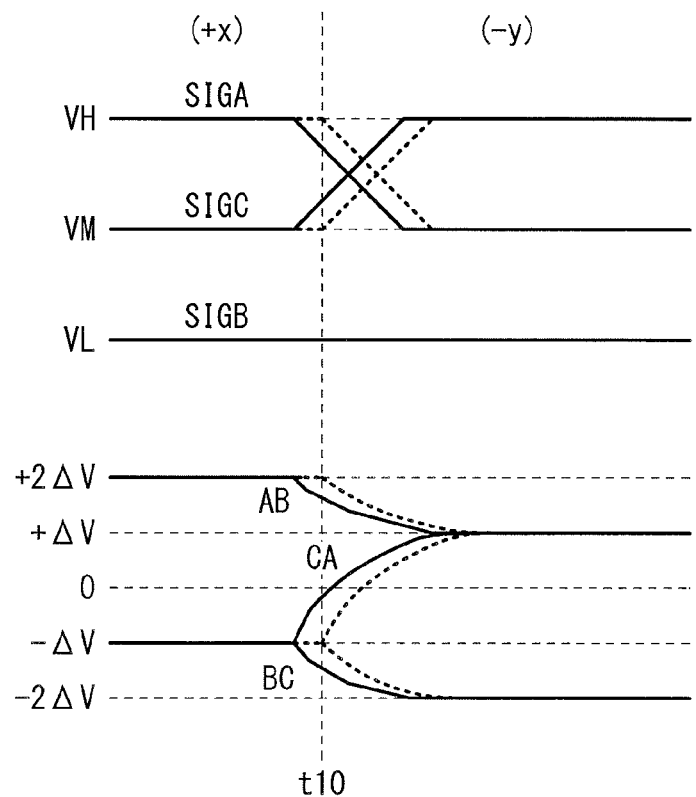

[ FIG. 21D ]
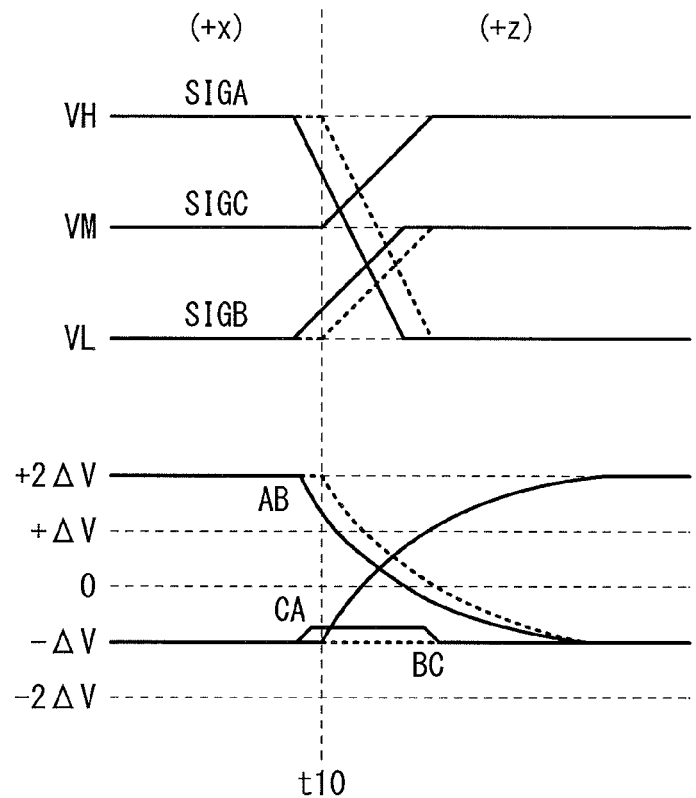
[ FIG. 21E ]
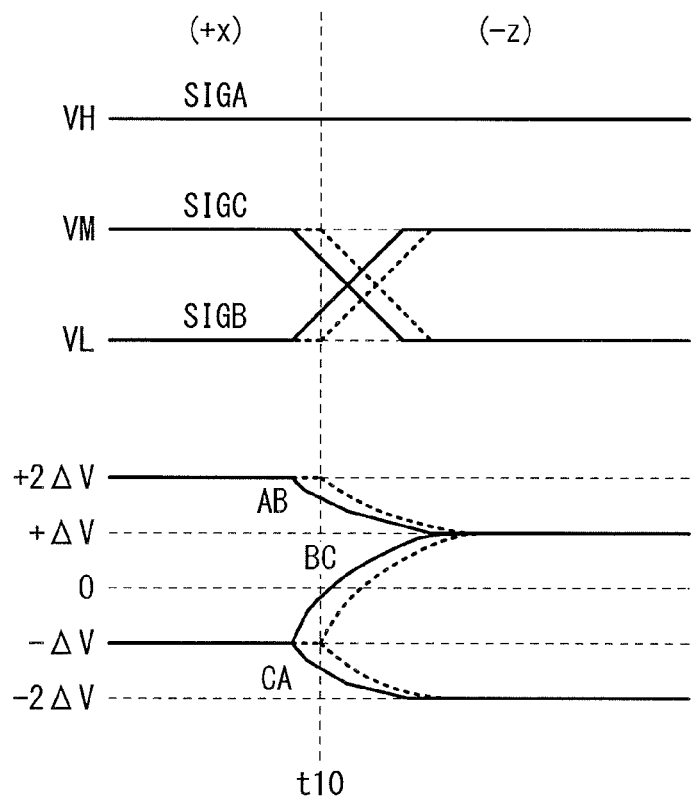

[FIG. 22]
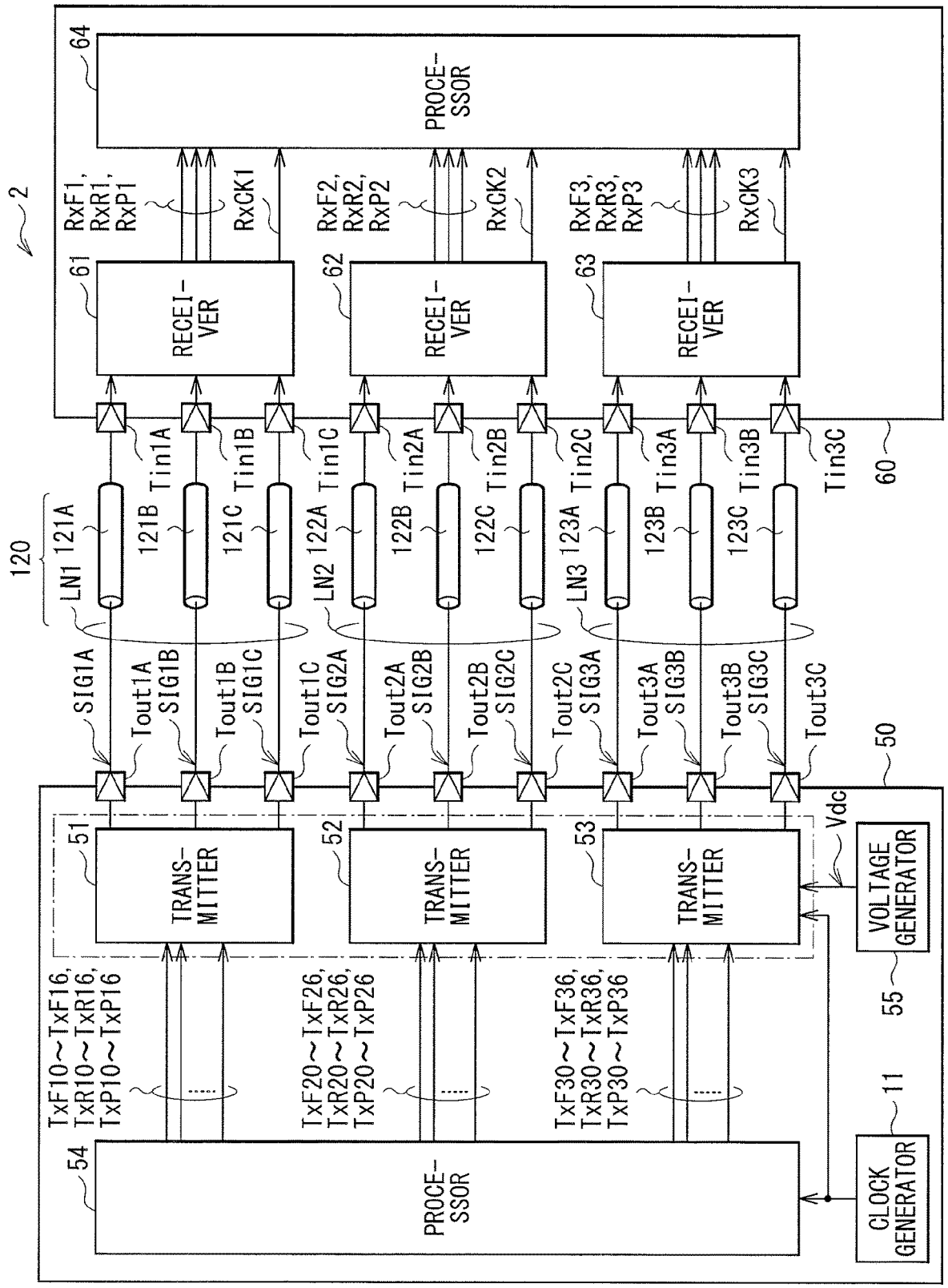

[FIG. 23]
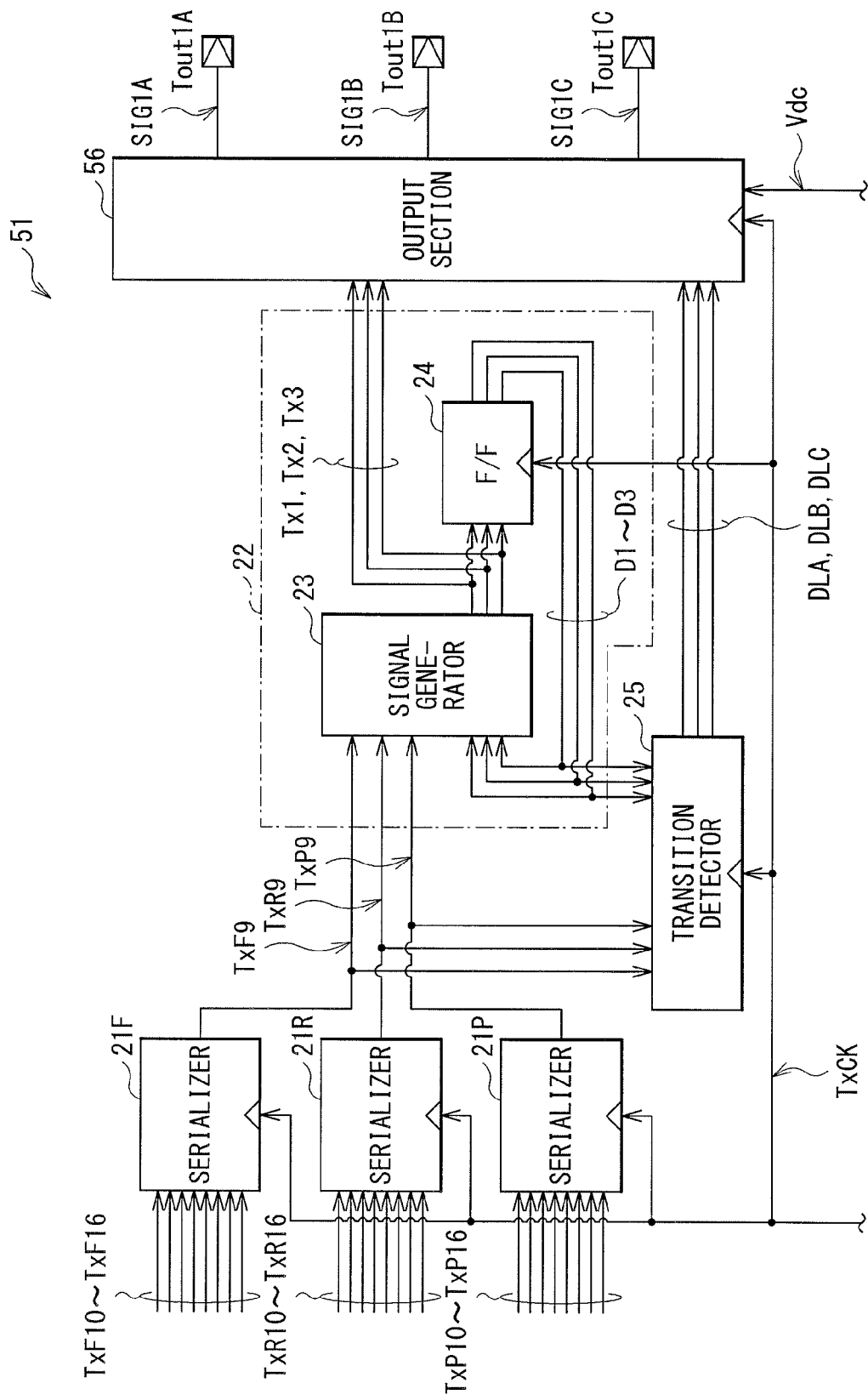

[FIG. 24]
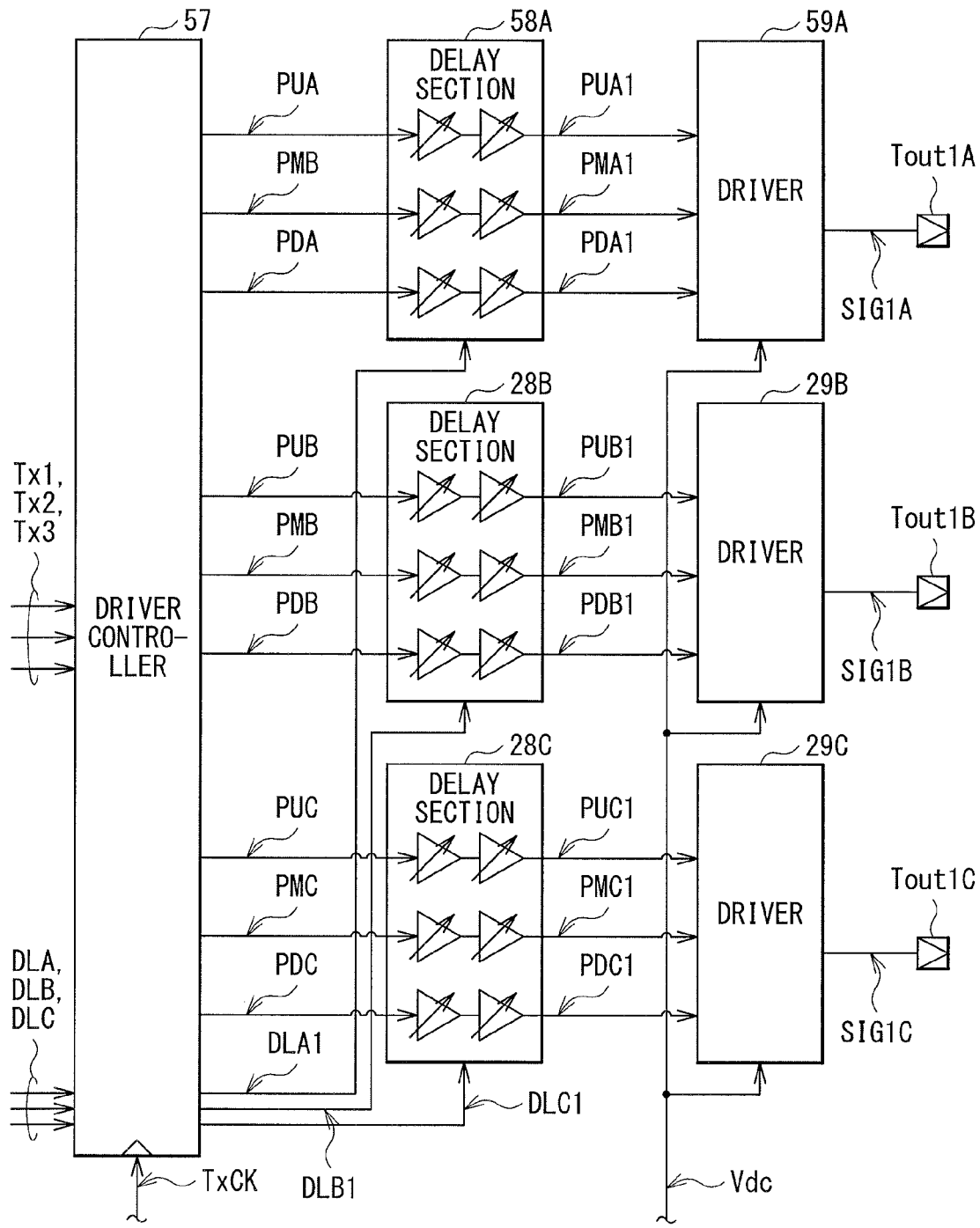

[ FIG. 25 ]

| SYMBOL | SYMBOL SIGNAL Tx1 | SYMBOL SIGNAL Tx2 | SYMBOL SIGNAL Tx3 | SIGNAL PUA | SIGNAL PMA | SIGNAL PDA | SIGNAL PUB | SIGNAL PMB | SIGNAL PDB | SIGNAL PUC | SIGNAL PMC | SIGNAL PDC | SIGNAL SIG1A | SIGNAL SIG1B | SIGNAL SIG1C |
|---|---|---|---|---|---|---|---|---|---|---|---|---|---|---|---|
| +x | 1 | 0 | 0 | 1 | 0 | 0 | 0 | 0 | 1 | 0 | 1 | 0 | VH | VL | VM |
| −x | 0 | 1 | 1 | 0 | 0 | 1 | 1 | 0 | 0 | 0 | 1 | 0 | VL | VH | VM |
| +y | 0 | 1 | 0 | 0 | 1 | 0 | 1 | 0 | 0 | 0 | 0 | 1 | VM | VH | VL |
| −y | 1 | 0 | 1 | 0 | 1 | 0 | 0 | 1 | 1 | 1 | 0 | 0 | VM | VL | VH |
| +z | 0 | 0 | 1 | 0 | 0 | 1 | 0 | 1 | 0 | 1 | 0 | 0 | VL | VM | VH |
| −z | 1 | 1 | 0 | 1 | 0 | 0 | 0 | 1 | 0 | 0 | 0 | 1 | VH | VM | VL |

[ FIG. 26 ]
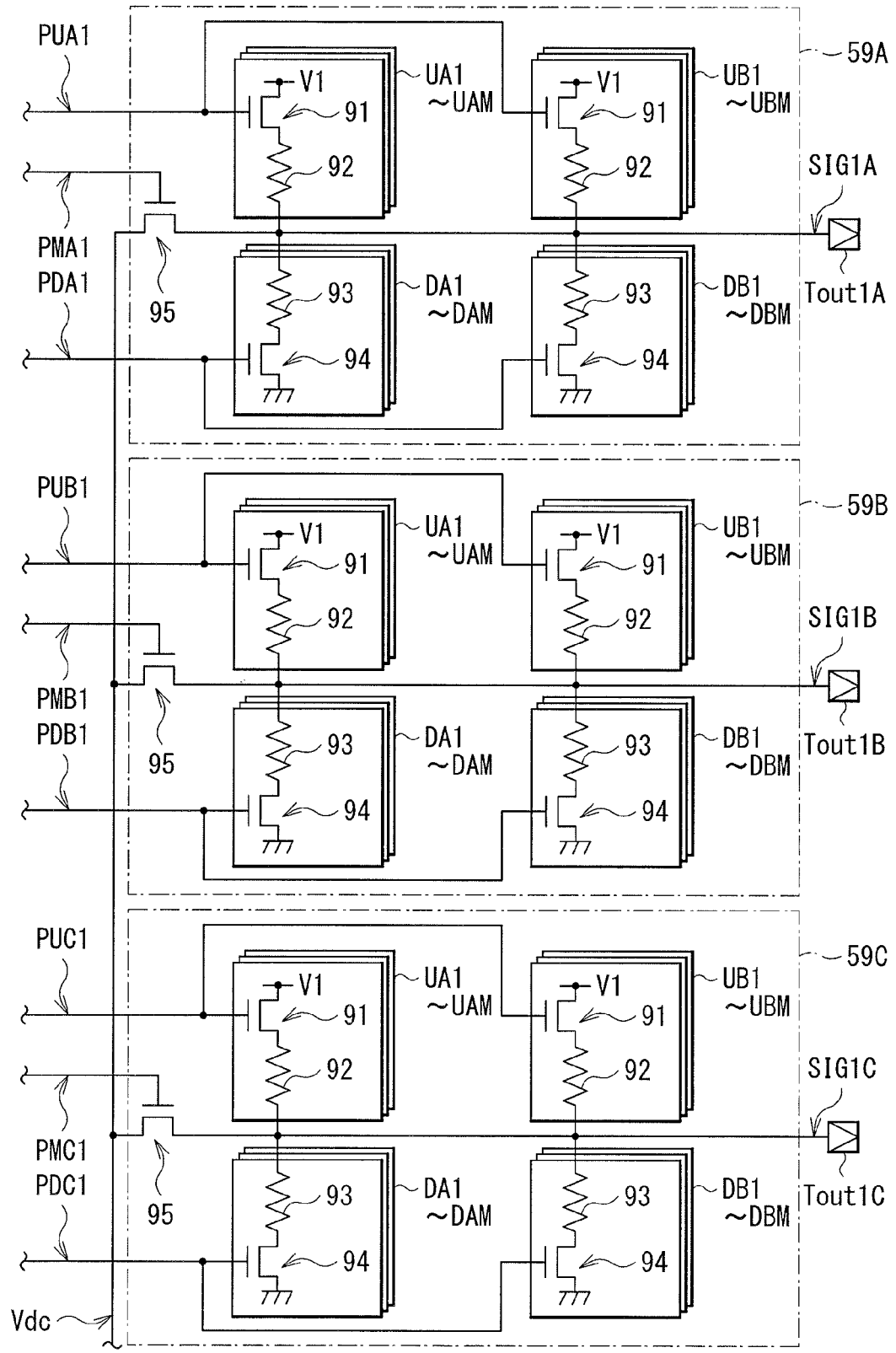

[ FIG. 27 ]
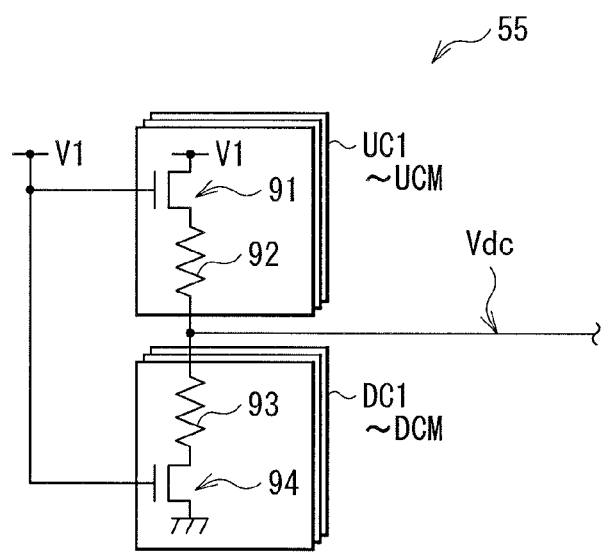

[FIG. 28]
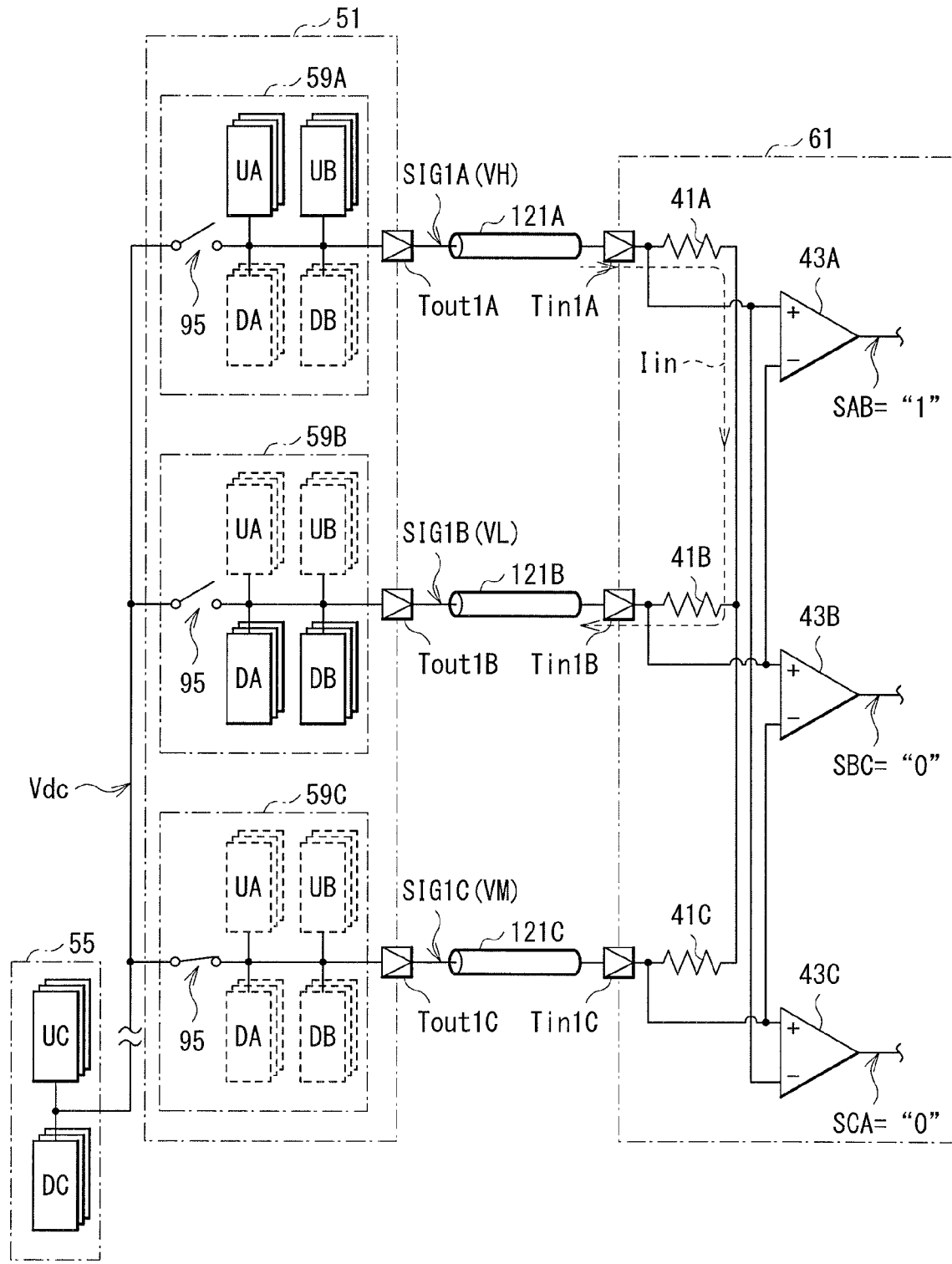

[ FIG. 29 ]
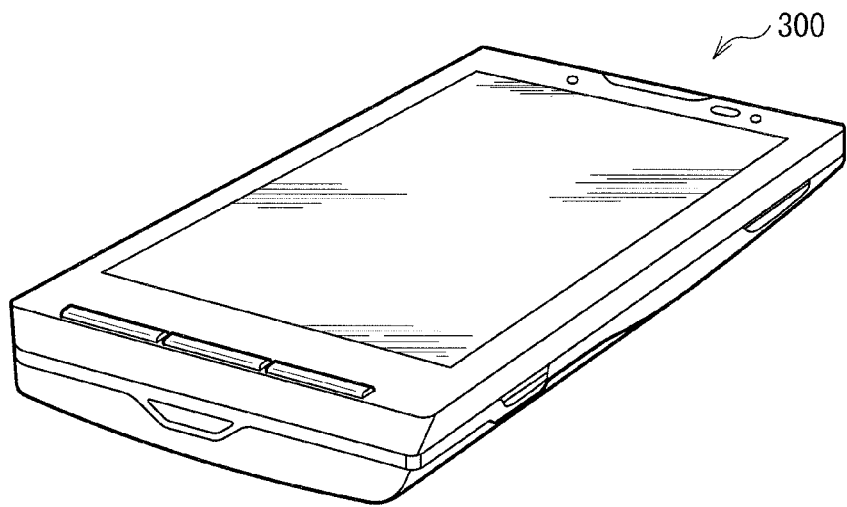

[ FIG. 30 ]
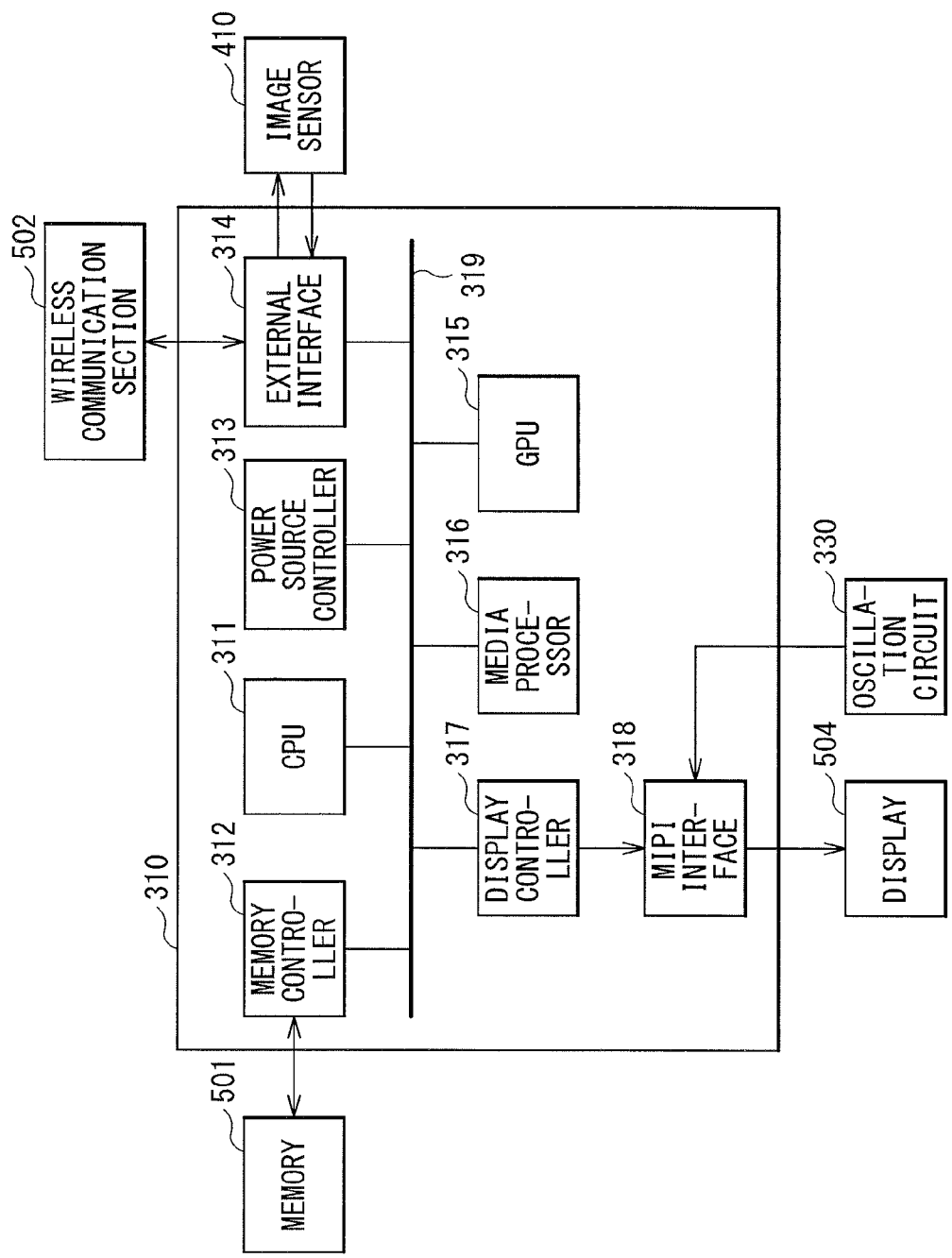

[ FIG. 31 ]
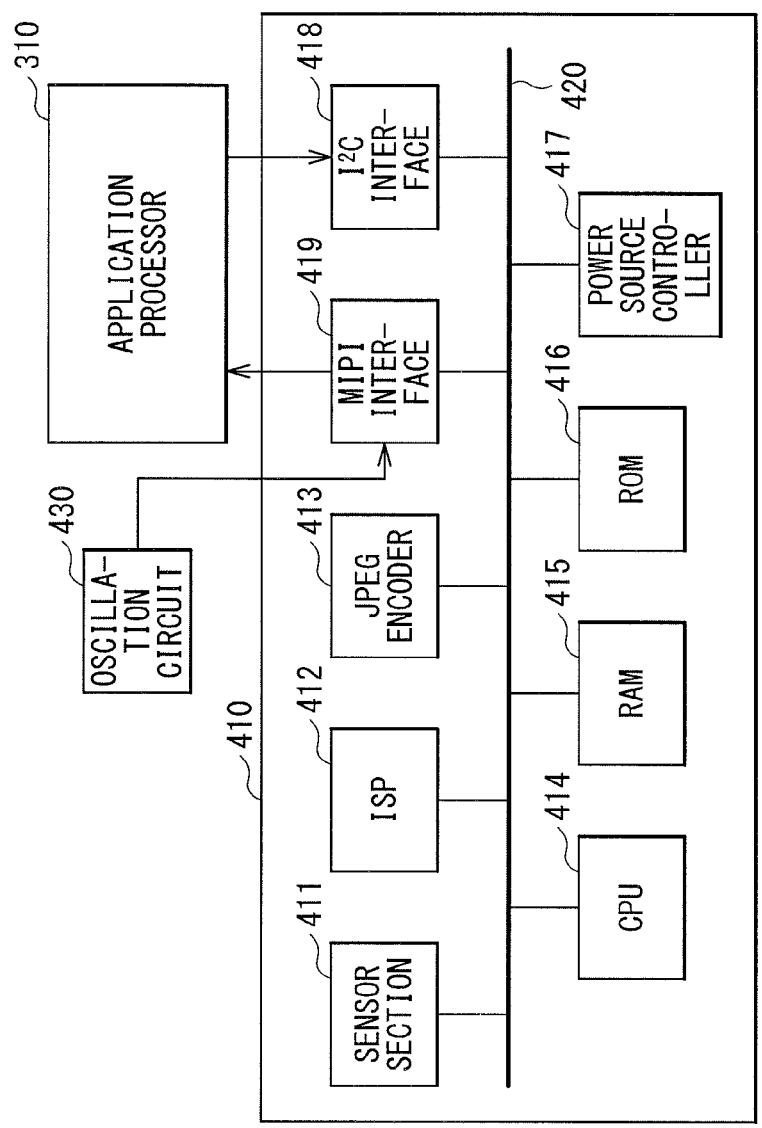

[ FIG. 32 ]
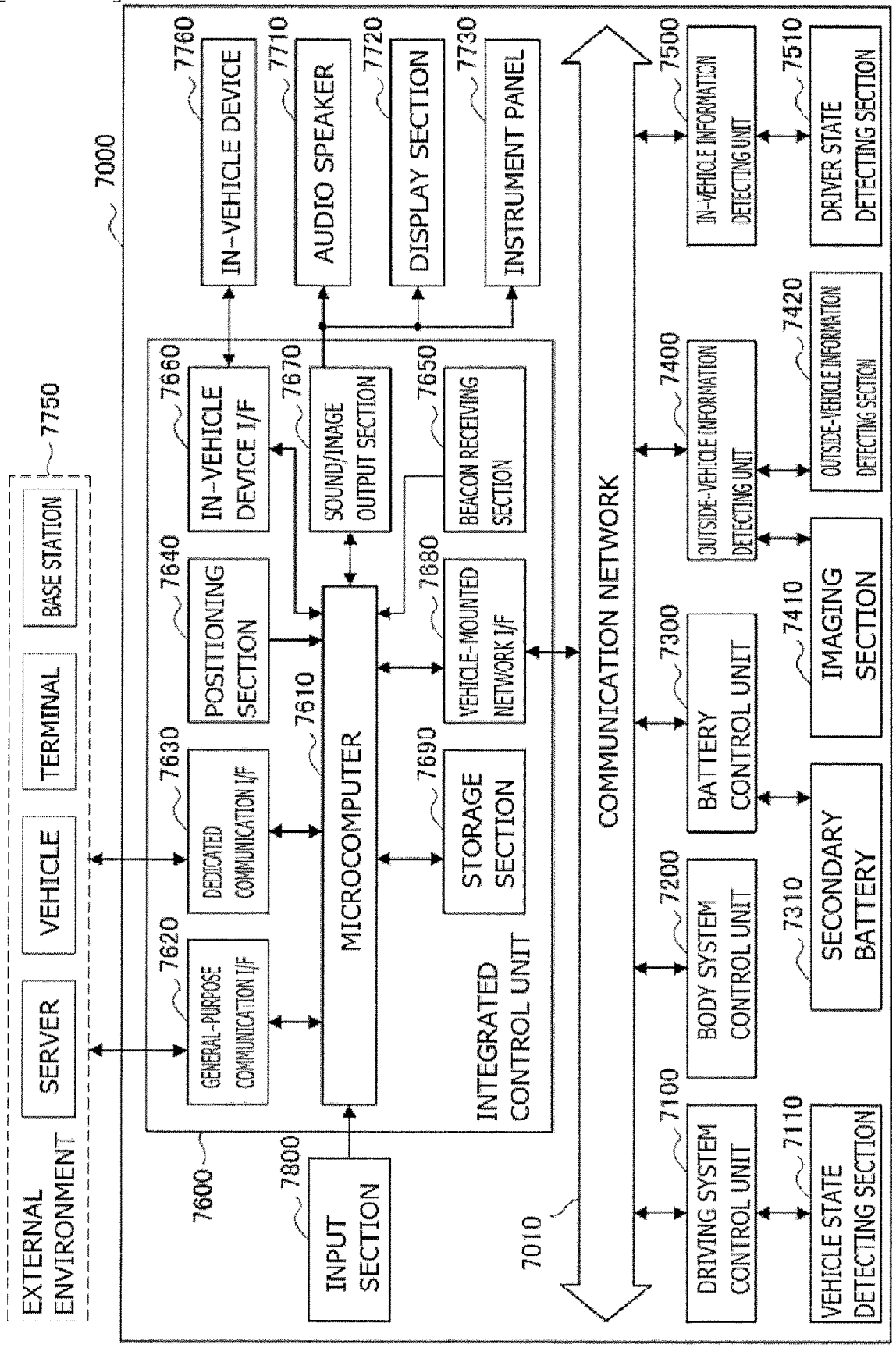

[ FIG. 33 ]
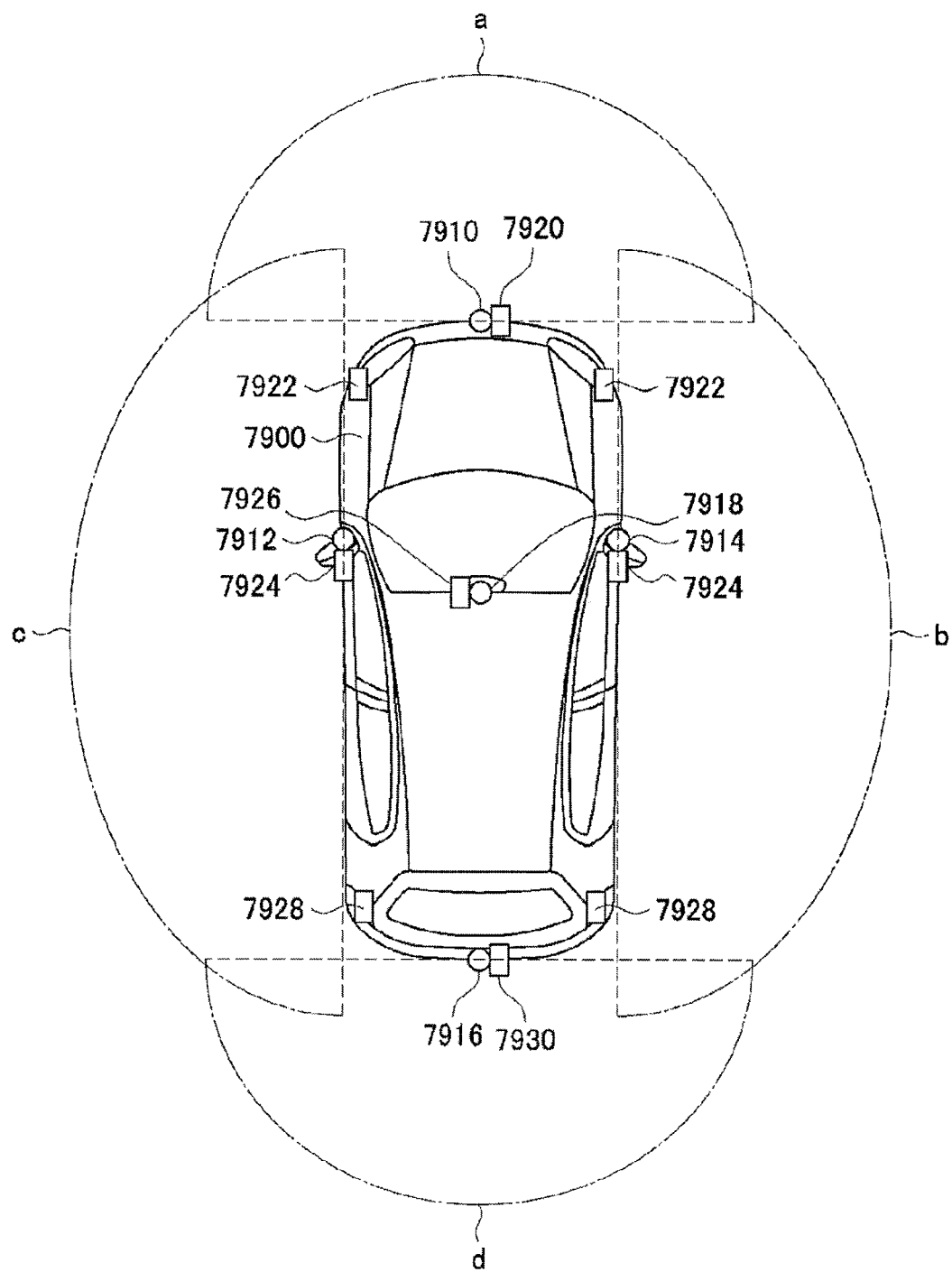

TRANSMISSION DEVICE, TRANSMISSION METHOD, AND COMMUNICATION SYSTEM

TECHNICAL FIELD

The present disclosure relates to a transmission device that transmits a signal, a transmission method employed in such a transmission device, and a communication system including such a transmission device.

BACKGROUND ART

With high-functionality and multi-functionality of electronic apparatuses in recent years, electronic apparatuses are equipped with various devices such as a semiconductor chip, a sensor, and a display device. A lot of pieces of data are exchanged between these devices, and the amount of such data has been increased in accordance with the high-functionality and multi-functionality of electronic apparatuses. Accordingly, the data are often exchanged with use of a high-speed interface. The high-speed interface is able to transmit and receive data at several Gbps, for example.

To improve communication performance of the high-speed interface, various technologies have been disclosed. For example, PTLs 1 and 2 disclose a communication system that uses three transmission paths to transmit three differential signals.

CITATION LIST

Patent Literature

PTL 1: Japanese Unexamined Patent Application Publication No. H06-261092
PTL 2: U.S. Pat. No. 8,064,535

SUMMARY OF THE INVENTION

Incidentally, in a high-speed interface, a clock signal is often generated by a reception device on the basis of a received data signal. Desirably, this clock signal has little jitter.

It is desirable to provide a transmission device, a transmission method, and a communication system that make it possible to reduce jitter of a clock signal generated by a reception device.

A transmission device according to an embodiment of the present disclosure includes a plurality of delay sections, a driver section, and a controller. The plurality of delay sections have changeable delay amounts. The driver section includes a plurality of drivers that are provided to correspond to the plurality of delay sections, and set a voltage at a corresponding output terminal to a mutually different voltage on the basis of a signal delayed by a corresponding delay section of the plurality of delay sections. The driver section transmits a data signal indicating a sequence of symbols using the plurality of drivers. The controller sets the respective delay amounts of the plurality of delay sections on the basis of a transition of a symbol in the sequence of symbols.

A transmission method according to an embodiment of the present disclosure includes: setting respective delay amounts of a plurality of delay sections on the basis of a transition of a symbol in a sequence of symbols; and causing a plurality of drivers provided to correspond to the plurality of delay sections to set a voltage at a corresponding output terminal to a mutually different voltage on the basis of a signal delayed by a corresponding delay section of the plurality of delay sections.

A communication system according to an embodiment of the present disclosure includes a transmission device and a reception device. The transmission device includes a plurality of delay sections, a driver section, and a controller. The plurality of delay sections have changeable delay amounts. The driver section includes a plurality of drivers that are provided to correspond to the plurality of delay sections, and set a voltage at a corresponding output terminal to a mutually different voltage on the basis of a signal delayed by a corresponding delay section of the plurality of delay sections. The driver section transmits a data signal indicating a sequence of symbols using the plurality of drivers. The controller sets the respective delay amounts of the plurality of delay sections on the basis of a transition of a symbol in the sequence of symbols.

In the transmission device, the transmission method, and the communication system according to the embodiments of the present disclosure, the plurality of drivers set a voltage at a corresponding output terminal to a mutually different voltage on the basis of a signal delayed by a corresponding delay section. The delay amount of each of the delay sections is set on the basis of the transition of the symbol.

According to the transmission device, the transmission method, and the communication system according to the embodiments of the present disclosure, the respective delay amounts of the plurality of delay sections are set on the basis of the transition of the symbol, which makes it possible to reduce jitter of a clock signal generated by the reception device. It is to be noted that the effects described here are not necessarily limitative, and may have any of the effects described in the disclosure.

BRIEF DESCRIPTION OF DRAWINGS

FIG. 1 is a block diagram illustrating a configuration example of a communication system according to a first embodiment of the present disclosure.

FIG. 2 is a diagram that describes a voltage of a signal transmitted and received by the communication system illustrated in FIG. 1.

FIG. 3 is a diagram that describes a transition of a symbol transmitted and received by the communication system illustrated in FIG. 1.

FIG. 4 is a block diagram illustrating a configuration example of a transmitter illustrated in FIG. 1.

FIG. 5 is a table illustrating an operation example of a transition detector illustrated in FIG. 4.

FIG. 6 is a table illustrating an operation example of an output section illustrated in FIG. 4.

FIG. 7 is a block diagram illustrating a configuration example of the output section illustrated in FIG. 4.

FIG. 8 is a circuit diagram illustrating a configuration example of drivers illustrated in FIG. 7.

FIG. 9 is a block diagram illustrating a configuration example of a receiver illustrated in FIG. 1.

FIG. 10 is a diagram that describes an operation example of the transmitter and the receiver illustrated in FIG. 1.

FIG. 11 is a timing waveform diagram illustrating an example of a receiving operation of the receiver illustrated in FIG. 9.

FIG. 12A is a diagram that schematically describes a characteristic example of the communication system.

FIG. 12B is another diagram that schematically describes a characteristic example of the communication system.

FIG. 12C is another diagram that schematically describes a characteristic example of the communication system.

FIG. 13 is another diagram that schematically describes a characteristic example of the communication system.

FIG. 14A is a timing waveform diagram illustrating an operation example of the communication system illustrated in FIG. 1.

FIG. 14B is another timing waveform diagram illustrating an operation example of the communication system illustrated in FIG. 1.

FIG. 14C is another timing waveform diagram illustrating an operation example of the communication system illustrated in FIG. 1.

FIG. 14D is another timing waveform diagram illustrating an operation example of the communication system illustrated in FIG. 1.

FIG. 14E is another timing waveform diagram illustrating an operation example of the communication system illustrated in FIG. 1.

FIG. 15 is a timing waveform diagram illustrating another example of the receiving operation of the receiver illustrated in FIG. 9.

FIG. 16A is an eye diagram illustrating a characteristic example of the communication system illustrated in FIG. 1.

FIG. 16B is a diagram that describes an example of a jitter characteristic in the communication system illustrated in FIG. 1.

FIG. 17A is an eye diagram illustrating another characteristic example of the communication system illustrated in FIG. 1.

FIG. 17B is a diagram that describes another example of the jitter characteristic in the communication system illustrated in FIG. 1.

FIG. 18 is a table illustrating an operation example of an output section according to a modification example.

FIG. 19 is a diagram that describes an operation example of a transmitter and a receiver according to the modification example.

FIG. 20 is a table illustrating an operation example of a transition detector according to another modification example.

FIG. 21A is a timing waveform diagram illustrating an operation example of a communication system according to the other modification example.

FIG. 21B is another timing waveform diagram illustrating an operation example of the communication system according to the other modification example.

FIG. 21C is another timing waveform diagram illustrating an operation example of the communication system according to the other modification example.

FIG. 21D is another timing waveform diagram illustrating an operation example of the communication system according to the other modification example.

FIG. 21E is another timing waveform diagram illustrating an operation example of the communication system according to the other modification example.

FIG. 22 is a block diagram illustrating a configuration example of a communication system according to a second embodiment.

FIG. 23 is a block diagram illustrating a configuration example of a transmitter illustrated in FIG. 22.

FIG. 24 is a block diagram illustrating a configuration example of an output section illustrated in FIG. 23.

FIG. 25 is a table illustrating an operation example of the output section illustrated in FIG. 23.

FIG. 26 is a circuit diagram illustrating a configuration example of drivers illustrated in FIG. 24.

FIG. 27 is a circuit diagram illustrating a configuration example of a voltage generator illustrated in FIG. 22.

FIG. 28 is a diagram that describes an operation example of the transmitter and a receiver illustrated in FIG. 22.

FIG. 29 is a perspective view illustrating an appearance configuration of a smartphone to which a communication system according to an embodiment is applied.

FIG. 30 is a block diagram illustrating a configuration example of an application processor to which a communication system according to an embodiment is applied.

FIG. 31 is a block diagram illustrating a configuration example of an image sensor to which a communication system according to an embodiment is applied.

FIG. 32 is a block diagram depicting an example of schematic configuration of a vehicle control system.

FIG. 33 is a diagram of assistance in explaining an example of installation positions of an outside-vehicle information detecting section and an imaging section.

MODES FOR CARRYING OUT THE INVENTION

In the following, some embodiments of the present disclosure are described in detail with reference to the drawings. It is to be noted that description is given in the following order.
1. First Embodiment
2. Second Embodiment
3. Application Example and Further Application Example 1. First Embodiment Configuration Example FIG. 1 illustrates a configuration example of a communication system (a communication system 1) according to a first embodiment. The communication system 1 performs communication using a signal having three voltage levels. It is to be noted that a transmission method according to an embodiment of the present disclosure is embodied by the present embodiment, and is also described together.

The communication system 1 includes a transmission device 10, a transmission path 110, and a reception device 30. The transmission device 10 has three output terminals ToutA, ToutB, and ToutC. The transmission path 110 includes lines 110A, 110B, and 110C. The reception device 30 has three input terminals TinA, TinB, and TinC. Then, the output terminal ToutA of the transmission device 10 and the input terminal TinA of the reception device 30 are coupled to each other through the line 110A; the output terminal ToutB of the transmission device 10 and the input terminal TinB of the reception device 30 are coupled to each other through the line 110B; and the output terminal ToutC of the transmission device 10 and the input terminal TinC of the reception device 30 are coupled to each other through the line 110C. Characteristic impedances of the lines 110A to 110C are about 50[Ω] in this example.

The transmission device 10 outputs signals SIGA, SIGB, and SIGC from the output terminals ToutA, ToutB, and ToutC, respectively. Then, the reception device 30 receives the signals SIGA, SIGB, and SIGC through the input terminals TinA, TinB, and TinC, respectively. The signals SIGA, SIGB, and SIGC each make a transition among three voltage levels (a high-level voltage VH, a medium-level voltage VM, and a low-level voltage VL).

FIG. 2 illustrates respective voltage states of signals SIGA, SIGB, and SIGC. The transmission device 10 transmits six symbols "+x", "−x", "+y", "−y", "+z", and "−z" through using three signals SIGA, SIGB, and SIGC. For example, in a case of transmitting the symbol "+x", the transmission device 10 sets the signal SIGA to the high-level voltage VH, the signal SIGB to the low-level voltage VL, and the signal SIGC to the medium-level voltage VM. In a case of transmitting the symbol "−x", the transmission device 10 sets the signal SIGA to the low-level voltage VL, sets the signal SIGB to the high-level voltage VH, and sets the signal SIGC to the medium-level voltage VM. In a case of transmitting the symbol "+y", the transmission device 10 sets the signal SIGA to the medium-level voltage VM, sets the signal SIGB to the high-level voltage VH, and sets the signal SIGC to the low-level voltage VL. In a case of transmitting the symbol "−y", the transmission device 10 sets the signal SIGA to the medium-level voltage VM, sets the signal SIGB to the low-level voltage VL, and sets the signal SIGC to the high-level voltage VH. In a case of transmitting the symbol "+z", the transmission device 10 sets the signal SIGA to the low-level voltage VL, sets the signal SIGB to the medium-level voltage VM, and sets the signal SIGC to the high-level voltage VH. In a case of transmitting the symbol "−z", the transmission device 10 sets the signal SIGA to the high-level voltage VH, sets the signal SIGB to the medium-level voltage VM, and sets the signal SIGC to the low-level voltage VL.

The transmission path 110 transmits a sequence of symbols through using such signals SIGA, SIGB, and SIGC. That is, the three lines 110A, 110B, and 110C serve as one lane that transmits a sequence of symbols.

(Transmission Device 10)

As illustrated in FIG. 1, the transmission device 10 includes a clock generator 11, a processor 12, and a transmitter 20.

The clock generator 11 generates a clock signal TxCK. A frequency of the clock signal TxCK is, for example, 3.5 [GHz]. It is to be noted that the frequency is not limited to this, and, for example, in a case where a circuit of the transmission device 10 adopts a so-called half-rate architecture, the frequency of the clock signal TxCK may be 1.75 [GHz]. The clock generator 11 includes, for example, a phase-locked loop (PLL), and generates a clock signal TxCK on the basis of, for example, a reference clock (not illustrated) supplied from outside of the transmission device 10. Then, the clock generator 11 supplies this clock signal TxCK to the processor 12 and the transmitter 20.

The processor 12 performs predetermined processing, thereby generating transition signals TxF0 to TxF6, TxR0 to TxR6, and TxP0 to TxP6. A set of the transition signals TxF0, TxR0, and TxP0 here indicates a symbol transition in a sequence of symbols to be transmitted by the transmission device 10. Likewise, a set of the transition signals TxF1, TxR1, and TxP1, a set of the transition signals TxF2, TxR2, and TxP2, a set of the transition signals TxF3, TxR3, and TxP3, a set of the transition signals TxF4, TxR4, and TxP4, a set of the transition signals TxF5, TxR5, and TxP5, and a set of the transition signals TxF6, TxR6, and TxP6 each indicate a symbol transition. That is, the processor 12 generates seven sets of transition signals. Hereinafter, transition signals TxF, TxR, and TxP are used as appropriate to represent any one of the seven sets of transition signals.

FIG. 3 illustrates a relationship between transition signals TxF, TxR, and TxP and a symbol transition. A three-digit numerical value assigned to each transition indicates respective values of the transition signals TxF, TxR, and TxP in this order.

The transition signal TxF(Flip) causes a symbol transition between "+x" and "−x", a symbol transition between "+y" and "−y", and a symbol transition between "+z" and "−z". Specifically, in a case where the transition signal TxF is "1", a symbol makes a transition to change its polarity (for example, from "+x" to "−x"), and in a case where the transition signal TxF is "0", the symbol does not make such a transition.

The transition signals TxR(Rotation) and TxP(Polarity) cause a symbol transition between "+x" and a symbol other than "−x", between "+y" and a symbol other than "−y", and between "+z" and a symbol other than "−z" in a case where the transition signal TxF is "0". Specifically, in a case where the transition signals TxR and TxP are "1" and "0", respectively, the symbol makes a transition in a clockwise direction in FIG. 3 while maintaining its polarity (for example, from "+x" to "+y"), and in a case where the transition signals TxR and TxP are "1" and "1", respectively, the symbol changes the polarity and makes a transition in the clockwise direction in FIG. 3 (for example, from "+x" to "−y"). Furthermore, in a case where the transition signals TxR and TxP are "0" and "0", respectively, the symbol makes a transition in a counterclockwise direction in FIG. 3 while maintaining its polarity (for example, from "+x" to "+z"), and in a case where the transition signals TxR and TxP are "0" and "1", respectively, the symbol changes its polarity and makes a transition in the counterclockwise direction in FIG. 3 (for example, from "+x" to "−z").

The processor 12 generates seven sets of such transition signals TxF, TxR, and TxP. Then, the processor 12 supplies these seven sets of transition signals TxF, TxR, and TxP (transition signals TxF0 to TxF6, TxR0 to TxR6, and TxP0 to TxP6) to the transmitter 20.

The transmitter 20 generates signals SIGA, SIGB, and SIGC on the basis of the transition signals TxF0 to TxF6, TxR0 to TxR6, and TxP0 to TxP6.

FIG. 4 illustrates a configuration example of the transmitter 20. The transmitter 20 includes serializers 21F, 21R, and 21P, a transmission symbol generator 22, a transition detector 25, and an output section 26.

The serializer 21F serializes the transition signals TxF0 to TxF6 in this order on the basis of the transition signals TxF0 to TxF6 and the clock signal TxCK, thereby generating a transition signal TxF9. The serializer 21R serializes the transition signals TxR0 to TxR6 in this order on the basis of the transition signals TxR0 to TxR6 and the clock signal TxCK, thereby generating a transition signal TxR9. The serializer 21P serializes the transition signals TxP0 to TxP6 in this order on the basis of the transition signals TxP0 to TxP6 and the clock signal TxCK, thereby generating a transition signal TxP9.

The transmission symbol generator 22 generates symbol signals Tx1, Tx2, and Tx3 on the basis of the transition signals TxF9, TxR9, and TxP9 and the clock signal TxCK. The transmission symbol generator 22 includes a signal generator 23 and a flip-flop 24.

The signal generator 23 generates the symbol signals Tx1, Tx2, and Tx3 on the basis of the transition signals TxF9, TxR9, and TxP9 and symbol signals D1, D2, and D3. Specifically, the signal generator 23 determines a symbol NS after the transition as illustrated in FIG. 3 on the basis of a symbol (a symbol DS before the transition) indicated by the symbol signals D1, D2, and D3 and the transition signals TxF9, TxR9, and TxP9, and outputs the symbol NS as symbol signals Tx1, Tx2, and Tx3.

The flip-flop 24 performs sampling of the symbol signals Tx1, Tx2, and Tx3 on the basis of the clock signal TxCK, and outputs a result of the sampling as the symbol signals D1, D2, and D3.

FIG. 5 illustrates an operation example of the transmission symbol generator 22. This FIG. 5 illustrates the symbol NS generated on the basis of the symbol DS indicated by symbol signals D1, D2, and D3 and the transition signals TxF9, TxR9, and TxP9. A case where the symbol DS is "+x" is described as an example. In a case where the transition signals TxF9, TxR9, and TxP9 are "000", the symbol NS is "+z"; in a case where the transition signals TxF9, TxR9, and TxP9 are "001", the symbol NS is "−z"; in a case where the transition signals TxF9, TxR9, and TxP9 are "010", the symbol NS is "+y"; in a case where the transition signals TxF9, TxR9, and TxP9 are "011", the symbol NS is "−y"; and in a case where the transition signals TxF9, TxR9, and TxP9 are "1XX", the symbol NS is "−x". Here, "X" indicates that any one of "1" and "0" may be adopted. The same applies to a case where the symbol DS is one of "−x", "+y", "−y", "+z", and "−z".

In this way, the transmission symbol generator 22 determines the symbol NS after the transition on the basis of the symbol DS before the transition and the transition signals TxF9, TxR9, and TxP9. Then, the transmission symbol generator 22 outputs the symbol NS after the transition as symbol signals Tx1, Tx2, and Tx3.

The transition detector 25 generates delay control signals DLA, DLB, and DLC on the basis of the transition signals TxF9, TxR9, and TxP9 and the symbol signals D1, D2, and D3. Specifically, as illustrated in portions WA enclosed by a solid line in FIG. 5, in any of a case where the transition signals TxF9, TxR9, and TxP9 are "000" and the symbol DS indicated by symbol signals D1, D2, and D3 is "+y", a case where the transition signals TxF9, TxR9, and TxP9 are "000" and the symbol DS is "−y", a case where the transition signals TxF9, TxR9, and TxP9 are "010" and the symbol DS is "+y", and a case where the transition signals TxF9, TxR9, and TxP9 are "010" and the symbol DS is "−y", the transition detector 25 makes the delay control signal DLA "active", and makes the delay control signals DLB and DLC "inactive". Furthermore, as illustrated in portions WB enclosed by a broken line in FIG. 5, in any of a case where the transition signals TxF9, TxR9, and TxP9 are "000" and the symbol DS indicated by the symbol signals D1, D2, and D3 is "+z", a case where the transition signals TxF9, TxR9, and TxP9 are "000" and the symbol DS is "−z", a case where the transition signals TxF9, TxR9, and TxP9 are "010" and the symbol DS is "+z", and a case where the transition signals TxF9, TxR9, and TxP9 are "010" and the symbol DS is "−z", the transition detector 25 makes the delay control signal DLB "active", and makes the delay control signals DLA and DLC "inactive". Moreover, as illustrated in portions WC enclosed by a dashed-dotted line in FIG. 5, in any of a case where the transition signals TxF9, TxR9, and TxP9 are "000" and the symbol DS indicated by the symbol signals D1, D2, and D3 is "+x", a case where transition the signals TxF9, TxR9, and TxP9 are "000" and the symbol DS is "−x", a case where the transition signals TxF9, TxR9, and TxP9 are "010" and the symbol DS is "+x", and a case where the transition signals TxF9, TxR9, and TxP9 are "010" and the symbol DS is "−x", the transition detector 25 makes the delay control signal DLC "active", and makes the delay control signals DLA and DLB "inactive". Furthermore, in the other cases, the transition detector 25 makes all the delay control signals DLA, DLB, and DLC "inactive".

The output section 26 generates the signals SIGA, SIGB, and SIGC on the basis of the symbol signals Tx1, Tx2, and Tx3, the delay control signals DLA, DLB, and DLC, and the clock signal TxCK.

FIG. 6 illustrates an operation example of the output section 26. For example, in a case where the symbol NS is "+x" (the symbol signals Tx1, Tx2, and Tx3 are "100"), the output section 26 sets the signal SIGA to the high-level voltage VH, sets the signal SIGB to the low-level voltage VL, and sets the signal SIGC to the medium-level voltage VM. Furthermore, for example, in a case where the symbol NS is "−x" (the symbol signals Tx1, Tx2, and Tx3 are "011"), the output section 26 sets the signal SIGA to the low-level voltage VL, sets the signal SIGB to the high-level voltage VH, and sets the signal SIGC to the medium-level voltage VM. Moreover, for example, in a case where the symbol NS is "+y" (the symbol signals Tx1, Tx2, and Tx3 are "010"), the output section 26 sets the signal SIGA to the medium-level voltage VM, sets the signal SIGB to the high-level voltage VH, and sets the signal SIGC to the low-level voltage VL. Furthermore, for example, in a case where the symbol NS is "−y" (the symbol signals Tx1, Tx2, and Tx3 are "101"), the output section 26 sets the signal SIGA to the medium-level voltage VM, sets the signal SIGB to the low-level voltage VL, and sets the signal SIGC to the high-level voltage VH. Moreover, for example, in a case where the symbol NS is "+z" (the symbol signals Tx1, Tx2, and Tx3 are "001"), the output section 26 sets the signal SIGA to the low-level voltage VL, sets the signal SIGB to the medium-level voltage VM, and sets the signal SIGC to the high-level voltage VH. Furthermore, for example, in a case where the symbol NS is "−z" (the symbol signals Tx1, Tx2, and Tx3 are "110"), the output section 26 sets the signal SIGA to the high-level voltage VH, sets the signal SIGB to the medium-level voltage VM, and sets the signal SIGC to the low-level voltage VL.

FIG. 7 illustrates a configuration example of the output section 26. The output section 26 includes a driver controller 27, and delay sections 28A, 28B, and 28C, and drivers 29A, 29B, and 29C.

The driver controller 27 generates four signals PUAA, PUAB, PDAA, and PDAB, four signals PUBA, PUBB, PDBA, and PDBB, and four signals PUCA, PUCB, PDCA, and PDCB on the basis of the symbol signals Tx1, Tx2, and Tx3 and the clock signal TxCK. Specifically, as illustrated in FIG. 6, for example, the driver controller 27 sets the four signals PUAA, PUAB, PDAA, and PDAB to "1100" in a case where the signal SIGA is set to the high-level voltage VH, sets the four signals PUAA, PUAB, PDAA, and PDAB to "0011" in a case where the signal SIGA is set to the low-level voltage VL, and sets the four signals PUAA, PUAB, PDAA, and PDAB to "1010" in a case where the signal SIGA is set to the medium-level voltage VM. The same applies to signals SIGB and SIGC. Then, the driver controller 27 supplies the four signals PUAA, PUAB, PDAA, and PDAB to the delay section 28A, the four signals PUBA, PUBB, PDBA, and PDBB to the delay section 28B, and the four signals PUCA, PUCB, PDCA, and PDCB to the delay section 28C.

Furthermore, the driver controller 27 has a function of generating delay control signals DLA1, DLB1, and DLC1 on the basis of the delay control signals DLA, DLB, and DLC and the clock signal TxCK. Specifically, the driver controller 27 generates the delay control signals DLA1, DLB1, and DLC1 through delaying the delay control signals DLA, DLB, and DLC by a time corresponding to a delay time when generating the four signals PUAA, PUAB, PDAA, and PDAB, the four signals PUBA, PUBB, PDBA, and PDBB, and the four signals PUCA, PUCB, PDCA, and PDCB on the basis of the symbol signals Tx1, Tx2, and Tx3.

The delay section 28A delays the four signals PUAA, PUAB, PDAA, and PDAB on the basis of the delay control signal DLA1, thereby generating signals PUAA1, PUAB1, PDAA1, and PDAB1, respectively. Specifically, in a case where the delay control signal DLA1 is "inactive", the delay section 28A delays the four signals PUAA, PUAB, PDAA, and PDAB by a delay amount DL1, thereby generating the signals PUAA1, PUAB1, PDAA1, and PDAB1. Furthermore, in a case where the delay control signal DLA1 is "active", the delay section 28A delays the four signals PUAA, PUAB, PDAA, and PDAB by a delay amount DL2 larger than the delay amount DL1, thereby generating the signals PUAA1, PUAB1, PDAA1, and PDAB1.

Likewise, the delay section 28B delays the four signals PUBA, PUBB, PDBA, and PDBB on the basis of the delay control signal DLB1, thereby generating signals PUBA1, PUBB1, PDBA1, and PDBB1, respectively. Furthermore, the delay section 28C delays the four signals PUCA, PUCB, PDCA, and PDCB on the basis of the delay control signal DLC1, thereby generating signals PUCA1, PUCB1, PDCA1, and PDCB1, respectively.

The driver 29A generates the signal SIGA on the basis of the signals PUAA1, PUAB1, PDAA1, and PDAB1. The driver 29B generates the signal SIGB on the basis of the signals PUBA1, PUBB1, PDBA1, and PDBB1. The driver 29C generates the signal SIGC on the basis of the signals PUCA1, PUCB1, PDCA1, and PDCB1.

FIG. 8 illustrates a configuration example of the drivers 29A, 29B, and 29C. In the following, the driver 29A is described as an example. It is to be noted that the same applies to the drivers 29B and 29C. The driver 29A includes M circuits UA (circuits UA1 to UAM), M circuits UB (circuits UB1 to UBM), M circuits DA (circuits DA1 to DAM), and M circuits DB (circuits DB1 to DBM).

The circuits UA1 to UAM and UB1 to UBM each include a transistor 91 and a resistor 92. In this example, the transistor 91 is an N-channel MOS (metal oxide semiconductor)-FET (field effect transistor). In each of the circuits UA1 to UAM, a gate of the transistor 91 is supplied with the signal PUAA1, and a drain thereof is supplied with a voltage V1, and a source thereof is coupled to one end of the resistor 92. In each of the circuits UB1 to UBM, the gate of the transistor 91 is supplied with the signal PUAB1, and the drain thereof is supplied with the voltage V1, and the source thereof is coupled to one end of the resistor 92. In each of the circuits UA1 to UAM and UB1 to UBM, the one end of the resistor 92 is coupled to the source of the transistor 91, and another end thereof is coupled to the output terminal ToutA. The sum of an on-state resistance value of the transistor 91 and a resistance value of the resistor 92 is "50×2×M"[Ω] in this example.

The circuits DA1 to DAM and DB1 to DBM each include a resistor 93 and a transistor 94. In this example, the transistor 94 is an N-channel MOS-FET. In each of the circuits DA1 to DAM and DB1 to DBM, one end of the resistor 93 is coupled to the output terminal ToutA, and another end thereof is coupled to a drain of the transistor 94. In each of the circuits DA1 to DAM, a gate of the transistor 94 is supplied with the signal PDAA1, and the drain thereof is coupled to the other end of the resistor 93, and a source thereof is grounded. In each of the circuits DB1 to DBM, the gate of the transistor 94 is supplied with the signal PDAB1, and the drain thereof is coupled to the other end of the resistor 93, and the source thereof is grounded. The sum of a resistance value of the resistor 93 and an on-state resistance value of the transistor 94 is "50×2×M"[Ω] in this example.

This configuration allows the output section 26 to set respective voltages at the output terminals ToutA, ToutB, and ToutC to mutually different voltage levels of the three voltage levels (the high-level voltage VH, the medium-level voltage VM, and the low-level voltage VL).

Specifically, for example, in a case where the symbol signals Tx1, Tx2, and Tx3 are "100", as illustrated in FIG. 6, the driver controller 27 determines that a symbol "+x" should be outputted, and sets the four signals PUAA, PUAB, PDAA, and PDAB to "1100", sets the four signals PUBA, PUBB, PDBA, and PDBB to "0011", and sets the four signals PUCA, PUCB, PDCA, and PDCB to "1010". Thus, the four signals PUAA1, PUAB1, PDAA1, and PDAB1 become "1100"; the four signals PUBA1, PUBB1, PDBA1, and PDBB1 become "0011"; and the four signals PUCA1, PUCB1, PDCA1, and PDCB1 become "1010".

Accordingly, in the driver 29A, the transistors 91 in the circuits UA1 to UAM and UB1 to UBM are turned to an on state, and the transistors 94 in the circuits DA1 to DAM and DB1 to DBM are turned to an off state. As a result, a voltage of the signal SIGA becomes the high-level voltage VH, and an output terminating resistance (an output impedance) of the driver 29A becomes about 50[Ω]. Furthermore, in the driver 29B, the transistors 94 in the circuits DA1 to DAM and DB1 to DBM are turned to the on state, and the transistors 91 in the circuits UA1 to UAM and UB1 to UBM are turned to the off state. As a result, a voltage of the signal SIGB becomes the low-level voltage VL, and an output terminating resistance (an output impedance) of the driver 29B becomes about 50[Ω]. Moreover, in the driver 29C, the transistors 91 in the circuits UA1 to UAM and the transistors 94 in the circuits DA1 to DAM are turned to the on state, and the transistors 91 in the circuits UB1 to UBM and the transistors 94 in the circuits DB1 to DBM are turned to the off state. That is, in the driver 29C, a so-called Thevenin termination is realized by the circuits UA1 to UAM and the circuits DA1 to DAM. As a result, the voltage of the signal SIGC becomes the medium-level voltage VM, and an output terminating resistance (an output impedance) of the driver 29C becomes about 50[Ω]. The transmitter 20 generates the symbol "+x" in this way. The same applies to the other symbols.

(Reception Device 30)

As illustrated in FIG. 1, the reception device 30 includes a receiver 40 and a processor 32.

The receiver 40 receives the signals SIGA, SIGB, and SIGC, and generates the transition signals RxF, RxR, and RxP and the clock signal RxCK on the basis of these signals SIGA, SIGB, and SIGC.

FIG. 9 illustrates a configuration example of the receiver 40. The receiver 40 includes resistors 41A, 41B, and 41C, switches 42A, 42B, and 42C, amplifiers 43A, 43B, and 43C, a clock generator 44, flip-flops (F/Fs) 45 and 46, and a signal generator 47.

The resistors 41A, 41B, and 41C each serve as a terminating resistor of the communication system 1, and each have a resistance value of about 50[Ω] in this example. One end of the resistor 41A is coupled to the input terminal TinA and supplied with the signal SIGA, and another end thereof is coupled to one end of the switch 42A. One end of the resistor 41B is coupled to the input terminal TinB and supplied with the signal SIGB, and another end thereof is coupled to one end of the switch 42B. One end of the resistor 41C is coupled to the input terminal TinC and supplied with the signal SIGC, and another end is coupled to one end of the switch 42C.

The one end of the switch 42A is coupled to the other end of the resistor 41A, and another end thereof is coupled to another end of the switch 42B and another end of the switch 42C. The one end of the switch 42B is coupled to the other end of the resistor 41B, and the other end thereof is coupled to the other ends of the switches 42A and 42C. The one end of the switch 42C is coupled to the other end of the resistor 41C, and the other end thereof is coupled to the other ends of the switches 42A and 42B. In the reception device 30, the switches 42A, 42B, and 42C are set to the on state, and the resistors 41A to 41C each serve as a terminating resistor.

A positive input terminal of the amplifier 43A is coupled to the input terminal TinA, the one end of the resistor 41A, and a negative input terminal of the amplifier 43C, and a negative input terminal thereof is coupled to the input terminal TinB, the one end of the resistor 41B, and a positive input terminal of the amplifier 43B. The positive input terminal of the amplifier 43B is coupled to the input terminal TinB, the one end of the resistor 41B, and the negative input terminal of the amplifier 43A, and a negative input terminal thereof is coupled to the input terminal TinC, the one end of the resistor 41C, and a positive input terminal of the amplifier 43C. The positive input terminal of the amplifier 43C is coupled to the input terminal TinC, the one end of the resistor 41C, and the negative input terminal of the amplifier 43B, and the negative input terminal thereof is coupled to the input terminal TinA, the one end of the resistor 41A, and the positive input terminal of the amplifier 43A.

This configuration allows the amplifier 43A to generate a signal SAB corresponding to a difference AB (SIGA-SIGB) between the signals SIGA and SIGB, allows the amplifier 43B to generate a signal SBC corresponding to a difference BC (SIGB-SIGC) between the signals SIGB and SIGC, and allows the amplifier 43C to generate a signal SCA corresponding to a difference CA (SIGC-SIGA) between the signals SIGC and SIGA.

FIG. 10 schematically illustrates an operation example of the transmitter 20 and the receiver 40 in a case where the transmitter 20 transmits the symbol "+x". It is to be noted that the switches 42A, 42B, and 42C are in the on state, and illustration of the switches 42A, 42B, and 42C is therefore omitted. In FIG. 10, of the circuits UA (the circuits UA1 to UAM) and the circuits UB (the circuits UB1 to UBM) of the transmitter 20, a circuit illustrated by a solid line indicates a circuit in which the transistor 91 is in the on state, and a circuit illustrated by a broken line indicates a circuit in which the transistor 91 is in the off state. Likewise, of the circuits DA (the circuits DA1 to DAM) and the circuits DB (the circuits DB1 to DBM), a circuit illustrated by a solid line indicates a circuit in which the transistor 94 is in the on state, and a circuit illustrated by a broken line indicates a circuit in which the transistor 94 is in the off state.

In a case where the transmitter 20 transmits the symbol "+x", as described above, in the driver 29A, the transistors 91 in the circuits UA1 to UAM and UB1 to UBM are turned to the on state. As a result, the voltage of the signal SIGA becomes the high-level voltage VH. Furthermore, in the driver 29B, the transistors 94 in the circuits DA1 to DAM and DB1 to DBM are turned to the on state. As a result, the voltage of the signal SIGB becomes the low-level voltage VL. Moreover, in the driver 29C, the transistors 91 in the circuits UA1 to UAM and the transistors 94 in the circuits DA1 to DAM are turned to the on state. As a result, the voltage of the signal SIGC becomes the medium-level voltage VM.

In this case, in the receiver 40, a current Iin flows to the input terminal TinA, the resistor 41A, the resistor 41B, and the input terminal TinB in this order. Then, the positive input terminal of the amplifier 43A is supplied with the high-level voltage VH, and the negative input terminal thereof is supplied with the low-level voltage VL, which causes the difference AB to be positive (AB>0); therefore, the amplifier 43A outputs "1" as the signal SAB. Furthermore, the positive input terminal of the amplifier 43B is supplied with the low-level voltage VL, and the negative input terminal thereof is supplied with the medium-level voltage VM, which causes the difference BC to be negative (BC<0); therefore, the amplifier 43B outputs "0" as the signal SBC. Moreover, the positive input terminal of the amplifier 43C is supplied with the medium-level voltage VM, and the negative input terminal thereof is supplied with the high-level voltage VH, which causes the difference CA to be negative (CA<0); therefore, the amplifier 43C outputs "0" as the signal SCA.

The clock generator 44 (FIG. 9) generates the clock signal RxCK on the basis of the signals SAB, SBC, and SCA. Specifically, as will be described later, the clock generator 44 detects, of the signals SAB, SBC, and SCA, a signal that has first made a transition in a case where the symbol has made a transition, and generates a clock pulse PU having a predetermined pulse width starting from a transition timing of the signal, thereby generating the clock signal RxCK.

The flip-flop 45 outputs the signals SAB, SBC, and SCA with a delay of one clock of the clock signal RxCK. The flip-flop 46 outputs three output signals of the flip-flop 45 with a delay of one clock of the clock signal RxCK.

The signal generator 47 generates the transition signals RxF, RxR, and RxP on the basis of the output signals of the flip-flops 45 and 46 and the clock signal RxCK. These transition signals RxF, RxR, and RxP correspond to the transition signals TxF9, TxR9, and TxP9 (FIG. 4) in the transmission device 10, respectively, and represent a symbol transition. The signal generator 47 identifies a symbol transition (FIG. 3) on the basis of a symbol indicated by the output signals of the flip-flop 45 and a symbol indicated by the output signals of the flip-flop 46, thereby generating the transition signals RxF, RxR, and RxP.

The processor 32 (FIG. 1) performs predetermined processing on the basis of the transition signals RxF, RxR, and RxP and the clock signal RxCK.

Here, the delay sections 28A, 28B, and 28C correspond to a specific example of a "plurality of delay sections" in the present disclosure. The drivers 29A, 29B, and 29C correspond to a specific example of a "plurality of drivers" in the present disclosure. The transistor 91 corresponds to a specific example of a "first transistor" in the present disclosure. The transistor 94 corresponds to a specific example of a "second transistor" in the present disclosure. The transmission symbol generator 22 corresponds to a specific example of a "symbol generator" in the present disclosure. The transition detector 25 corresponds to a specific example of a "controller" in the present disclosure. The signals PUAA, PUAB, PDAA, and PDAB correspond to a specific example of a "first signal" in the present disclosure. The signals PUBA, PUBB, PDBA, and PDBB correspond to a specific example of a "second signal" in the present disclosure. The signals PUCA, PUCB, PDCA, and PDCB correspond to a specific example of a "third signal" in the present disclosure. The signal SIGA corresponds to a specific example of a "first transmission signal" in the present disclosure. The signal SIGB corresponds to a specific example of a "second transmission signal" in the present disclosure. The signal SIGC corresponds to a specific example of a "third transmission signal" in the present disclosure. The signal SAB corresponds to a specific example of a "first differential signal" in the present disclosure. The signal SBC corresponds to a specific example of a "second differential signal" in the present disclosure. The signal SCA corresponds to a specific example of a "third differential signal" in the present disclosure. The clock signal RxCK corresponds to a specific example of a "clock signal" in the present disclosure.

[Operation and Workings]

Subsequently, the operation and workings of the communication system 1 in the present embodiment are described.

(Outline of Overall Operation)

First, an outline of an overall operation of the communication system 1 is described with reference to FIGS. 1, 4, 7, and 9. The clock generator 11 of the transmission device 10 generates the clock signal TxCK. The processor 12 performs predetermined processing, thereby generating the transition signals TxF0 to TxF6, TxR0 to TxR6, and TxP0 to TxP6. In the transmitter 20 (FIG. 4), the serializer 21F generates the transition signal TxF9 on the basis of the transition signals TxF0 to TxF6 and the clock signal TxCK; the serializer 21R generates the transition signal TxR9 on the basis of the transition signals TxR0 to TxR6 and the clock signal TxCK; and the serializer 21P generates the transition signal TxP9 on the basis of the transition signals TxP0 to TxP6 and the clock signal TxCK. The transmission symbol generator 22 generates the symbol signals Tx1, Tx2, and Tx3 on the basis of the transition signals TxF9, TxR9, and TxP9 and the clock signal TxCK. The transition detector 25 generates the delay control signals DLA, DLB, and DLC on the basis of the transition signals TxF9, TxR9, and TxP9 and symbol signals D1, D2, and D3.

In the output section 26 (FIG. 7), the driver controller 27 generates four signals PUAA, PUAB, PDAA, and PDAB, four signals PUBA, PUBB, PDBA, and PDBB, and four signals PUCA, PUCB, PDCA, and PDCB on the basis of the symbol signals Tx1, Tx2, and Tx3 and the clock signal TxCK. Furthermore, the driver controller 27 generates each of the delay control signals DLA1, DLB1, and DLC1 on the basis of delay control signals DLA, DLB, and DLC and the clock signal TxCK. The delay section 28A delays the four signals PUAA, PUAB, PDAA, and PDAB on the basis of the delay control signal DLA1, thereby generating signals PUAA1, PUAB1, PDAA1, and PDAB1, respectively. The delay section 28B delays the four signals PUBA, PUBB, PDBA, and PDBB on the basis of the delay control signal DLB1, thereby generating signals PUBA1, PUBB1, PDBA1, and PDBB1. The delay section 28C delays the four signals PUCA, PUCB, PDCA, and PDCB on the basis of the delay control signal DLC1, thereby generating signals PUCA1, PUCB1, PDCA1, and PDCB1, respectively. The driver 29A generates the signal SIGA on the basis of the signals PUAA1, PUAB1, PDAA1, and PDAB1. The driver 29B generates the signal SIGB on the basis of the signals PUBA1, PUBB1, PDBA1, and PDBB1. The driver 29C generates the signal SIGC on the basis of the signals PUCA1, PUCB1, PDCA1, and PDCB1.

In the receiver 40 of the reception device 30 (FIG. 9), the amplifier 43A generates the signal SAB corresponding to the difference AB (SIGA-SIGB) between the signals SIGA and SIGB on the basis of the signals SIGA and SIGB; the amplifier 43B generates the signal SBC corresponding to the difference BC (SIGB-SIGC) between the signals SIGB and SIGC on the basis of the signals SIGB and SIGC; and the amplifier 43C generates the signal SCA corresponding to the difference CA (SIGC-SIGA) between the signals SIGC and SIGA on the basis of the signals SIGC and SIGA. The clock generator 44 generates the clock signal RxCK on the basis of the signals SAB, SBC, and SCA. The flip-flop 45 outputs each of the signals SAB, SBC, and SCA with a delay of one clock of the clock signal RxCK. The flip-flop 46 outputs each of three output signals of the flip-flop 45 with a delay of one clock of the clock signal RxCK. The signal generator 47 generates the transition signals RxF, RxR, and RxP on the basis of the output signals of the flip-flops 45 and 46 and the clock signal RxCK. The processor 32 (FIG. 1) performs predetermined processing on the basis of the transition signals RxF, RxR, and RxP and the clock signal RxCK.

(Detailed Operation)

Subsequently, the operation of the communication system 1 is described in detail. In the transmission device 10, the transition detector 25 generates the delay control signals DLA, DLB, and DLC on the basis of the transition signals TxF9, TxR9, and TxP9 and the symbol signals D1, D2, and D3. Then, the delay section 28A sets an amount of delay for four signals PUAA, PUAB, PDAA, and PDAB on the basis of the delay control signal DLA1; the delay section 28B sets an amount of delay for four signals PUBA, PUBB, PDBA, and PDBB on the basis of the delay control signal DLB1; and the delay section 28C sets an amount of delay for four signals PUCA, PUCB, PDCA, and PDCB on the basis of the delay control signal DLC1. Accordingly, in the communication system 1, it is possible to reduce jitter of the clock signal RxCK generated by the reception device 30. This operation is described in detail below.

FIG. 11 illustrates an operation example of the communication system 1 in a case where respective delay amounts of the delay sections 28A, 28B, and 28C are not adjusted. In this example, the delay amounts of the delay sections 28A, 28B, and 28C are fixed equally at a predetermined delay amount DL1.

The transmission device 10 causes a symbol to be transmitted, to make a transition at every lapse of the unit interval UI. In this example, the transmission device 10 transmits six symbols "+x", "−y", "−z", "+z", "+y", and "−x" in this order. At this time, the voltage of the signal SIGA changes in the order of VH, VM, VH, VL, VM, and VL; the voltage of the signal SIGB changes in the order of VL, VL, VM, VM, VH, and VH; and the voltage of a signal SIGC changes in the order of VM, VH, VL, VH, VL, and VM. Thus, in the communication system 1, the voltages of two or more signals of the three signals SIGA, SIGB, and SIGC change in accordance with a transition of the symbol.

Then, the differences AB, BC, and CA also change in accordance with the signals SIGA, SIGB, and SIGC. For example, the difference AB changes in the order of +2ΔV, +ΔV, +ΔV, −ΔV, −ΔV, and −2ΔV; the difference BC changes in the order of −ΔV, −2ΔV, +ΔV, −ΔV, +2ΔV, and +ΔV; and the difference CA changes in the order of −ΔV, +ΔV, −2ΔV, +2ΔV, −ΔV, and +ΔV. Here, ΔV denotes a difference between two adjacent voltages in the three voltage levels (the high-level voltage VH, the medium-level voltage VM, and the low-level voltage VL).

The amplifier 43A generates the signal SAB on the basis of the difference AB. This signal SAB makes a transition at a timing at which the difference AB crosses "0". Likewise, the amplifier 43B generates the signal SBC on the basis of the difference BC. This signal SBC makes a transition at a timing at which the difference BC crosses "0". The amplifier 43C generates the signal SCA on the basis of the difference CA. This signal SCA makes a transition at a timing at which the difference CA crosses "0". Thus, in the communication system 1, one or more signals of the signals SAB, SBC, and SCA change in accordance with the transition of the symbol.

Then, the clock generator 44 generates the clock signal RxCK on the basis of the signals SAB, SBC, and SCA. Specifically, the clock generator 44 detects, of the signals SAB, SBC, and SCA, a signal that first has made a transition in a case where the symbol has made a transition, and generates the clock pulse PU having a predetermined pulse width starting from a transition timing of the signal, thereby generating a clock signal RxCK.

Here, as described above, a timing for the signal SAB to make a transition corresponds to the timing at which the difference AB crosses "0"; a timing for the signal SBC to make a transition corresponds to the timing at which the difference BC crosses "0"; and a timing for the signal SCA to make a transition corresponds to the timing at which the difference CA crosses "0". That is, the timings for the signals SAB, SBC, and SCA to make a transition depend on variations of the differences AB, BC, and CA. Accordingly, in a case where two or more of the differences AB, BC, and CA make a transition in accordance with a transition of the symbol, transition timings of the two or more of the differences AB, BC, and CA do not necessarily coincide with one another. Therefore, there is a variation in the length of a period between rising edges of the clock signal RxCK (a clock period PC). Specifically, in the example of FIG. 11, the length of a clock period PC1 corresponding to the symbol "−y" subsequent to the symbol "+x" is shorter than the length of the unit interval UI, and the length of a clock period PC2 corresponding to the subsequent symbol "−z" is longer than the unit interval UI. Likewise, the length of a clock period PC3 corresponding to the symbol "+z" subsequent to the symbol "−z" is shorter than the length of the unit interval UI, and the length of a clock period PC4 corresponding to the subsequent symbol "+y" is longer than the unit interval UI. In a case where there is a variation in the length of the clock period PC in this way, jitter of the clock signal RxCK is increased, which may affect communication quality.

Subsequently, the cause of a variation in the length of the clock period PC is described in detail.

FIGS. 12A, 12B, and 12C schematically illustrate respective variations of differences AB, BC, and CA in accordance with a transition of the symbol. In the communication system 1, the signals SIGA, SIGB, and SIGC each may take the three voltage levels (the high-level voltage VH, the medium-level voltage VM, and the low-level voltage VL); therefore, as illustrated in FIGS. 12A, 12B, and 12C, the differences AB, BC, and CA make a transition among +2ΔV, +ΔV, −ΔV, and −2ΔV. These transitions include various transitions that differ in a time Δt from a timing t0 at which the differences AB, BC, and CA start changing to a timing t1 at which differential signals of the differences AB, BC, and CA cross "0". Specifically, these transitions include, for example, a transition WS of which the time Δt is short (FIG. 12A), transitions WW and SS of which the time Δt is moderate (FIG. 12B), and a transition SW of which the time Δt is long (FIG. 12C). The transition WS (FIG. 12A) includes a transition from "+ΔV" to "−2ΔV" and a transition from "−ΔV" to "+2ΔV". The transition WW (FIG. 12B) includes a transition from "+ΔV" to "−ΔV" and a transition from "−ΔV" to "+ΔV". The transition SS (FIG. 12B) includes a transition from "+2ΔV" to "−2ΔV" and a transition from "−2ΔV" to "+2ΔV". The transition SW (FIG. 12C) include a transition from "+2ΔV" to "−ΔV" and a transition from "−2ΔV" to "+ΔV".

As described above, the clock generator 44 detects, of signals SAB, SBC, and SCA, the signal that has first made a transition in a case where the symbol has made a transition, and generates the clock pulse PU having a predetermined pulse width starting from a transition timing of the signal, thereby generating the clock signal RxCK. Here, in the communication system 1, as will be described later, in a case where one of the signals SAB, SBC, and SCA makes the transition SW of which the time Δt is long, one of the other signals makes the transition WS of which the time Δt is short. Accordingly, in this case, the clock pulse PU is generated on the basis of the transition WS of which the time Δt is short; therefore, the transition SW of which the time Δt is long does not contribute to the generation of the clock pulse PU. As a result, the transition WS of which the time Δt is short and the transitions WW and SS of which the time Δt is moderate contribute to the generation of the clock pulse PU.

FIG. 13 schematically illustrates the length of the clock period PC. In this FIG. 13, the clock pulse PU with "WS" represents a clock pulse generated on the basis of the transition WS of which the time Δt is short; the clock pulse PU with "WW" represents a clock pulse generated on the basis of the transition WW of which the time Δt is moderate; the clock pulse PU with "SS" represents a clock pulse generated on the basis of the transition SS of which the time Δt is moderate.

For example, in a case where after the clock pulse PU has been generated on the basis of the transition WS, the clock pulse PU has been generated on the basis of the same transition WS as illustrated in (A) of FIG. 13, the length of the clock period PC is substantially equal to the length of the unit interval UI. Likewise, in a case where after the clock pulse PU has been generated on the basis of the transition WW, the clock pulse PU has been generated on the basis of the same transition WW as illustrated in (B) of FIG. 13, the length of the clock period PC is substantially equal to the length of the unit interval UI; in a case where after the clock pulse PU has been generated on the basis of the transition SS, the clock pulse PU has been generated on the basis of the same transition SS as illustrated in (C) of FIG. 13, the length of the clock period PC is substantially equal to the length of the unit interval UI. Furthermore, in a case where after the clock pulse PU has been generated on the basis of the transition WW, the clock pulse PU has been generated on the basis of the transition SS as illustrated in (D) of FIG. 13, the length of the clock period PC is substantially equal to the length of the unit interval UI; in a case where after the clock pulse PU has been generated on the basis of the transition SS, the clock pulse PU has been generated on the basis of the transition WW as illustrated in (E) of FIG. 13, the length of the clock period PC is substantially equal to the length of the unit interval UI.

Meanwhile, for example, in a case where after the clock pulse PU has been generated on the basis of the transition WW, the clock pulse PU has been generated on the basis of the transition WS of which the time Δt is shorter than that of the transition WW as illustrated in (F) of FIG. 13, the length of the clock period PC is shorter than the length of the unit interval UI. Likewise, for example, in a case where after the clock pulse PU has been generated on the basis of the transition SS, the clock pulse PU has been generated on the basis of the transition WS of which the time Δt is shorter than that of the transition SS as illustrated in (G) of FIG. 13, the length of the clock period PC is shorter than the length of the unit interval UI.

Moreover, for example, in a case where after the clock pulse PU has been generated on the basis of the transition WS, the clock pulse PU has been generated on the basis of the transition WW of which the time Δt is longer than that of the transition WS as illustrated in (H) of FIG. 13, the length of the clock period PC is longer than the length of the unit interval UI. Likewise, for example, in a case where after the clock pulse PU has been generated on the basis of the transition WS, the clock pulse PU has been generated on the basis of the transition SS of which the time Δt is longer than that of the transition WS as illustrated in (I) of FIG. 13, the length of the clock period PC is longer than the length of the unit interval UI.

In this way, the length of clock period PC of two adjacent pulses PU changes. in accordance with which one of the transitions WS, WW, and SS the two clock pulses PU have been generated on the basis of.

Accordingly, in the communication system 1, delay amounts of the delay sections 28A, 28B, and 28C are adjusted to cause the length of the clock period PC to become uniform. Specifically, the transition detector 25 detects whether or not a symbol transition includes the transition WS of which the time Δt is short on the basis of the transition signals TxF9, TxR9, and TxP9 and the symbol signals D1, D2, and D3. Then, in a case where the symbol transition includes the transition WS of which the time Δt is short, the transition detector 25 adjusts the delay amounts of the delay sections 28A, 28B, and 28C to cause this transition WS to be delayed. Therefore, the transmission device 10 delays, for example, the second clock pulse PU based on the transition WS in (F) and (G) of FIG. 13, thereby bringing the length of the clock period PC close to the length of the unit interval UI. Furthermore, the transmission device 10 delays, for example, the first clock pulse PU based on the transition WS in (H) and (I) of FIG. 13, thereby bringing the length of the clock period PC close to the length of the unit interval UI.

FIGS. 14A to 14E illustrate an operation example of the communication system 1 in a case where the symbol makes a transition from "+x" to a symbol other than "+x". FIG. 14A illustrates a case where the symbol makes a transition from "+x" to "−x"; FIG. 14B illustrates a case where the symbol makes a transition from "+x" to "+y"; FIG. 14C illustrates a case where the symbol makes a transition from "+x" to "−y"; FIG. 14D illustrates a case where the symbol makes a transition from "+x" to "+z"; FIG. 14E illustrates a case where the symbol makes a transition from "+x" to "−Z". In each of FIGS. 14A to 14E, (A) illustrates respective waveforms of the signals SIGA, SIGB, and SIGC at the output terminals ToutA, ToutB, and ToutC of the transmission device 10; (B) illustrates respective waveforms of the differences AB, BC, and CA in the reception device 30. Furthermore, a solid line indicates a waveform in a case where the delay amounts of the delay sections 28A, 28B, and 28C are adjusted, and a broken line indicates a waveform in a case where the delay amounts of the delay sections 28A, 28B, and 28C are fixed at the delay amount DL1. A timing t10 indicates a timing at which the signals SIGA, SIGB, and SIGC start changing in a case where the delay amounts of the delay sections 28A, 28B, and 28C are the delay amount DL1.

As illustrated in FIG. 5, in a case where the symbol DS is "+x", and the transition signals TxF9, TxR9, and TxP9 are "1XX", the symbol makes a transition from "+x" to "−x" (FIG. 14A). At this time, the transition detector 25 makes all the delay control signals DLA, DLB, and DLC (the delay control signals DLA1, DLB1, and DLC1) "inactive" as illustrated in FIG. 5. Then, the delay sections 28A, 28B, and 28C set the delay amounts to the delay amount DL1 on the basis of the delay control signals DLA1, DLB1, and DLC1. Accordingly, as illustrated in FIG. 14A, the signal SIGA starts changing at the timing t10 and changes from the high-level voltage VH to the low-level voltage VL; the signal SIGB starts changing at the timing t10 and changes from the low-level voltage VL to the high-level voltage VH; and the signal SIGC is maintained at the medium-level voltage VM. As a result, the difference AB makes a transition from "+2ΔV" to "−2ΔV", and the differences BC and CA make a transition from "−ΔV" to "+ΔV". This transition of the difference AB is the transition SS of which the time Δt is moderate, and the transition of the differences BC and CA is the transition WW of which the time Δt is moderate. Then, in this example, the clock pulse PU is generated on the basis of either the difference BC (the transition WW) or the difference CA (the transition WW).

In this way, in a case where the symbol makes a transition from "+x" to "−x", any of the transitions of the differences AB, BC, and CA do not correspond to the transition WS of which the time Δt is short; therefore, the transition detector 25 performs control to set the delay amounts of the delay sections 28A, 28B, and 28C to the delay amount DL1.

Furthermore, in a case where the symbol DS is "+x", and the transition signals TxF9, TxR9, and TxP9 are "010", the symbol makes a transition from "+x" to "+y" (FIG. 14B). At this time, the transition detector 25 makes both the delay control signals DLA and DLB (the delay control signals DLA1 and DLB1) "inactive" and makes the delay control signal DLC (a delay control signals DLC1) "active" as illustrated in FIG. 5. Then, the delay sections 28A and 28B set the delay amounts to the delay amount DL1 on the basis of the delay control signals DLA1 and DLB1, and the delay section 28C sets the delay amount to the delay amount DL2 larger than the delay amount DL1 on the basis of the delay control signal DLC1. Accordingly, as illustrated in FIG. 14B, the signal SIGA starts changing at the timing t10 and changes from the high-level voltage VH to the medium-level voltage VM; the signal SIGB starts changing at the timing t10 and changes from the low-level voltage VL to the high-level voltage VH; and the signal SIGC starts changing at a timing delayed from the timing t10 and changes from the medium-level voltage VM to the low-level voltage VL. That is, the voltages of all the signals SIGA, SIGB, and SIGC change. As a result, the difference AB makes a transition from "+2ΔV" to "−ΔV"; the difference BC makes a transition from "−ΔV" to "+2ΔV" with a delay corresponding to the larger delay amount DL2; and the difference CA is substantially maintained at "−ΔV". This transition of the difference AB is the transition SW of which the time Δt is long, and the transition of the difference BC is the transition WS of which the time Δt is short. In this way, the transition SW of which the time Δt is long appears together with the transition WS of which the time Δt is short. It is to be noted that the difference CA does not cross "0". Then, in this example, the clock pulse PU is generated on the basis of the difference BC (the transition WS).

In this way, in a case where the symbol makes a transition from "+x" to "+y", the transition of the difference BC is the transition WS; therefore, the transition detector 25 performs control to set the delay amount of the delay section 28C to the delay amount DL2 larger than the delay amount DL1 of the delay sections 28A and 28B. Accordingly, it is possible to delay the timing at which the difference BC corresponding to the transition WS crosses "0", and, as a result, it is possible to delay the clock pulse PU based on the transition WS.

Moreover, in a case where the symbol DS is "+x", and the transition signals TxF9, TxR9, and TxP9 are "011", the symbol makes a transition from "+x" to "−y" (FIG. 14C). At this time, the transition detector 25 makes all the delay control signals DLA, DLB, and DLC (the delay control signals DLA1, DLB1, and DLC1) "inactive" as illustrated in FIG. 5. Then, the delay sections 28A, 28B, and 28C set the delay amounts to the delay amount DL1 on the basis of the delay control signals DLA1, DLB1, and DLC1. Accordingly, as illustrated in FIG. 14C, the signal SIGA starts changing at the timing t10 and changes from the high-level voltage VH to the medium-level voltage VM; the signal SIGB is maintained at the low-level voltage VL; and the signal SIGC starts changing at the timing t10 and changes from the medium-level voltage VM to the high-level voltage VH. As a result, the difference AB makes a transition from "+2ΔV" to "+ΔV"; the difference BC makes a transition from "−ΔV" to "−2ΔV"; and the difference CA makes a transition from "−ΔV" to "+ΔV". This transition of the difference CA is the transition WW of which the time Δt is moderate. It is to be noted that the differences AB and BC do not cross "0". Then, in this example, the clock pulse PU is generated on the basis of the difference CA (the transition WW).

In this way, in a case where the symbol makes a transition from "+x" to "−y", all the transitions of the differences AB, BC, and CA do not fall into the transition WS; therefore, the transition detector 25 performs control to set the delay amounts of the delay sections 28A, 28B, and 28C to the delay amount DL1.

Furthermore, in a case where the symbol DS is "+x", and the transition signals TxF9, TxR9, and TxP9 are "000", the symbol makes a transition from "+x" to "+z" (FIG. 14D). At this time, the transition detector 25 makes both the delay control signals DLA and DLB (the delay control signals DLA1 and DLB1) "inactive", and makes the delay control signal DLC (the delay control signals DLC1) "active" as illustrated in FIG. 5. Then, the delay sections 28A and 28B set the delay amounts to the delay amount DL1 on the basis of the delay control signals DLA1 and DLB1, and the delay section 28C sets the delay amount to the delay amount DL2 larger than the delay amount DL1 on the basis of the delay control signal DLC1. Accordingly, as illustrated in FIG. 14D, the signal SIGA starts changing at the timing t10 and changes from the high-level voltage VH to the low-level voltage VL; the signal SIGB starts changing at the timing t10 and changes from the low-level voltage VL to the medium-level voltage VM; and the signal SIGC starts changing at a timing delayed from the timing t10 and changes from the medium-level voltage VM to the high-level voltage VH. That is, the voltages of all the signals SIGA, SIGB, and SIGC change. As a result, the difference AB makes a transition from "+2ΔV" to "−ΔV"; the difference BC is substantially maintained at "−ΔV"; and the difference CA makes a transition from "−ΔV" to "+2ΔV" with a delay corresponding to the larger delay amount DL2. This transition of the difference AB is the transition SW of which the time Δt is long, and the transition of the difference CA is the transition WS of which the time Δt is short. In this way, the transition SW of which the time Δt is long appears together with the transition WS of which the time Δt is short. It is to be noted that the difference BC does not cross "0".

Then, in this example, the clock pulse PU is generated on the basis of the difference CA (the transition WS).

In this way, in a case where the symbol makes a transition from "+x" to "+z", the transition of the difference CA is the transition WS; therefore, the transition detector 25 performs control to set the delay amount of the delay section 28C to the delay amount DL2 larger than the delay amount DL1 of the delay sections 28A and 28B. Accordingly, it is possible to delay the timing at which the difference CA corresponding to the transition WS crosses "0", and, as a result, it is possible to delay the clock pulse PU based on the transition WS.

Moreover, in a case where the symbol DS is "+x", and the transition signals TxF9, TxR9, and TxP9 are "001", the symbol makes a transition from "+x" to "−z" (FIG. 14E). At this time, the transition detector 25 makes all the delay control signals DLA, DLB, and DLC (the delay control signals DLA1, DLB1, and DLC1) "inactive" as illustrated in FIG. 5. Then, the delay sections 28A, 28B, and 28C set the delay amounts to the delay amount DL1 on the basis of the delay control signals DLA1, DLB1, and DLC1. Accordingly, as illustrated in FIG. 14E, the signal SIGA is maintained at the high-level voltage VH; the signal SIGB starts changing at the timing t10 and changes from the low-level voltage VL to the medium-level voltage VM; and the signal SIGC starts changing at the timing t10 and changes from the medium-level voltage VM to the low-level voltage VL. As a result, the difference AB makes a transition from "+2ΔV" to "+ΔV"; the difference BC makes a transition from "−ΔV" to "+ΔV"; and the difference CA makes a transition from "−ΔV" to "−2ΔV". This transition of the difference BC is the transition WW of which the time Δt is moderate. It is to be noted that the differences AB and CA do not cross "0". Then, in this example, the clock pulse PU is generated on the basis of the difference BC (the transition WW).

In this way, in a case where the symbol makes a transition from "+x" to "−z", all the transitions of the differences AB, BC, and CA do not fall into the transition WS; therefore, the transition detector 25 performs control to set the delay amounts of the delay sections 28A, 28B, and 28C to the delay amount DL1.

It is to be noted that in this example, the cases where the symbol makes a transition from "+x" to a symbol other than "+x" are described; however, the same applies to a case where the symbol makes a transition from "−x" to a symbol other than "−x", a case where the symbol makes a transition from "+y" to a symbol other than "+y", a case where the symbol makes a transition from "−y" to a symbol other than "−y", a case where the symbol makes a transition from "+z" to a symbol other than "+z", and a case where the symbol makes a transition from "−z" to a symbol other than FIG. 15 illustrates an operation example of the communication system 1 in a case where the delay amounts of the delay sections 28A, 28B, and 28C are adjusted. In this example, the transmission device 10 transmits six symbols "+x", "−y", "−z", "+z", "+y", and "−x" in this order as with the case of FIG. 11.

In a case where the symbol makes a transition from "−y" to "−z", the transition detector 25 makes both the delay control signals DLB and DLC (the delay control signals DLB1 and DLC1) "inactive", and makes the delay control signal DLA (the delay control signal DLA1) "active" as illustrated in FIG. 5. Then, the delay sections 28B and 28C set the delay amounts to the delay amount DL1 on the basis of the delay control signals DLB1 and DLC1, and the delay section 28A sets the delay amount to the delay amount DL2 larger than the delay amount DL1 on the basis of the delay control signal DLA1. Accordingly, the signal SIGA changes from the medium-level voltage VM to the high-level voltage VH with a slight delay from the signals SIGB and SIGC. As a result, the difference CA makes a transition from "+ΔV" to "−2ΔV" with a delay corresponding to the delay of the signal SIGA. This causes the timing at which the difference CA crosses "0" to be delayed; therefore, a timing at which the signal SCA makes a transition is delayed, and, as a result, it is possible to bring the lengths of clock periods PC1 and PC2 close to the length of the unit interval UI.

Furthermore, in a case where the symbol makes a transition from "+z" to "+y", the transition detector 25 makes both the delay control signals DLA and DLC (the delay control signals DLA1 and DLC1) "inactive", and makes the delay control signal DLB (the delay control signal DLB1) "active" as illustrated in FIG. 5. Then, the delay sections 28A and 28C set the delay amounts to the delay amount DL1 on the basis of the delay control signals DLA1 and DLC1, and the delay section 28B sets the delay amount to the delay amount DL2 larger than the delay amount DL1 on the basis of the delay control signal DLB1. Accordingly, the signal SIGB changes from the medium-level voltage VM to the high-level voltage VH with a slight delay from the signals SIGA and SIGC. As a result, the difference BC makes a transition from "−ΔV" to "+2ΔV" with a delay corresponding to the delay of the signal SIGB. This causes the timing at which the difference BC crosses "0" to be delayed; therefore, a timing at which the signal SBC makes a transition is delayed, and, as a result, it is possible to bring the lengths of clock periods PC3 and PC4 close to the length of the unit interval UI.

FIG. 16A illustrates an eye diagram of the differences AB, BC, and CA in a case where the delay amounts of the delay sections 28A, 28B, and 28C are adjusted, and FIG. 16B illustrates a rising edge of the clock signal RxCK at that time. FIG. 17A illustrates an eye diagram of the differences AB, BC, and CA in a case where the delay amounts of the delay sections 28A, 28B, and 28C are not adjusted, and FIG. 17B illustrates a rising edge of the clock signal RxCK at that time. In FIGS. 16B and 17B, a width indicated by arrows corresponds to jitter J of the clock signal RxCK.

In the communication system 1, in a case where a symbol transition includes the transition WS of which the time Δt is short, the delay amounts of the delay sections 28A, 28B, and 28C are adjusted to cause this transition WS to be delayed. Accordingly, in the communication system 1, as illustrated in FIG. 16A, it is possible to widen an eye opening as compared with the case where the delay amounts are not adjusted (FIG. 17A), and, as illustrated in FIG. 16B, it is possible to reduce the jitter J of the clock signal RxCK as compared with the case where the delay amounts are not adjusted (FIG. 17B). This makes it possible to increase communication quality of the communication system 1.

Furthermore, in the communication system 1, the transition detector 25 detects a specific symbol transition on the basis of the transition signals TxF9, TxR9, and TxP9 and the symbol signals D1, D2, and D3, and the delay sections 28A, 28B, and 28C adjust the delay amounts thereof on the basis of a result of such detection. Accordingly, in the communication system 1, it is possible to dynamically make a timing adjustment of, for example, only a symbol transition that may possibly increase jitter J of the clock signal RxCK, which makes it possible to effectively reduce the jitter J.

Moreover, in the communication system 1, in a case where the transition SW of which the time Δt is long and the transition WS of which the time Δt is short appear together upon a transition of the symbol, the delay amount of a signal not affecting the transition SW of the signals SIGA, SIGB, and SIGC is increased; therefore, it is possible to reduce the jitter J while securing the eye opening. Specifically, for example, in a case where the symbol makes a transition from "+x" to "+y" as illustrated in FIG. 14B, the delay amounts of the delay sections 28A, 28B, and 28C are set to cause the delay amount of the delay section 28C to be larger than the delay amounts of the delay sections 28A and 28B. Accordingly, it is possible to delay the transition of the difference BC corresponding to the transition WS of which the time Δt is short without delaying the transition of the difference AB corresponding to the transition SW of which the time Δt is long, which makes it possible to reduce the jitter J of the clock signal RxCK while securing the eye opening.

[Effects]

As described above, in the present embodiment, in a case where a symbol transition includes the transition WS of which the time Δt is short, the delay amounts of the delay sections are adjusted to cause this transition WS to be delayed; therefore, it is possible to reduce jitter of the clock signal generated by the reception device.

In the present embodiment, the transition detector detects a specific symbol transition on the basis of the transition signals and the symbol signals, and the delay sections adjust the delay amounts thereof on the basis of a result of such detection; therefore, it is possible to effectively reduce the jitter.

Modification Example 1-1

In the foregoing embodiment, the drivers 29A, 29B, and 29C output the medium-level voltage VM through realizing a so-called Thevenin termination; however, this is not limitative. In the following, a communication system 1A according to a modification example is described. The communication system 1A includes a transmission device 10A. The transmission device 10A includes a driver controller 27A as with the transmitter 20 (FIG. 7) of the transmission device 10 according to the foregoing first embodiment. As illustrated in FIG. 18, the driver controller 27A sets, for example, four signals PUAA, PUAB, PDAA, and PDAB to "0000" in a case where the signal SIGA is set to the medium-level voltage VM, sets four signals PUBA, PUBB, PDBA, and PDBB to "0000" in a case where the signal SIGB is set to the medium-level voltage VM, and sets four signals PUCA, PUCB, PDCA, and PDCB to "0000" in a case where the signal SIGC is set to the medium-level voltage VM.

For example, in a case where the symbol signals Tx1, Tx2, and Tx3 are "100", the driver controller 27A determines that a symbol "+x" should be outputted, and sets the four signals PUAA, PUAB, PDAA, and PDAB to "1100", sets the four signals PUBA, PUBB, PDBA, and PDBB to "0011", and sets the four signals PUCA, PUCB, PDCA, and PDCB to "0000". Thus, four signals PUAA1, PUAB1, PDAA1, and PDAB1 become "1100"; four signals PUBA1, PUBB1, PDBA1, and PDBB1 become "0011", and four signals PUCA1, PUCB1, PDCA1, and PDCB1 become "0000".

Accordingly, as illustrated in FIG. 19, in the driver 29A, the transistors 91 in the circuits UA1 to UAM and UB1 to UBM are turned to the on state. As a result, the voltage of the signal SIGA becomes the high-level voltage VH, and an output terminating resistance (an output impedance) of the driver 29A becomes about 50[Ω]. Furthermore, in the driver 29B, the transistors 94 in the circuits DA1 to DAM and DB1 to DBM are turned to the on state. As a result, the voltage of the signal SIGB becomes the low-level voltage VL, and an output terminating resistance (an output impedance) of the driver 29B becomes about 50[Ω]. Moreover, in the driver 29C, the transistors 91 in the circuits UA1 to UAM and UB1 to UBM are turned to the off state, and the transistors 94 in the circuits DA1 to DAM and DB1 to DBM are turned to the on state. That is, an output terminating resistance (an output impedance) of the driver 29C becomes a high impedance. At this time, in the receiver 40, the high-level voltage VH is applied to one end of the resistor 41A, and the low-level voltage VL is applied to one end of the resistor 41B; therefore, a voltage divided by these resistors 41A and 41B (the medium-level voltage VM) is supplied to the output terminal ToutC of the driver 29C through the resistor 41C. In this way, a voltage at the output terminal ToutC of the driver 29C is set to the medium-level voltage VM by the receiver 40.

Modification Example 1-2

In the foregoing embodiment, the length of the clock period PC is made uniform through delaying the clock pulse PU based on the transition WS; however, this is not limitative. Instead of this, for example, the length of the clock period PC may be made uniform through advancing the clock pulses PU based on the transitions WW and SS. In the following, the present modification example is described in detail.

A communication system 1B according to the present modification example includes a transmission device 10B including a transmitter 20B as illustrated in FIG. 1. As illustrated in FIG. 4, this transmitter 20B includes a transition detector 25B and an output section 26B. As illustrated in FIG. 7, this output section 26B includes delay sections 48A, 48B, and 48C.

FIG. 20 illustrates an operation example of the transition detector 25B. As illustrated in portions WBC enclosed by a solid line in FIG. 20, in any of a case where the transition signals TxF9, TxR9, and TxP9 are "000" and the symbol DS indicated by the symbol signals D1, D2, and D3 is "+y", a case where the transition signals TxF9, TxR9, and TxP9 are "000" and the symbol DS is "-y", a case where the transition signals TxF9, TxR9, and TxP9 are "010" and the symbol DS is "+y", and a case where the transition signals TxF9, TxR9, and TxP9 are "010" and the symbol DS is "-y", the transition detector 25B makes the delay control signals DLB and DLC "active", and makes the delay control signal DLA "inactive". Furthermore, as illustrated in portions WCA enclosed by a broken line in FIG. 20, in any of a case where the transition signals TxF9, TxR9, and TxP9 are "000" and the symbol DS indicated by the symbol signals D1, D2, and D3 is "+z", a case where the transition signals TxF9, TxR9, and TxP9 are "000" and the symbol DS is "-z", a case where the transition signals TxF9, TxR9, and TxP9 are "010" and the symbol DS is "+z", and a case where the transition signals TxF9, TxR9, and TxP9 are "010" and the symbol DS is "-z", the transition detector 25B makes the delay control signals DLA and DLC "active", and makes the delay control signal DLB "inactive". Moreover, as illustrated in portions WAB enclosed by a dashed-dotted line in FIG. 20, in any of a case where the transition signals TxF9, TxR9, and TxP9 are "000" and the symbol DS indicated by the symbol signals D1, D2, and D3 is "+x", a case where the transition signals TxF9, TxR9, and TxP9 are "000" and the symbol DS is "-x", a case where the transition signals TxF9, TxR9, and TxP9 are "010" and the symbol DS is "+x", and a case where the transition signals TxF9, TxR9, and TxP9 are "010" and the symbol DS is "-x", the transition detector 25B makes the delay control signals DLA and DLB "active", and makes the delay control signal DLC "inactive". Furthermore, in the other cases, as illustrated in portions WABC enclosed by a dotted line in FIG. 20, the transition detector 25B makes all the delay control signals DLA, DLB, and DLC "active".

The delay section 48A delays four signals PUAA, PUAB, PDAA, and PDAB on the basis of the delay control signal DLA1, thereby generating signals PUAA1, PUAB1, PDAA1, and PDAB1, respectively. Specifically, in a case where the delay control signal DLA1 is "inactive", the delay section 48A delays the four signals PUAA, PUAB, PDAA, and PDAB by the delay amount DL1, thereby generating the signals PUAA1, PUAB1, PDAA1, and PDAB1. Furthermore, in a case where the delay control signal DLA1 is "active", the delay section 48A delays the four signals PUAA, PUAB, PDAA, and PDAB by a delay amount DL0 smaller than the delay amount DL1, thereby generating the signals PUAA1, PUAB1, PDAA1, and PDAB1.

Likewise, the delay section 48B delays four signals PUBA, PUBB, PDBA, and PDBB on the basis of the delay control signal DLB1, thereby generating signals PUBA1, PUBB1, PDBA1, and PDBB1, respectively. Furthermore, the delay section 48C delays four signals PUCA, PUCB, PDCA, and PDCB on the basis of the delay control signal DLC1, thereby generating signals PUCA1, PUCB1, PDCA1, and PDCB1, respectively.

Also in the communication system 1B, the delay amounts of the delay sections 48A, 48B, and 48C are adjusted to cause the length of the clock period PC to become uniform. Specifically, the transmission device 10B advances, for example, the first clock pulse PU based on the transitions WW and SS in (F) and (G) of FIG. 13, thereby bringing the length of the clock period PC close to the length of the unit interval UI. Furthermore, the transmission device 10B advances, for example, the second clock pulse PU based on the transitions WW and SS in (H) and (I) of FIG. 13, thereby bringing the length of the clock period PC close to the length of the unit interval UI.

FIGS. 21A to 21E illustrate an operation example of the communication system 1B in a case where the symbol makes a transition from "+x" to a symbol other than "+x".

As illustrated in FIG. 20, in a case where the symbol DS is "+x", and the transition signals TxF9, TxR9, and TxP9 are "1XX", the symbol makes a transition from "+x" to "-x" (FIG. 21A). At this time, the transition detector 25 makes all the delay control signals DLA, DLB, and DLC (the delay control signals DLA1, DLB1, and DLC1) "active" as illustrated in FIG. 20. Then, the delay sections 48A, 48B, and 48C set the delay amounts to the delay amount DL0 smaller than the delay amount DL1 on the basis of the delay control signals DLA1, DLB1, and DLC1. Accordingly, as illustrated in FIG. 21A, the signal SIGA starts changing at a timing before the timing t10 and changes from the high-level voltage VH to the low-level voltage VL; the signal SIGB starts changing at a timing before the timing t10 and changes from the low-level voltage VL to the high-level voltage VH; and the signal SIGC is maintained at the medium-level voltage VM. Accordingly, in this example, the clock pulse PU is generated on the basis of either the difference BC (the transition WW) or the difference CA (the transition WW). In this way, the delay amounts of the delay sections 48A, 48B, and 48C are set to the delay amount DL0 smaller than the delay amount DL1; therefore, the clock pulse PU based on the transition WW is advanced.

Furthermore, in a case where a symbol DS is "+x", and the transition signals TxF9, TxR9, and TxP9 are "010", the symbol makes a transition from "+x" to "+y" (FIG. 21B). At this time, the transition detector 25B makes the delay control signal DLC (the delay control signals DLC1) "inactive" and makes both the delay control signals DLA and DLB (the delay control signals DLA1 and DLB1) "active" as illustrated in FIG. 20. Then, the delay section 48C sets the delay amount to the delay amount DL1 on the basis of the delay control signal DLC1, and the delay sections 48A and 48B set the delay amounts to the delay amount DL0 smaller than the delay amount DL1 on the basis of the delay control signals DLA1 and DLB1. Accordingly, as illustrated in FIG. 21B, the signal SIGA starts changing at a timing before the timing t10 and changes from the high-level voltage VH to the medium-level voltage VM; the signal SIGB starts changing at a timing before the timing t10 and changes from the low-level voltage VL to the high-level voltage VH; and the signal SIGC starts changing at the timing t10 and changes from the medium-level voltage VM to the low-level voltage VL. Accordingly, in this example, the clock pulse PU is generated on the basis of the difference BC (the transition WS).

Moreover, in a case where the symbol DS is "+x", and the transition signals TxF9, TxR9, and TxP9 are "011", the symbol makes a transition from "+x" to "−y" (FIG. 21C). At this time, the transition detector 25B makes all the delay control signals DLA, DLB, and DLC (the delay control signals DLA1, DLB1, and DLC1) "active" as illustrated in FIG. 20. Then, the delay sections 48A, 48B, and 48C set the delay amounts to the delay amount DL0 smaller than the delay amount DL1 on the basis of the delay control signals DLA1, DLB1, and DLC1. Accordingly, as illustrated in FIG. 21C, the signal SIGA starts changing at a timing before the timing t10 and changes from the high-level voltage VH to the medium-level voltage VM; the signal SIGB is maintained at the low-level voltage VL; and the signal SIGC starts changing at a timing before the timing t10 and changes from the medium-level voltage VM to the high-level voltage VH. Accordingly, in this example, the clock pulse PU is generated on the basis of the difference CA (the transition WW). In this way, the delay amounts of the delay sections 48A, 48B, and 48C are set to the delay amount DL0 smaller than the delay amount DL1; therefore, the clock pulse PU based on the transition WW is advanced.

Furthermore, in a case where the symbol DS is "+x", and the transition signals TxF9, TxR9, and TxP9 are "000", the symbol makes a transition from "+x" to "+z" (FIG. 21D). At this time, the transition detector 25B makes the delay control signal DLC (the delay control signals DLC1) "inactive" and makes both the delay control signals DLA and DLB (the delay control signals DLA1 and DLB1) "active" as illustrated in FIG. 20. Then, the delay section 48C sets the delay amount to the delay amount DL1 on the basis of the delay control signal DLC1, and the delay sections 48A and 48B set the delay amounts to the delay amount DL0 smaller than the delay amount DL1 on the basis of the delay control signals DLA1 and DLB1. Accordingly, as illustrated in FIG. 21D, the signal SIGA starts changing at a timing before the timing t10 and changes from the high-level voltage VH to the low-level voltage VL; the signal SIGB starts changing at a timing before the timing t10 and changes from the low-level voltage VL to the medium-level voltage VM; and the signal SIGC starts changing at the timing t10 and changes from the medium-level voltage VM to the high-level voltage VH. Accordingly, in this example, the clock pulse PU is generated on the basis of the difference CA (the transition WS).

Moreover, in a case where the symbol DS is "+x", and the transition signals TxF9, TxR9, and TxP9 are "001", the symbol makes a transition from "+x" to "−z" (FIG. 21E). At this time, the transition detector 25B makes all the delay control signals DLA, DLB, and DLC (the delay control signals DLA1, DLB1, and DLC1) "active" as illustrated in FIG. 20. Then, the delay sections 48A, 48B, and 48C set the delay amounts to the delay amount DL1 on the basis of the delay control signals DLA1, DLB1, and DLC1. Accordingly, as illustrated in FIG. 21E, the signal SIGA is maintained at the high-level voltage VH; the signal SIGB starts changing at a timing before the timing t10 and changes from the low-level voltage VL to the medium-level voltage VM; and the signal SIGC starts changing at a timing before the timing t10 and changes from the medium-level voltage VM to the low-level voltage VL. Accordingly, in this example, the clock pulse PU is generated on the basis of the difference BC (the transition WW). At this time, the delay amounts of the delay sections 48A, 48B, and 48C are set to the delay amount DL0 smaller than the delay amount DL1; therefore, the clock pulse PU based on the transition WW is advanced.

Other Modification Example

Furthermore, two or more of these modification examples may be combined.

2. Second Embodiment

Subsequently, a communication system 2 according to a second embodiment is described. In the present embodiment, communication is performed through using a plurality of (in this example, three) lanes. It is to be noted that components substantially the same as those of the communication system 1 according to the foregoing first embodiment are denoted by the same reference numerals, and description thereof is omitted where appropriate.

FIG. 22 illustrates a configuration example of the communication system 2. The communication system 2 includes a transmission device 50, a transmission path 120, and a reception device 60. In the communication system 2, a signal is transmitted from the transmission device 50 to the reception device 60 through the transmission path 120. The transmission device 50 has output terminals Tout1A, Tout1B, and Tout1C, output terminals Tout2A, Tout2B, and Tout2C, and output terminals Tout3A, Tout3B, and Tout3C. The transmission path 120 includes lines 121A, 121B, and 121C, lines 122A, 122B, and 122C, and lines 123A, 123B, and 123C. The reception device 60 has input terminals Tin1A, Tin1B, and Tin1C, input terminals Tin2A, Tin2B, and Tin2C, and input terminals Tin3A, Tin3B, and Tin3C. The output terminal Tout1A of the transmission device 50 and the input terminal Tin1A of the reception device 60 are coupled to each other through the line 121A; the output terminal Tout1B of the transmission device 50 and the input terminal Tin1B of the reception device 60 are coupled to each other through the line 121B; and the output terminal Tout1C of the transmission device 50 and the input terminal Tin1C of the reception device 60 are coupled to each other through the line 121C. Likewise, the output terminal Tout2A of the transmission device 50 and the input terminal Tin2A of the reception device 60 are coupled to each other through the line 122A; the output terminal Tout2B of the transmission device 50 and the input terminal Tin2B of the reception device 60 are coupled to each other through the line 122B; and the output terminal Tout2C of the transmission device 50 and the input terminal Tin2C of the reception device 60 are coupled to each other through the line 122C. Furthermore, the output terminal Tout3A of the transmission device 50 and the input terminal Tin3A of the reception device 60 are coupled to each other through the line 123A; the output terminal Tout3B of the transmission device 50 and the input terminal Tin3B of the reception device 60 are coupled to each other through the line 123B; and the output terminal Tout3C of the transmission device 50 and the input terminal Tin3C of the reception device 60 are coupled to each other through the line 123C. Characteristic impedances of the lines 121A, 121B, 121C, 122A, 122B, 122C, 123A, 123B, and 123C are about 50[Ω] in this example.

The lines 121A, 121B, and 121C configure a lane LN1; the lines 122A, 122B, and 122C configure a lane LN2; and the lines 123A, 123B, and 123C configure a lane LN3. Then, the communication system 2 uses the lane LN1 to transmit a signal SIG1A through the line 121A, transmit a signal SIG1B through the line 121B, and transmit a signal SIG1C through the line 121C. Likewise, the communication system 2 uses the lane LN2 to transmit a signal SIG2A through the line 122A, transmit a signal SIG2B through the line 122B, and transmit a signal SIG2C through the line 122C. Furthermore, the communication system 2 uses the lane LN3 to transmit a signal SIG3A through the line 123A, transmit a signal SIG3B through the line 123B, and transmit a signal SIG3C through the line 123C. Hereinafter, signals SIGA, SIGB, and SIGC are appropriately used to indicate any of a set of the signals SIG1A, SIG1B and SIG1C, a set of the signals SIG2A, SIG2B and SIG2C, and a set of the signals SIG3A, SIG3B and SIG3C. As with the case of the foregoing first embodiment (FIG. 2), the signals SIGA, SIGB, and SIGC each make a transition among three voltage levels (the high-level voltage VH, the medium-level voltage VM, and the low-level voltage VL).

(Transmission Device 50)

As illustrated in FIG. 22, the transmission device 50 includes a processor 54, transmitters 51, 52, and 53, and a voltage generator 55.

The processor 54 performs predetermined processing, thereby generating transition signals TxF10 to TxF16, TxR10 to TxR16, and TxP10 to TxP16, transition signals TxF20 to TxF26, TxR20 to TxR26, and TxP20 to TxP26, and transition signals TxF30 to TxF36, TxR30 to TxR36, and TxP30 to TxP36. Then, the processor 54 supplies the transition signals TxF10 to TxF16, TxR10 to TxR16, and TxP10 to TxP16 to the transmitter 51, supplies the transition signals TxF20 to TxF26, TxR20 to TxR26, and TxP20 to TxP26 to the transmitter 52, and supplies the transition signals TxF30 to TxF36, TxR30 to TxR36, and TxP30 to TxP36 to the transmitter 53.

The transmitter 51 generates the signals SIG1A, SIG1B, and SIG1C on the basis of the transition signals TxF10 to TxF16, TxR10 to TxR16, and TxP10 to TxP16. The transmitter 52 generates the signals SIG2A, SIG2B, and SIG2C on the basis of the transition signals TxF20 to TxF26, TxR20 to TxR26, and TxP20 to TxP26. The transmitter 53 generates the signals SIG3A, SIG3B, and SIG3C on the basis of the transition signals TxF30 to TxF36, TxR30 to TxR36, and TxP30 to TxP36.

FIG. 23 illustrates a configuration example of the transmitter 51. It is to be noted that the same applies to the transmitters 52 and 53. The transmitter 51 includes the serializers 21F, 21R, and 21P, the transmission symbol generator 22, the transition detector 25, and an output section 56. The output section 56 generates the signals SIG1A, SIG1B, and SIG1C on the basis of the symbol signals Tx1, Tx2, and Tx3, the delay control signals DLA, DLB, and DLC, the clock signal TxCK, and a signal Vdc.

FIG. 24 illustrates a configuration example of the output section 56. The output section 56 includes a driver controller 57, and delay sections 58A, 58B, and 58C, and drivers 59A, 59B, and 59C.

The driver controller 57 generates three signals PUA, PMA, and PDA, three signals PUB, PMB, and PDB, and three signals PUC, PMC, and PDC on the basis of the symbol signals Tx1, Tx2, and Tx3 and the clock signal TxCK.

FIG. 25 illustrates an operation example of the driver controller 57. For example, the driver controller 57 sets the three signals PUA, PMA, and PDA to "100" in a case where the signal SIG1A is set to the high-level voltage VH, sets the three signals PUA, PMA, and PDA to "001" in a case where the signal SIG1A is set to the low-level voltage VL, and sets the three signals PUA, PMA, and PDA to "010" in a case where the signal SIG1A is set to the medium-level voltage VM. The same applies to the signals SIG1B and SIG1C. Then, the driver controller 57 supplies the three signals PUA, PMA, and PDA to the delay section 58A, supplies the three signals PUB, PMB, and PDB to the delay section 58B, and supplies the three signals PUC, PMC, and PDC to the delay section 58C.

Furthermore, the driver controller 57 has a function of generating delay control signals DLA1, DLB1, and DLC1 on the basis of the delay control signals DLA, DLB, and DLC and the clock signal TxCK, as with the driver controller 27 according to the foregoing first embodiment.

The delay section 58A delays the three signals PUA, PMA, and PDA on the basis of the delay control signal DLA1, thereby generating signals PUA1, PMA1, and PDA1, respectively. Specifically, in a case where the delay control signal DLA1 is "inactive", the delay section 58A delays the three signals PUA, PMA, and PDA by the delay amount DL1, thereby generating the signals PUA1, PMA1, and PDA1. Furthermore, in a case where the delay control signal DLA1 is "active", the delay section 58A delays the three signals PUA, PMA, and PDA by the delay amount DL2 larger than the delay amount DL1, thereby generating the signals PUA1, PMA1, and PDA1.

Likewise, the delay section 58B delays the three signals PUB, PMB, and PDB on the basis of the delay control signal DLB1, thereby generating signals PUB1, PMB1, and PDB1, respectively. Furthermore, the delay section 58C delays the three signals PUC, PMC, and PDC on the basis of the delay control signal DLC1, thereby generating signals PUC1, PMC1, and PDC1, respectively.

The driver 59A generates the signal SIG1A on the basis of the signals PUA1, PMA1, and PDA1. The driver 59B generates the signal SIG1B on the basis of the signals PUB1, PMB1, and PDB1. The driver 59C generates the signal SIG1C on the basis of the signals PUC1, PMC1, and PDC1.

FIG. 26 illustrates a configuration example of the drivers 59A, 59B, and 59C. In the following, the driver 59A is described as an example. It is to be noted that the same applies to the drivers 59B and 59C. The driver 59A includes M circuits UA (circuits UA1 to UAM), M circuits UB (circuits UB1 to UBM), M circuits DA (circuits DA1 to DAM), M circuits DB (circuits DB1 to DBM), and a transistor 95.

The circuits UA1 to UAM and UB1 to UBM each include the transistor 91 and the resistor 92. In each of the circuits UA1 to UAM and UB1 to UBM, the gate of the transistor 91 is supplied with the signal PUA1, the drain thereof is supplied with the voltage V1, and the source thereof is coupled to the one end of the resistor 92. The one end of the resistor 92 is coupled to the source of the transistor 91, and the other end thereof is coupled to the output terminal Tout1A. The sum of an on-state resistance value of the transistor 91 and a resistance value of the resistor 92 is "50×2×M"[Ω] in this example.

The circuits DA1 to DAM and DB1 to DBM each include the resistor 93 and the transistor 94. In each of the circuits DA1 to DAM and DB1 to DBM, the one end of the resistor 93 is coupled to the output terminal Tout1A, and the other end thereof is coupled to the drain of the transistor 94. The gate of the transistor 94 is supplied with the signal PDA1, the drain thereof is coupled to the other end of the resistor 93, and the source thereof is grounded. The sum of a resistance value of the resistor 93 and an on-state resistance value of the transistor 94 is "50×2×M"[Ω] in this example.

In this example, the transistor 95 is an N-channel MOSFET. The gate of the transistor 95 is supplied with the signal PMA1, the drain thereof is coupled to the output terminal Tout1A, and the source thereof is supplied with the signal Vdc having a voltage corresponding to the medium-level voltage VM.

In this configuration, for example, in a case where the symbol signals Tx1, Tx2, and Tx3 are "100", as illustrated in FIG. 25, the driver controller 57 determines that a symbol "+x" should be outputted, and sets the three signals PUA, PMA, and PDA to "100", sets the three signals PUB, PMB, and PDB to "001", and sets the three signals PUC, PMC, and PDC to "010". Thus, the three signals PUA1, PMA1, and PDA1 become "100"; the three signals PUB1, PMB1, and PDB1 become "001"; and the three signals PUC, PMC, and PDC become "010".

Accordingly, in the driver 59A, the transistors 91 in the circuits UA1 to UAM and UB1 to UBM are turned to the on state. As a result, a voltage of the signal SIG1A becomes the high-level voltage VH, and an output terminating resistance (an output impedance) of the driver 59A becomes about 50[Ω]. Furthermore, in the driver 59B, the transistors 94 in the circuits DA1 to DAM and DB1 to DBM are turned to the on state. As a result, a voltage of the signal SIG1B becomes the low-level voltage VL, and an output terminating resistance (an output impedance) of the driver 59B becomes about 50[Ω]. Moreover, in the driver 59C, the transistor 95 is turned to the on state. As a result, a voltage of the signal SIG1C becomes the medium-level voltage VM.

The voltage generator 55 (FIG. 22) generates the signal Vdc having a voltage corresponding to the medium-level voltage VM.

FIG. 27 illustrates a configuration example of the voltage generator 55. The voltage generator 55 includes M circuits UC (circuits UC1 to UCM) and M circuits DC (circuits DC1 to DCM). The circuits UC have a similar configuration to the circuits UA and UB (FIG. 26) of the drivers 59A, 59B, and 59C. The circuits DC have a similar configuration to the circuits DA and DB (FIG. 26) of the drivers 59A, 59B, and 59C. The gate of the transistor 91 in each of the circuits UC1 to UCM and the gate of the transistor 94 in each of the circuits DC1 to DCM are supplied with the voltage V1. Accordingly, the transistors 91 in the circuits UC1 to UCM are turned to the on state, and the transistors 94 in the circuits DC1 to DCM are turned to the on state. A total resistance value of the circuits UC1 to UCM is about 100[Ω], and a total resistance value of the circuits DC1 to DCM is about 100[Ω]. Thus, in the voltage generator 55, a direct current IM flows from a power source (the voltage V1) to a ground through the circuits UC1 to UCM and the circuits DC1 to DCM. In this way, the voltage generator 55 generates the signal Vdc having a voltage corresponding to the medium-level voltage VM, and an output impedance of the voltage generator 55 becomes about 50[Ω].

(Reception device 60)

As illustrated in FIG. 22, the reception device 60 includes receivers 61, 62, and 63 and a processor 64.

The receiver 61 receives the signals SIG1A, SIG1B, and SIG1C, and generates transition signals RxF1, RxR1, and RxP1 and a clock signal RxCK1 on the basis of these signals SIG1A, SIG1B, and SIG1C. The receiver 62 receives the signals SIG2A, SIG2B, and SIG2C, and generates transition signals RxF2, RxR2, and RxP2 and a clock signal RxCK2 on the basis of these signals SIG2A, SIG2B, and SIG2C. The receiver 63 receives the signals SIG3A, SIG3B, and SIG3C, and generates transition signals RxF3, RxR3, and RxP3 and a clock signal RxCK3 on the basis of these signals SIG3A, SIG3B, and SIG3C. The receivers 61, 62, and 63 have, for example, a similar configuration to the receiver 40 (FIG. 9) according to the foregoing first embodiment.

FIG. 28 illustrates an operation example of the transmitter 51 and the receiver 61 in a case where the transmitter 51 transmits the symbol "+x". It is to be noted that in the voltage generator 55, the circuits UC are indicated by a solid line because the transistors 91 are in the on state, and the circuits DC are indicated by a solid line because the transistors 94 are in the on state. Furthermore, each of the transistors 95 is represented by a switch indicating an operation state of the transistor 95.

In a case where the transmitter 51 transmits the symbol "+x", as described above, in the driver 59A, the transistors 91 in the circuits UA1 to UAM and UB1 to UBM are turned to the on state. As a result, the voltage of the signal SIG1A becomes the high-level voltage VH. Furthermore, in the driver 59B, the transistors 94 in the circuits DA1 to DAM and DB1 to DBM are turned to the on state. As a result, the voltage of the signal SIG1B becomes the low-level voltage VL. Moreover, in the driver 59C, the transistor 95 is turned to the on state. As a result, the voltage of the signal SIG1C becomes the medium-level voltage VM.

In this case, in the receiver 61, the current Iin flows to the input terminal TinA, the resistor 41A, the resistor 41B, and the input terminal TinB in this order. Then, the positive input terminal of the amplifier 43A is supplied with the high-level voltage VH, and the negative input terminal thereof is supplied with the low-level voltage VL, which causes the difference AB to be positive (AB>0); therefore, the amplifier 43A outputs "1" as the signal SAB. Furthermore, the positive input terminal of the amplifier 43B is supplied with the low-level voltage VL, and the negative input terminal thereof is supplied with the medium-level voltage VM, which causes the difference BC to be negative (BC<0); therefore, the amplifier 43B outputs "0" as the signal SBC. Moreover, the positive input terminal of the amplifier 43C is supplied with the medium-level voltage VM, and the negative input terminal thereof is supplied with the high-level voltage VH, which causes the difference CA to be negative (CA<0); therefore, the amplifier 43C outputs "0" as the signal SCA.

The processor 64 (FIG. 22) performs predetermined processing on the basis of the transition signals RxF1, RxR1, and RxP1, the clock signal RxCK1, the transition signals RxF2, RxR2, and RxP2, the clock signal RxCK2, the transition signals RxF3, RxR3, and RxP3, and the clock signal RxCK3.

Here, the delay sections 58A, 58B, and 58C correspond to a specific example of a "plurality of delay sections" in the present disclosure. The drivers 59A, 59B, and 59C correspond to a specific example of a "plurality of drivers" in the present disclosure. The transistor 91 corresponds to a specific example of a "first transistor" in the present disclosure. The transistor 94 corresponds to a specific example of a "second transistor" in the present disclosure. The transistor 95 corresponds to a specific example of a "third transistor" in the present disclosure. The signals PUA, PMA, and PDA correspond to a specific example of a "first signal" in the present disclosure. The signals PUB, PMB, and PDB correspond to a specific example of a "second signal" in the present disclosure. The signals PUC, PMC, and PDC correspond to a specific example of a "third signal" in the present disclosure. The signal SIG1A corresponds to a specific example of a "first transmission signal" in the present disclosure. The signal SIG1B corresponds to a specific example of a "second transmission signal" in the present disclosure. The signal SIG1C corresponds to a specific example of a "third transmission signal" in the present disclosure.

In the communication system 2, as with the communication system 1, delay amounts of the delay sections 58A, 58B, and 58C are adjusted to cause the length of the clock period PC to become uniform in each of the lanes LN1, LN2, and LN3. Accordingly, in the communication system 2, as with the communication system 1, it is possible to reduce the jitter J of the clock signals RxCK1 to RxCK3, and, as a result, it is possible to increase communication quality.

Furthermore, in the communication system 2, as illustrated in FIG. 22, the voltage generator 55 of the transmission device 50 supplies the signal Vdc to not only the transmitter 51 but also the transmitters 52 and 53. In other words, in the transmission device 50, one voltage generator 55 is provided with respect to three transmitters 51, 52, and 53. Accordingly, in the communication system 2, it is possible to reduce power consumption.

As described above, in the present embodiment, one voltage generator is provided with respect to a plurality of transmitters; therefore, it is possible to reduce power consumption. Other effects are similar to those in the case of the foregoing first embodiment.

3. Application Example and Further Application Example

Subsequently, an application example and a further application example of the communication systems described in the foregoing embodiments and modification examples are described.

Application Example

FIG. 29 illustrates an appearance of a smartphone 300 (a multi-function mobile phone) to which the communication system according to any of the foregoing embodiments, etc. is applied. Various devices are mounted in the smartphone 300. The communication system according to any of the foregoing embodiments, etc. is applied to a communication system that exchanges data between these devices.

FIG. 30 illustrates a configuration example of an application processor 310 used in the smartphone 300. The application processor 310 includes a CPU (central processing unit) 311, a memory controller 312, a power source controller 313, an external interface 314, a GPU (graphics processing unit) 315, a media processor 316, a display controller 317, and a MIPI (Mobile Industry Processor Interface) interface 318. In this example, the CPU 311, the memory controller 312, the power source controller 313, the external interface 314, the GPU 315, the media processor 316, and the display controller 317 are coupled to a system bus 319 to allow for mutual data exchange via the system bus 319.

The CPU 311 processes various pieces of information handled by the smartphone 300 in accordance with a program. The memory controller 312 controls a memory 501 used at a time when the CPU 311 performs information processing. The power source controller 313 controls a power source of the smartphone 300.

The external interface 314 is an interface for communication with external devices. In this example, the external interface 314 is coupled to a wireless communication section 502 and an image sensor 410. The wireless communication section 502 performs wireless communication with mobile phone base stations. The wireless communication section 502 includes, for example, a baseband section, a radio frequency (RF) front end section, and other components. The image sensor 410 acquires an image, and includes, for example, a CMOS sensor.

The GPU 315 performs image processing. The media processor 316 processes information such as voice, text, and graphics. The display controller 317 controls a display 504 via the MIPI interface 318. The MIPI interface 318 transmits an image signal to the display 504. For example, a YUV-format signal, an RGB-format signal, or the like may be used as the image signal. The MIPI interface 318 operates on the basis of a reference clock supplied from an oscillator circuit 330 including a crystal resonator, for example. For example, the communication system according to any of the foregoing embodiments, etc. is applied to a communication system between the MIPI interface 318 and the display 504.

FIG. 31 illustrates a configuration example of the image sensor 410. The image sensor 410 includes a sensor section 411, an ISP (image signal processor) 412, a JPEG (Joint Photographic Experts Group) encoder 413, a CPU 414, a RAM (random access memory) 415, a ROM (read-only memory) 416, a power source controller 417, an I²C (Inter-Integrated Circuit) interface 418, and a MIPI interface 419. In this example, these blocks are coupled to a system bus 4200 to allow for mutual data exchange via the system bus 420.

The sensor section 411 acquires an image, and includes, for example, a CMOS sensor. The ISP 412 performs predetermined processing on the image acquired by the sensor section 411. The JPEG encoder 413 encodes the image processed by the ISP 412 to generate a JPEG-format image. The CPU 414 controls respective blocks of the image sensor 410 in accordance with a program. The RAM 415 is a memory used at a time when the CPU 414 performs information processing. The ROM 416 stores a program to be executed in the CPU 414, a setting value obtained by calibration, and any other information. The power source controller 417 controls a power source of the image sensor 410. The I²C interface 418 receives a control signal from the application processor 310. Furthermore, although not illustrated, the image sensor 410 also receives a clock signal from the application processor 310, in addition to the control signal. Specifically, the image sensor 410 is configured to be operable on the basis of clock signals of various frequencies. The MIPI interface 419 transmits an image signal to the application processor 310. For example, a YUV-format signal, an RGB-format signal, or the like may be used as the image signal. The MIPI interface 419 operates on the basis of a reference clock supplied from an oscillator circuit 430 including a crystal resonator, for example. For example, the communication system according to any of the foregoing embodiments, etc. is applied to this communication system between the MIPI interface 419 and the application processor 310.

The technology according to the present disclosure is applicable to various products. For example, the technology according to the present disclosure may be achieved in the form of an apparatus to be mounted to a mobile body of any kind such as an automobile, an electric vehicle, a hybrid electric vehicle, a motorcycle, a bicycle, a personal mobility, an airplane, a drone, a vessel, a robot, a construction machine, an agricultural machine (a tractor), etc.

FIG. 32 is a block diagram depicting an example of schematic configuration of a vehicle control system 7000 as an example of a mobile body control system to which the technology according to an embodiment of the present disclosure can be applied. The vehicle control system 7000 includes a plurality of electronic control units connected to each other via a communication network 7010. In the example depicted in FIG. 32, the vehicle control system 7000 includes a driving system control unit 7100, a body system control unit 7200, a battery control unit 7300, an outside-vehicle information detecting unit 7400, an in-vehicle information detecting unit 7500, and an integrated control unit 7600. The communication network 7010 connecting the plurality of control units to each other may, for example, be a vehicle-mounted communication network compliant with an arbitrary standard such as controller area network (CAN), local interconnect network (LIN), local area network (LAN), FlexRay, or the like.

Each of the control units includes: a microcomputer that performs arithmetic processing according to various kinds of programs; a storage section that stores the programs executed by the microcomputer, parameters used for various kinds of operations, or the like; and a driving circuit that drives various kinds of control target devices. Each of the control units further includes: a network interface (I/F) for performing communication with other control units via the communication network 7010; and a communication I/F for performing communication with a device, a sensor, or the like within and without the vehicle by wire communication or radio communication. A functional configuration of the integrated control unit 7600 illustrated in FIG. 32 includes a microcomputer 7610, a general-purpose communication I/F 7620, a dedicated communication I/F 7630, a positioning section 7640, a beacon receiving section 7650, an in-vehicle device I/F 7660, a sound/image output section 7670, a vehicle-mounted network I/F 7680, and a storage section 7690. The other control units similarly include a microcomputer, a communication I/F, a storage section, and the like.

The driving system control unit 7100 controls the operation of devices related to the driving system of the vehicle in accordance with various kinds of programs. For example, the driving system control unit 7100 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like. The driving system control unit 7100 may have a function as a control device of an antilock brake system (ABS), electronic stability control (ESC), or the like.

The driving system control unit 7100 is connected with a vehicle state detecting section 7110. The vehicle state detecting section 7110, for example, includes at least one of a gyro sensor that detects the angular velocity of axial rotational movement of a vehicle body, an acceleration sensor that detects the acceleration of the vehicle, and sensors for detecting an amount of operation of an accelerator pedal, an amount of operation of a brake pedal, the steering angle of a steering wheel, an engine speed or the rotational speed of wheels, and the like. The driving system control unit 7100 performs arithmetic processing using a signal input from the vehicle state detecting section 7110, and controls the internal combustion engine, the driving motor, an electric power steering device, the brake device, and the like.

The body system control unit 7200 controls the operation of various kinds of devices provided to the vehicle body in accordance with various kinds of programs. For example, the body system control unit 7200 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 7200. The body system control unit 7200 receives these input radio waves or signals, and controls a door lock device, the power window device, the lamps, or the like of the vehicle.

The battery control unit 7300 controls a secondary battery 7310, which is a power supply source for the driving motor, in accordance with various kinds of programs. For example, the battery control unit 7300 is supplied with information about a battery temperature, a battery output voltage, an amount of charge remaining in the battery, or the like from a battery device including the secondary battery 7310. The battery control unit 7300 performs arithmetic processing using these signals, and performs control for regulating the temperature of the secondary battery 7310 or controls a cooling device provided to the battery device or the like.

The outside-vehicle information detecting unit 7400 detects information about the outside of the vehicle including the vehicle control system 7000. For example, the outside-vehicle information detecting unit 7400 is connected with at least one of an imaging section 7410 and an outside-vehicle information detecting section 7420. The imaging section 7410 includes at least one of a time-of-flight (ToF) camera, a stereo camera, a monocular camera, an infrared camera, and other cameras. The outside-vehicle information detecting section 7420, for example, includes at least one of an environmental sensor for detecting current atmospheric conditions or weather conditions and a peripheral information detecting sensor for detecting another vehicle, an obstacle, a pedestrian, or the like on the periphery of the vehicle including the vehicle control system 7000.

The environmental sensor, for example, may be at least one of a rain drop sensor detecting rain, a fog sensor detecting a fog, a sunshine sensor detecting a degree of sunshine, and a snow sensor detecting a snowfall. The peripheral information detecting sensor may be at least one of an ultrasonic sensor, a radar device, and a LIDAR device (Light detection and Ranging device, or Laser imaging detection and ranging device). Each of the imaging section 7410 and the outside-vehicle information detecting section 7420 may be provided as an independent sensor or device, or may be provided as a device in which a plurality of sensors or devices are integrated.

FIG. 33 depicts an example of installation positions of the imaging section 7410 and the outside-vehicle information detecting section 7420. Imaging sections 7910, 7912, 7914, 7916, and 7918 are, for example, disposed at at least one of positions on a front nose, sideview mirrors, a rear bumper, and a back door of the vehicle 7900 and a position on an upper portion of a windshield within the interior of the vehicle. The imaging section 7910 provided to the front nose and the imaging section 7918 provided to the upper portion of the windshield within the interior of the vehicle obtain mainly an image of the front of the vehicle 7900. The imaging sections 7912 and 7914 provided to the sideview mirrors obtain mainly an image of the sides of the vehicle 7900. The imaging section 7916 provided to the rear bumper or the back door obtains mainly an image of the rear of the vehicle 7900. The imaging section 7918 provided to the upper portion of the windshield within the interior of the vehicle is used mainly to detect a preceding vehicle, a pedestrian, an obstacle, a signal, a traffic sign, a lane, or the like.

Incidentally, FIG. 33 depicts an example of photographing ranges of the respective imaging sections 7910, 7912, 7914, and 7916. An imaging range a represents the imaging range of the imaging section 7910 provided to the front nose. Imaging ranges b and c respectively represent the imaging ranges of the imaging sections 7912 and 7914 provided to the sideview mirrors. An imaging range d represents the imaging range of the imaging section 7916 provided to the rear bumper or the back door. A bird's-eye image of the vehicle 7900 as viewed from above can be obtained by superimposing image data imaged by the imaging sections 7910, 7912, 7914, and 7916, for example.

Outside-vehicle information detecting sections 7920, 7922, 7924, 7926, 7928, and 7930 provided to the front, rear, sides, and corners of the vehicle 7900 and the upper portion of the windshield within the interior of the vehicle may be, for example, an ultrasonic sensor or a radar device. The outside-vehicle information detecting sections 7920, 7926, and 7930 provided to the front nose of the vehicle 7900, the rear bumper, the back door of the vehicle 7900, and the upper portion of the windshield within the interior of the vehicle may be a LIDAR device, for example. These outside-vehicle information detecting sections 7920 to 7930 are used mainly to detect a preceding vehicle, a pedestrian, an obstacle, or the like.

Returning to FIG. 32, the description will be continued. The outside-vehicle information detecting unit 7400 makes the imaging section 7410 image an image of the outside of the vehicle, and receives imaged image data. In addition, the outside-vehicle information detecting unit 7400 receives detection information from the outside-vehicle information detecting section 7420 connected to the outside-vehicle information detecting unit 7400. In a case where the outside-vehicle information detecting section 7420 is an ultrasonic sensor, a radar device, or a LIDAR device, the outside-vehicle information detecting unit 7400 transmits an ultrasonic wave, an electromagnetic wave, or the like, and receives information of a received reflected wave. On the basis of the received information, the outside-vehicle information detecting unit 7400 may perform processing of detecting an object such as a human, a vehicle, an obstacle, a sign, a character on a road surface, or the like, or processing of detecting a distance thereto. The outside-vehicle information detecting unit 7400 may perform environment recognition processing of recognizing a rainfall, a fog, road surface conditions, or the like on the basis of the received information. The outside-vehicle information detecting unit 7400 may calculate a distance to an object outside the vehicle on the basis of the received information.

In addition, on the basis of the received image data, the outside-vehicle information detecting unit 7400 may perform image recognition processing of recognizing a human, a vehicle, an obstacle, a sign, a character on a road surface, or the like, or processing of detecting a distance thereto. The outside-vehicle information detecting unit 7400 may subject the received image data to processing such as distortion correction, alignment, or the like, and combine the image data imaged by a plurality of different imaging sections 7410 to generate a bird's-eye image or a panoramic image. The outside-vehicle information detecting unit 7400 may perform viewpoint conversion processing using the image data imaged by the imaging section 7410 including the different imaging parts.

The in-vehicle information detecting unit 7500 detects information about the inside of the vehicle. The in-vehicle information detecting unit 7500 is, for example, connected with a driver state detecting section 7510 that detects the state of a driver. The driver state detecting section 7510 may include a camera that images the driver, a biosensor that detects biological information of the driver, a microphone that collects sound within the interior of the vehicle, or the like. The biosensor is, for example, disposed in a seat surface, the steering wheel, or the like, and detects biological information of an occupant sitting in a seat or the driver holding the steering wheel. On the basis of detection information input from the driver state detecting section 7510, the in-vehicle information detecting unit 7500 may calculate a degree of fatigue of the driver or a degree of concentration of the driver, or may determine whether the driver is dozing. The in-vehicle information detecting unit 7500 may subject an audio signal obtained by the collection of the sound to processing such as noise canceling processing or the like.

The integrated control unit 7600 controls general operation within the vehicle control system 7000 in accordance with various kinds of programs. The integrated control unit 7600 is connected with an input section 7800. The input section 7800 is implemented by a device capable of input operation by an occupant, such, for example, as a touch panel, a button, a microphone, a switch, a lever, or the like. The integrated control unit 7600 may be supplied with data obtained by voice recognition of voice input through the microphone. The input section 7800 may, for example, be a remote control device using infrared rays or other radio waves, or an external connecting device such as a mobile telephone, a personal digital assistant (PDA), or the like that supports operation of the vehicle control system 7000. The input section 7800 may be, for example, a camera. In that case, an occupant can input information by gesture. Alternatively, data may be input which is obtained by detecting the movement of a wearable device that an occupant wears. Further, the input section 7800 may, for example, include an input control circuit or the like that generates an input signal on the basis of information input by an occupant or the like using the above-described input section 7800, and which outputs the generated input signal to the integrated control unit 7600. An occupant or the like inputs various kinds of data or gives an instruction for processing operation to the vehicle control system 7000 by operating the input section 7800.

The storage section 7690 may include a read only memory (ROM) that stores various kinds of programs executed by the microcomputer and a random access memory (RAM) that stores various kinds of parameters, operation results, sensor values, or the like. In addition, the storage section 7690 may be implemented by a magnetic storage device such as a hard disc drive (HDD) or the like, a semiconductor storage device, an optical storage device, a magneto-optical storage device, or the like.

The general-purpose communication I/F 7620 is a communication I/F used widely, which communication I/F mediates communication with various apparatuses present in an external environment 7750. The general-purpose communication I/F 7620 may implement a cellular communication protocol such as global system for mobile communications (GSM), worldwide interoperability for microwave access (WiMAX), long term evolution (LTE)), LTE-advanced (LTE-A), or the like, or another wireless communication protocol such as wireless LAN (referred to also as wireless fidelity (Wi-Fi), Bluetooth, or the like. The general-purpose communication I/F 7620 may, for example, connect to an apparatus (for example, an application server or a control server) present on an external network (for example, the Internet, a cloud network, or a company-specific network) via a base station or an access point. In addition, the general-purpose communication I/F 7620 may connect to a terminal present in the vicinity of the vehicle (which terminal is, for example, a terminal of the driver, a pedestrian, or a store, or a machine type communication (MTC) terminal) using a peer to peer (P2P) technology, for example.

The dedicated communication I/F 7630 is a communication I/F that supports a communication protocol developed for use in vehicles. The dedicated communication I/F 7630 may implement a standard protocol such, for example, as wireless access in vehicle environment (WAVE), which is a combination of institute of electrical and electronic engineers (IEEE) 802.11p as a lower layer and IEEE 1609 as a higher layer, dedicated short range communications (DSRC), or a cellular communication protocol. The dedicated communication I/F 7630 typically carries out V2X communication as a concept including one or more of communication between a vehicle and a vehicle (Vehicle to Vehicle), communication between a road and a vehicle (Vehicle to Infrastructure), communication between a vehicle and a home (Vehicle to Home), and communication between a pedestrian and a vehicle (Vehicle to Pedestrian).

The positioning section 7640, for example, performs positioning by receiving a global navigation satellite system (GNSS) signal from a GNSS satellite (for example, a GPS signal from a global positioning system (GPS) satellite), and generates positional information including the latitude, longitude, and altitude of the vehicle. Incidentally, the positioning section 7640 may identify a current position by exchanging signals with a wireless access point, or may obtain the positional information from a terminal such as a mobile telephone, a personal handyphone system (PHS), or a smart phone that has a positioning function.

The beacon receiving section 7650, for example, receives a radio wave or an electromagnetic wave transmitted from a radio station installed on a road or the like, and thereby obtains information about the current position, congestion, a closed road, a necessary time, or the like. Incidentally, the function of the beacon receiving section 7650 may be included in the dedicated communication I/F 7630 described above.

The in-vehicle device I/F 7660 is a communication interface that mediates connection between the microcomputer 7610 and various in-vehicle devices 7760 present within the vehicle. The in-vehicle device I/F 7660 may establish wireless connection using a wireless communication protocol such as wireless LAN, Bluetooth, near field communication (NFC), or wireless universal serial bus (WUSB). In addition, the in-vehicle device I/F 7660 may establish wired connection by universal serial bus (USB), high-definition multimedia interface (HDMI), mobile high-definition link (MHL), or the like via a connection terminal (and a cable if necessary) not depicted in the figures. The in-vehicle devices 7760 may, for example, include at least one of a mobile device and a wearable device possessed by an occupant and an information device carried into or attached to the vehicle. The in-vehicle devices 7760 may also include a navigation device that searches for a path to an arbitrary destination. The in-vehicle device I/F 7660 exchanges control signals or data signals with these in-vehicle devices 7760.

The vehicle-mounted network I/F 7680 is an interface that mediates communication between the microcomputer 7610 and the communication network 7010. The vehicle-mounted network I/F 7680 transmits and receives signals or the like in conformity with a predetermined protocol supported by the communication network 7010.

The microcomputer 7610 of the integrated control unit 7600 controls the vehicle control system 7000 in accordance with various kinds of programs on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. For example, the microcomputer 7610 may calculate a control target value for the driving force generating device, the steering mechanism, or the braking device on the basis of the obtained information about the inside and outside of the vehicle, and output a control command to the driving system control unit 7100. For example, the microcomputer 7610 may perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like. In addition, the microcomputer 7610 may perform cooperative control intended for automatic driving, which makes the vehicle to travel autonomously without depending on the operation of the driver, or the like, by controlling the driving force generating device, the steering mechanism, the braking device, or the like on the basis of the obtained information about the surroundings of the vehicle.

The microcomputer 7610 may generate three-dimensional distance information between the vehicle and an object such as a surrounding structure, a person, or the like, and generate local map information including information about the surroundings of the current position of the vehicle, on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. In addition, the microcomputer 7610 may predict danger such as collision of the vehicle, approaching of a pedestrian or the like, an entry to a closed road, or the like on the basis of the obtained information, and generate a warning signal. The warning signal may, for example, be a signal for producing a warning sound or lighting a warning lamp.

The sound/image output section 7670 transmits an output signal of at least one of a sound and an image to an output device capable of visually or auditorily notifying information to an occupant of the vehicle or the outside of the vehicle. In the example of FIG. 32, an audio speaker 7710, a display section 7720, and an instrument panel 7730 are illustrated as the output device. The display section 7720 may, for example, include at least one of an on-board display and a head-up display. The display section 7720 may have an augmented reality (AR) display function. The output device may be other than these devices, and may be another device such as headphones, a wearable device such as an eyeglass type display worn by an occupant or the like, a projector, a lamp, or the like. In a case where the output device is a display device, the display device visually displays results obtained by various kinds of processing performed by the microcomputer 7610 or information received from another control unit in various forms such as text, an image, a table, a graph, or the like. In addition, in a case where the output device is an audio output device, the audio output device converts an audio signal constituted of reproduced audio data or sound data or the like into an analog signal, and auditorily outputs the analog signal.

Incidentally, at least two control units connected to each other via the communication network 7010 in the example depicted in FIG. 32 may be integrated into one control unit. Alternatively, each individual control unit may include a plurality of control units. Further, the vehicle control system 7000 may include another control unit not depicted in the figures. In addition, part or the whole of the functions performed by one of the control units in the above description may be assigned to another control unit. That is, predetermined arithmetic processing may be performed by any of the control units as long as information is transmitted and received via the communication network 7010. Similarly, a sensor or a device connected to one of the control units may be connected to another control unit, and a plurality of control units may mutually transmit and receive detection information via the communication network 7010.

In the vehicle control system 7000 described above, the communication system 1 according to the present embodiment described with use of FIG. 1 is applicable to a communication system between respective blocks in the further application example illustrated in FIG. 32. Specifically, the present technology is applicable to, for example, a communication system between the imaging section 7410 (the imaging sections 7910, 7912, 7914, 7916, and 7918 and the outside-vehicle information detecting unit 7400. Accordingly, in the vehicle control system 7000, for example, it is possible to enhance communication quality, which makes it possible to supply an image having high image quality to the outside-vehicle information detecting unit 7400. As a result, it is possible for the outside-vehicle information detecting unit 7400 to more accurately comprehend outside-vehicle information.

Although the technology has been described above referring to some embodiments and modification examples, and application examples and further application examples thereof, the technology is not limited to these embodiments, etc., and may be modified in a variety of ways.

For example, in the foregoing embodiments, the present technology is applied to the communication system that performs communication using a signal having three voltage levels; however, the present technology is not limited thereto, and may be applied to a communication system that performs communication using, for example, a signal having four or more voltage levels. Specifically, for example, it is possible to configure a transmission device to transmit four signals SIG1, SIG2, SIG3, and SIG4 to a reception device. These signals SIG1, SIG2, SIG3, and SIG4 each make a transition among four voltage levels. These signals SIG1, SIG2, SIG3, and SIG4 are set to mutually different voltage levels.

It is to be noted that effects described herein are merely illustrative and are not limitative, and may have other effects.

It is to be noted that the present technology may have the following configurations.

(1)

A communication unit including:

a plurality of delay sections having changeable delay amounts;

a driver section that includes a plurality of drivers and transmits a data signal indicating a sequence of symbols using the plurality of drivers, the plurality of drivers being provided to correspond to the plurality of delay sections and setting a voltage at a corresponding output terminal to a mutually different voltage on the basis of a signal delayed by a corresponding delay section of the plurality of delay sections; and a controller that sets the respective delay amounts of the plurality of delay sections on the basis of a transition of a symbol in the sequence of symbols.

(2)

The transmission device according to (1), in which the plurality of delay sections include a first delay section, a second delay section, and a third delay section, the plurality of drivers include a first driver that selectively sets a voltage at a first output terminal to one of a first voltage, a second voltage, and a third voltage interposed between the first voltage and the second voltage, a second driver that selectively sets a voltage at a second output terminal to one of the first voltage, the second voltage, and the third voltage, and a third driver that selectively sets a voltage at a third output terminal to one of the first voltage, the second voltage, and the third voltage, and the voltages at the first output terminal, the second output terminal, and the third output terminal are different from one another.

(3)

The transmission device according to (2), in which in a plurality of first symbol transitions that cause all the voltage at the first output terminal, the voltage at the second output terminal, and the voltage at the third output terminal to change, the controller causes a delay amount of one delay section of the first delay section, the second delay section, and the third delay section to be larger than delay amounts of delay sections other than the one delay section.

(4)

The transmission device according to (3), in which in, of the plurality of first symbol transitions, a second symbol transition that causes the voltage at the first output terminal to change from the third voltage to the first voltage or the second voltage, the delay amount of the first delay section is caused to be larger than the delay amount of the second delay section and the delay amount of the third delay section.

(5)

The transmission device according to (4), in which the controller causes the delay amount of the first delay section in the second symbol transition to be larger than the delay amount of the first delay section in a third symbol transition other than the second symbol transition.

(6)

The transmission device according to any one of (2) to (5), further including a signal generator that generates a symbol signal on the basis of a transition signal indicating the transition of the symbol, in which the first delay section delays a first signal in accordance with the symbol signal, the second delay section delays a second signal in accordance with the symbol signal, the third delay section delays a third signal in accordance with the symbol signal, and the controller sets the respective delay amounts of the plurality of delay sections through detecting the transition of the symbol on the basis of the transition signal.

(7)

The transmission device according to any one of (2) to (6), in which the first delay section delays a first signal including a first sub-signal and a second sub-signal, and the first driver includes a first transistor that is provided in a path from a first power source to the first output terminal, and is turned on or off on the basis of the first sub-signal, and a second transistor that is provided in a path from a second power source to the first output terminal, and is turned on or off on the basis of the second sub-signal.

(8)

The transmission device according to any one of (2) to (6), further including a voltage generator that generates the third voltage, in which the first delay section delays a first signal including a first sub-signal, a second sub-signal, and a third sub-signal, and the first driver includes a first transistor that is provided in a path from a first power source to the first output terminal, and is turned on or off on the basis of the first sub-signal, a second transistor that is provided in a path from a second power source to the first output terminal, and is turned on or off on the basis of the second sub-signal, and a third transistor that is provided in a path from the voltage generator to the first output terminal, and is turned on or off on the basis of the third sub-signal.

(9)

A transmission method including:

setting respective delay amounts of a plurality of delay sections on the basis of a transition of a symbol in a sequence of symbols; and causing a plurality of drivers provided to correspond to the plurality of delay sections to set a voltage at a corresponding output terminal to a mutually different voltage on the basis of a signal delayed by a corresponding delay section of the plurality of delay sections.

(10)

A communication system including:

a transmission device; and a reception device, the transmission device including:

a plurality of delay sections having changeable delay amounts, a driver section that includes a plurality of drivers and transmits a data signal indicating a sequence of symbols using the plurality of drivers, the plurality of drivers being provided to correspond to the plurality of delay sections and setting a voltage at a corresponding output terminal to a mutually different voltage on the basis of a signal delayed by a corresponding delay section of the plurality of delay sections, and a controller that sets the respective delay amounts of the plurality of delay sections on the basis of a transition of a symbol in the sequence of symbols.

(11)

The communication system according to (10), in which the plurality of delay sections include a first delay section, a second delay section, and a third delay section, the plurality of drivers include a first driver that generates a first transmission signal through selectively setting a voltage at a first output terminal to one of a first voltage, a second voltage, and a third voltage interposed between the first voltage and the second voltage, a second driver that generates a second transmission signal through selectively setting a voltage at a second output terminal to one of the first voltage, the second voltage, and the third voltage, and a third driver that generates a third transmission signal through selectively setting a voltage at the second output terminal to one of the first voltage, the second voltage, and the third voltage, and the reception device includes a first amplifier that generates a first differential signal through amplifying a difference between the first transmission signal and the second transmission signal, a second amplifier that generates a second differential signal through amplifying a difference between the second transmission signal and the third transmission signal, a third amplifier that generates a third differential signal through amplifying a difference between the third transmission signal and the first transmission signal, and a clock generator that generates a clock signal on the basis of the first differential signal, the second differential signal, and the third differential signal.

(12)

The communication system according to (11), in which the clock generator generates the clock signal through generating a clock pulse on the basis of, of the first differential signal, the second differential signal, and the third differential signal, a signal that has first made a transition in a case where the symbol has made a transition.

This application claims the benefit of Japanese Priority Patent Application JP2016-241973 filed with the Japan Patent Office on Dec. 14, 2016, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A transmission device comprising:

a plurality of delay sections having changeable delay amounts;

a driver section that includes a plurality of drivers and transmits a data signal indicating a sequence of symbols using the plurality of drivers, the plurality of drivers being provided to correspond to the plurality of delay sections and setting a voltage at a corresponding output terminal to a mutually different voltage on a basis of a signal delayed by a corresponding delay section of the plurality of delay sections; and a controller that sets the respective delay amounts of the plurality of delay sections on a basis of a transition of a symbol in the sequence of symbols, wherein the plurality of delay sections include a first delay section, a second delay section, and a third delay section, the plurality of drivers include a first driver that selectively sets a voltage at a first output terminal to one of a first voltage, a second voltage, and a third voltage interposed between the first voltage and the second voltage, a second driver that selectively sets a voltage at a second output terminal to one of the first voltage, the second voltage, and the third voltage, and a third driver that selectively sets a voltage at a third output terminal to one of the first voltage, the second voltage, and the third voltage, and the voltages at the first output terminal, the second output terminal, and the third output terminal are different from one another.

2. The transmission device according to claim 1, wherein for first symbol transitions that cause all the voltage at the first output terminal, the voltage at the second output terminal, and the voltage at the third output terminal to change, the controller causes a delay amount of one delay section of the first delay section, the second delay section, and the third delay section to be larger than delay amounts of delay sections other than the one delay section.

3. The transmission device according to claim 2, wherein for a second symbol transition that causes the voltage at the first output terminal to change from the third voltage to the first voltage or the second voltage, the delay amount of the first delay section is caused to be larger than the delay amount of the second delay section and the delay amount of the third delay section.

4. The transmission device according to claim 3, wherein the controller causes the delay amount of the first delay section in the second symbol transition to be larger than the delay amount of the first delay section in a third symbol transition other than the second symbol transition.

5. The transmission device according to claim 1, further comprising a signal generator that generates a symbol signal on a basis of a transition signal indicating the transition of the symbol, wherein the first delay section delays a first signal in accordance with the symbol signal, the second delay section delays a second signal in accordance with the symbol signal, the third delay section delays a third signal in accordance with the symbol signal, and the controller sets the respective delay amounts of the plurality of delay sections through detecting the transition of the symbol on a basis of the transition signal.

6. The transmission device according to claim 1, wherein the first delay section delays a first signal including a first sub-signal and a second sub-signal, and the first driver includes a first transistor that is provided in a path from a first power source to the first output terminal, and is turned on or off on a basis of the first sub-signal, and a second transistor that is provided in a path from a second power source to the first output terminal, and is turned on or off on a basis of the second sub-signal.

7. The transmission device according to claim 1, further comprising a voltage generator that generates the third voltage, wherein the first delay section delays a first signal including a first sub-signal, a second sub-signal, and a third sub-signal, and the first driver includes a first transistor that is provided in a path from a first power source to the first output terminal, and is turned on or off on a basis of the first sub-signal, a second transistor that is provided in a path from a second power source to the first output terminal, and is turned on or off on a basis of the second sub-signal, and a third transistor that is provided in a path from the voltage generator to the first output terminal, and is turned on or off on a basis of the third sub-signal.

8. A communication system comprising:
the transmission device according to claim 1; and
a reception device.

9. The communication system according to claim 8, wherein for first symbol transitions that cause all the voltage at the first output terminal, the voltage at the second output terminal, and the voltage at the third output terminal to change, the controller causes a delay amount of one delay section of the first delay section, the second delay section, and the third delay section to be larger than delay amounts of delay sections other than the one delay section.

10. The communication system according to claim 9, wherein for a second symbol transition that causes the voltage at the first output terminal to change from the third voltage to the first voltage or the second voltage, the delay amount of the first delay section is caused to be larger than the delay amount of the second delay section and the delay amount of the third delay section.

11. The communication system according to claim 10, wherein the controller causes the delay amount of the first delay section in the second symbol transition to be larger than the delay amount of the first delay section in a third symbol transition other than the second symbol transition.

12. The communication system according to claim 8, further comprising a signal generator that generates a symbol signal on a basis of a transition signal indicating the transition of the symbol, wherein the first delay section delays a first signal in accordance with the symbol signal, the second delay section delays a second signal in accordance with the symbol signal, the third delay section delays a third signal in accordance with the symbol signal, and the controller sets the respective delay amounts of the plurality of delay sections through detecting the transition of the symbol on a basis of the transition signal.

13. The communication system according to claim 8, wherein the first delay section delays a first signal including a first sub-signal and a second sub-signal, and the first driver includes a first transistor that is provided in a path from a first power source to the first output terminal, and is turned on or off on a basis of the first sub-signal, and a second transistor that is provided in a path from a second power source to the first output terminal, and is turned on or off on a basis of the second sub-signal.

14. The communication system according to claim 8, further comprising a voltage generator that generates the third voltage, wherein the first delay section delays a first signal including a first sub-signal, a second sub-signal, and a third sub-signal, and the first driver includes a first transistor that is provided in a path from a first power source to the first output terminal, and is turned on or off on a basis of the first sub-signal, a second transistor that is provided in a path from a second power source to the first output terminal, and is turned on or off on a basis of the second sub-signal, and a third transistor that is provided in a path from the voltage generator to the first output terminal, and is turned on or off on a basis of the third sub-signal.

15. A transmission method comprising:

setting respective delay amounts of a plurality of delay sections on a basis of a transition of a symbol in a sequence of symbols; and causing a plurality of drivers provided to correspond to the plurality of delay sections to set a voltage at a corresponding output terminal to a mutually different voltage on a basis of a signal delayed by a corresponding delay section of the plurality of delay sections, wherein the plurality of delay sections include a first delay section, a second delay section, and a third delay section, wherein the plurality of drivers include a first driver that selectively sets a voltage at a first output terminal to one of a first voltage, a second voltage, and a third voltage interposed between the first voltage and the second voltage, a second driver that selectively sets a voltage at a second output terminal to one of the first voltage, the second voltage, and the third voltage, and a third driver that selectively sets a voltage at a third output terminal to one of the first voltage, the second voltage, and the third voltage, and wherein the voltages at the first output terminal, the second output terminal, and the third output terminal are different from one another.

16. A communication system comprising:

a transmission device; and a reception device, the transmission device including:

a plurality of delay sections having changeable delay amounts, a driver section that includes a plurality of drivers and transmits a data signal indicating a sequence of symbols using the plurality of drivers, the plurality of drivers being provided to correspond to the plurality of delay sections and setting a voltage at a corresponding output terminal to a mutually different voltage on a basis of a signal delayed by a corresponding delay section of the plurality of delay sections, and a controller that sets the respective delay amounts of the plurality of delay sections on a basis of a transition of a symbol in the sequence of symbols, wherein the plurality of delay sections include a first delay section, a second delay section, and a third delay section, the plurality of drivers include a first driver that generates a first transmission signal through selectively setting a voltage at a first output terminal to one of a first voltage, a second voltage, and a third voltage interposed between the first voltage and the second voltage, a second driver that generates a second transmission signal through selectively setting a voltage at a second output terminal to one of the first voltage, the second voltage, and the third voltage, and a third driver that generates a third transmission signal through selectively setting a voltage at the second output terminal to one of the first voltage, the second voltage, and the third voltage, and the reception device includes a first amplifier that generates a first differential signal through amplifying a difference between the first transmission signal and the second transmission signal, a second amplifier that generates a second differential signal through amplifying a difference between the second transmission signal and the third transmission signal, a third amplifier that generates a third differential signal through amplifying a difference between the third transmission signal and the first transmission signal, and a clock generator that generates a clock signal on a basis of the first differential signal, the second differential signal, and the third differential signal.

17. The communication system according to claim 16, wherein the clock generator generates the clock signal through generating a clock pulse on a basis of, of the first differential signal, the second differential signal, and the third differential signal, a signal that has first made a transition in a case where the symbol has made a transition.

* * * * *